United States Patent
Asai et al.

(10) Patent No.: US 9,963,785 B2
(45) Date of Patent: May 8, 2018

(54) SUBSTRATE PROCESSING APPARATUS AND SEMICONDUCTOR DEVICE MANUFACTURING METHOD

(71) Applicant: HITACHI KOKUSAI ELECTRIC INC., Tokyo (JP)

(72) Inventors: Masayuki Asai, Toyama (JP); Koichi Honda, Toyama (JP); Mamoru Umemoto, Toyama (JP); Kazuyuki Okuda, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days. days.

(21) Appl. No.: 14/667,692

(22) Filed: Mar. 25, 2015

(65) Prior Publication Data

US 2015/0197855 A1    Jul. 16, 2015

Related U.S. Application Data

(62) Division of application No. 13/230,869, filed on Sep. 13, 2011, now Pat. No. 9,175,395.

(30) Foreign Application Priority Data

Oct. 26, 2010   (JP) .................................. 2010-240067
Nov. 26, 2010   (JP) .................................. 2010-263626

(51) Int. Cl.
C23C 16/34     (2006.01)
C23C 16/44     (2006.01)
(Continued)

(52) U.S. Cl.
CPC .............. *C23C 16/52* (2013.01); *C23C 16/08* (2013.01); *C23C 16/345* (2013.01);
(Continued)

(58) Field of Classification Search
None
See application file for complete search history.

(56) References Cited

U.S. PATENT DOCUMENTS 5,899,752 A * 5/1999 Hey .................. H01L 21/02046
                                                      257/E21.212
6,017,396 A   1/2000 Okamoto
(Continued)

FOREIGN PATENT DOCUMENTS

JP     9-055372 A     2/1997
JP   2003-297818 A   10/2003
(Continued)

OTHER PUBLICATIONS

Korean Office action dated Dec. 20, 2012 from the KIPO in a Korean patent application No. 10-2011-92573 which is corresponding to the instant patent application.
(Continued)

*Primary Examiner* — Karla A Moore
(74) *Attorney, Agent, or Firm* — Solaris Intellectual Property Group, PLLC

(57) ABSTRACT

Disclosed is a method of manufacturing a semiconductor device including: performing a pre-process to a metal film or a GST film by supplying a first processing gas to a substrate, on a surface of which the metal film or the GST film is formed, without supplying a second processing gas; and performing a formation process to the substrate to which the pre-process has been performed such that a film is formed on the metal film or the GST film by executing at least one cycle of alternately (i) supplying the first processing gas, and (ii) supplying the second processing gas that is activated by plasma excitation.

8 Claims, 43 Drawing Sheets

(51) Int. Cl.

| | | |
|---|---|---|
| *C23C 16/455* | (2006.01) | |
| *C23C 16/50* | (2006.01) | |
| *H01L 21/02* | (2006.01) | |
| *H01J 37/32* | (2006.01) | |
| *C23C 16/52* | (2006.01) | |
| *C23C 16/08* | (2006.01) | |
| *C23C 16/40* | (2006.01) | |
| *C23C 16/509* | (2006.01) | |
| *C23C 16/54* | (2006.01) | |
| *H01L 21/033* | (2006.01) | |
| *H01L 21/3205* | (2006.01) | |

(52) U.S. Cl.
CPC ........ *C23C 16/401* (2013.01); *C23C 16/4401* (2013.01); *C23C 16/4408* (2013.01); *C23C 16/45542* (2013.01); *C23C 16/45544* (2013.01); *C23C 16/509* (2013.01); *C23C 16/54* (2013.01); *H01J 37/3244* (2013.01); *H01J 37/32899* (2013.01); *H01L 21/0217* (2013.01); *H01L 21/0228* (2013.01); *H01L 21/0262* (2013.01); *H01L 21/02164* (2013.01); *H01L 21/02175* (2013.01); *H01L 21/02211* (2013.01); *H01L 21/02274* (2013.01); *H01L 21/02568* (2013.01); *H01L 21/0337* (2013.01); *H01L 21/32051* (2013.01); *H01L 21/32053* (2013.01)

(56) References Cited

U.S. PATENT DOCUMENTS

| | | | |
|---|---|---|---|
| 6,365,518 B1 * | 4/2002 | Lee | ................ H01L 21/32136 118/59 |
| 6,399,484 B1 * | 6/2002 | Yamasaki | ............ C23C 16/0281 257/E21.168 |
| 6,444,262 B1 | 9/2002 | Kitamura et al. | |
| 7,235,138 B2 | 6/2007 | Zheng et al. | |
| 2003/0013320 A1 | 1/2003 | Kim et al. | |
| 2003/0164143 A1 | 9/2003 | Toyoda et al. | |
| 2004/0025786 A1 | 2/2004 | Kontani et al. | |
| 2005/0039686 A1 | 2/2005 | Zheng et al. | |
| 2005/0287775 A1 | 12/2005 | Hasebe et al. | |
| 2006/0252240 A1 * | 11/2006 | Gschwandtner | ...... C23C 16/345 438/584 |
| 2007/0246355 A1 | 10/2007 | Toyoda et al. | |
| 2008/0060580 A1 | 3/2008 | Toyoda et al. | |
| 2008/0066681 A1 | 3/2008 | Toyoda et al. | |
| 2008/0093215 A1 | 4/2008 | Toyoda et al. | |
| 2008/0102623 A1 | 5/2008 | Hirota et al. | |
| 2008/0121180 A1 | 5/2008 | Kontani et al. | |
| 2008/0251014 A1 | 10/2008 | Kontani et al. | |
| 2008/0251015 A1 | 10/2008 | Kontani et al. | |
| 2008/0311760 A1 * | 12/2008 | Nodera | ................ C23C 16/345 438/791 |
| 2009/0004877 A1 | 1/2009 | Asai | |
| 2009/0133630 A1 | 5/2009 | Toyoda et al. | |
| 2009/0159440 A1 | 6/2009 | Toyoda et al. | |
| 2010/0186898 A1 * | 7/2010 | Fukushima | ........... C23C 16/345 156/345.48 |
| 2010/0240217 A1 | 9/2010 | Kushibiki et al. | |
| 2010/0263593 A1 | 10/2010 | Kontani et al. | |
| 2010/0300357 A1 | 12/2010 | Yamamoto et al. | |
| 2012/0100722 A1 | 4/2012 | Asai | |

FOREIGN PATENT DOCUMENTS

| | | | |
|---|---|---|---|
| JP | 2004-281853 | | 10/2004 |
| JP | 2006-049809 | | 2/2006 |
| JP | 2008-112826 | | 5/2008 |
| JP | 2010-219105 | | 9/2010 |
| JP | 2010-226084 | A | 10/2010 |
| JP | 2010226084 | A * | 10/2010 |
| KR | 2009-0004576 | | 1/2009 |
| TW | 200531204 | A | 9/2005 |
| TW | 200710954 | A | 3/2007 |
| TW | 200933787 | A | 8/2009 |

OTHER PUBLICATIONS

Taiwanese Office action dated Dec. 13, 2013 in a Taiwanese patent application No. 100132592 which is corresponding to the instant patent application.
Japanese Office action dated Jun. 17, 2014 in a Japanese patent application No. 2010-240067 which is corresponding to the instant patent application.
Japanese Office action dated Jul. 1, 2014 in a Japanese patent application No. 2010-263626 which is corresponding to the instant patent application.
English language translation of the following: Office action dated Jan. 30, 2016 from the TIPO in a Taiwanese patent application corresponding to the instant patent application. This office action translation is submitted now in order to supplement the understanding of the cited references which are being disclosed in the instant lnforrnation Disclosure Statement.

* cited by examiner

FIG.22

| ALD Timing | step name | time(second) | supply rate | RF power (W) |
|---|---|---|---|---|
| t1 | supply DCS | 10 | DCS:100sccm | 0 |
| t2 | supply DCS | 11 | $N_2$:1.5slm | 0 |
| t3 | supply $NH_3$ Plasma | 9 | $NH_3$:6slm | X axis |
| t4 | Exhaust $NH_3$ | 6 | $N_2$:1.5slm | 0 |
| t1+t2+t3+t4 | 1 ALD cycle | 36 | - | - |

FIG.23

| (X axis) | number of particles (Y axis) | |
|---|---|---|
| RF power (W) | comparative example (Fig. 21) | eighth embodiment (Fig. 20) |
| 100 | 12 | 12 |
| 200 | 147 | 58 |
| 300 | 283 | 78 |
| 400 | 493 | 112 |
| 500 | 696 | 143 |

SUBSTRATE PROCESSING APPARATUS AND SEMICONDUCTOR DEVICE MANUFACTURING METHOD

CROSS-REFERENCE TO RELATED APPLICATION

This is a divisional application of U.S. application Ser. No. 13/230,869, filed on Sep. 13, 2011, the entire disclosure of which is incorporated herein by reference. Further, this application claims priority under 35 USC 119 from Japanese Patent Application No. 2010-240067 filed on Oct. 26, 2010 and Japanese Patent Application No. 2010-263626 filed on Nov. 26, 2010, the entire disclosures of which are incorporated herein by reference.

BACKGROUND

Technical Field

The present invention relates to a substrate processing apparatus and a semiconductor device manufacturing method, and more particularly, to a substrate processing apparatus and a semiconductor device manufacturing method for processing a substrate using plasma.

Related Art

A film forming process of depositing a predetermined thin film on a substrate by the use of a CVD (Chemical Vapor Deposition) method or an ALD (Atomic Layer Deposition) method using plasma is known as a semiconductor device manufacturing process (see Japanese Patent Application Laid-Open (JP-A No. 2003-297818). A CVD method is a method of depositing a thin film having elements included in source gas molecules as constituent elements on a substrate by the use of a gas phase of a gaseous raw material and a reaction on a surface. In the CVD method, plural types of source gas including plural elements constituting a film to be formed are simultaneously supplied to a substrate to form a film. In the ALD method, plural types of source gas including plural elements constituting a film to be formed are alternately supplied to a substrate to form a film. In the CVD method, the substrate can be processed at a low substrate temperature. The deposition of a thin film is controlled at an atomic layer level in the ALD method. Plasma is used to promote a chemical reaction of a thin film deposited by the use of the CVD method or to remove impurities from the thin film. In the ALD method, plasma is used to assist a chemical reaction of adsorbed film-forming materials.

However, with the gradual finer design rules in manufacturing a semiconductor device, there has been demand to form a film at a low substrate temperature and it is necessary to raise RF power for forming plasma. When the RF power for forming plasma is raised, damage to a substrate or a film to be formed increases, which is not preferable.

SUMMARY

A main object of the present invention is to provide a substrate processing apparatus and a semiconductor device manufacturing method, which can reduce the damage to a substrate or a film to be formed and can lower a substrate processing temperature at the time of processing a substrate using plasma.

According to a first aspect of the present invention, there is provided a substrate processing apparatus including:

a processing chamber in which a substrate is processed;

plural buffer chambers that are partitioned from the processing chamber and that respectively include a gas supply hole opened to the processing chamber;

a first processing gas supply system that supplies a first processing gas to the processing chamber;

a second processing gas supply system that supplies a second processing gas to the plural buffer chambers;

a power source that outputs RF power;

plasma-generating electrodes that activate the second processing gas in each of the buffer chambers with an application of the RF power from the power source;

a heating system that heats the substrate; and a controller that controls the first processing gas supply system, the power source, the second processing gas supply system, and the heating system to expose the substrate having a metal film formed on a surface thereof to the first processing gas, and the second processing gas that is activated in the plural buffer chambers with an application of RF power to the electrodes and that is supplied from the plural buffer chambers to the processing chamber to form a film on the metal film while heating the substrate to a self-decomposition temperature of the first processing gas or lower.

According to a second aspect of the present invention, there is provided a substrate processing apparatus including:

a processing chamber in which a substrate is processed;

one or more buffer chambers that are partitioned from the processing chamber and that includes a gas supply hole opened to the processing chamber;

a first processing gas supply system that supplies a first processing gas to the processing chamber;

a second processing gas supply system that supplies a second processing gas to the one or more buffer chambers;

a power source that outputs RF power;

a plasma-generating electrode that activates the second processing gas in the one or more buffer chambers with an application of the RF power from the power source; and a controller that controls the first processing gas supply system, the power source, and the second processing gas supply system to expose the substrate having a metal film formed on a surface thereof to the first processing gas and thereafter to expose the substrate to the first processing gas, and the second processing gas that is activated with the application of the RF power to the electrode to form a film on the metal film.

According to a third aspect of the present invention, there is provided a semiconductor device manufacturing method including:

loading a substrate having a metal film formed on a surface thereof into a processing chamber;

supplying a first processing gas, and a second processing gas that is not activated by plasma excitation to the processing chamber from plural processing gas supply systems independent of each other to pre-process the substrate;

supplying the first processing gas, and the second processing gas that is activated by the plasma excitation to the processing chamber from the plural processing gas supply systems to form a predetermined film on the pre-processed substrate; and unloading the substrate having the predetermined film formed thereon from the processing chamber.

BRIEF DESCRIPTION OF THE DRAWINGS

An exemplary embodiment of the present invention will be described in detail based on the following figures, wherein:

FIG. 22 is a table illustrating film forming conditions in an example of the eighth exemplary embodiment of the invention and a comparative example;

FIG. 23 is a table illustrating the relationship between RF power and particles in an example of the eighth exemplary embodiment of the invention and a comparative example;

DETAILED DESCRIPTION

Hereinafter, exemplary embodiments of the invention will be described with reference to the accompanying drawings.

First, a substrate processing apparatus suitably used in the exemplary embodiments of the invention will be described. The substrate processing apparatus is an example of a semiconductor device manufacturing apparatus used to manufacture a semiconductor device.

In the following description, a vertical batch apparatus performing a film forming process or the like on a substrate is used as an example of the substrate processing apparatus. However, the invention is not limited to the vertical batch apparatus but for example, a single wafer apparatus may be used.

Figure 1:
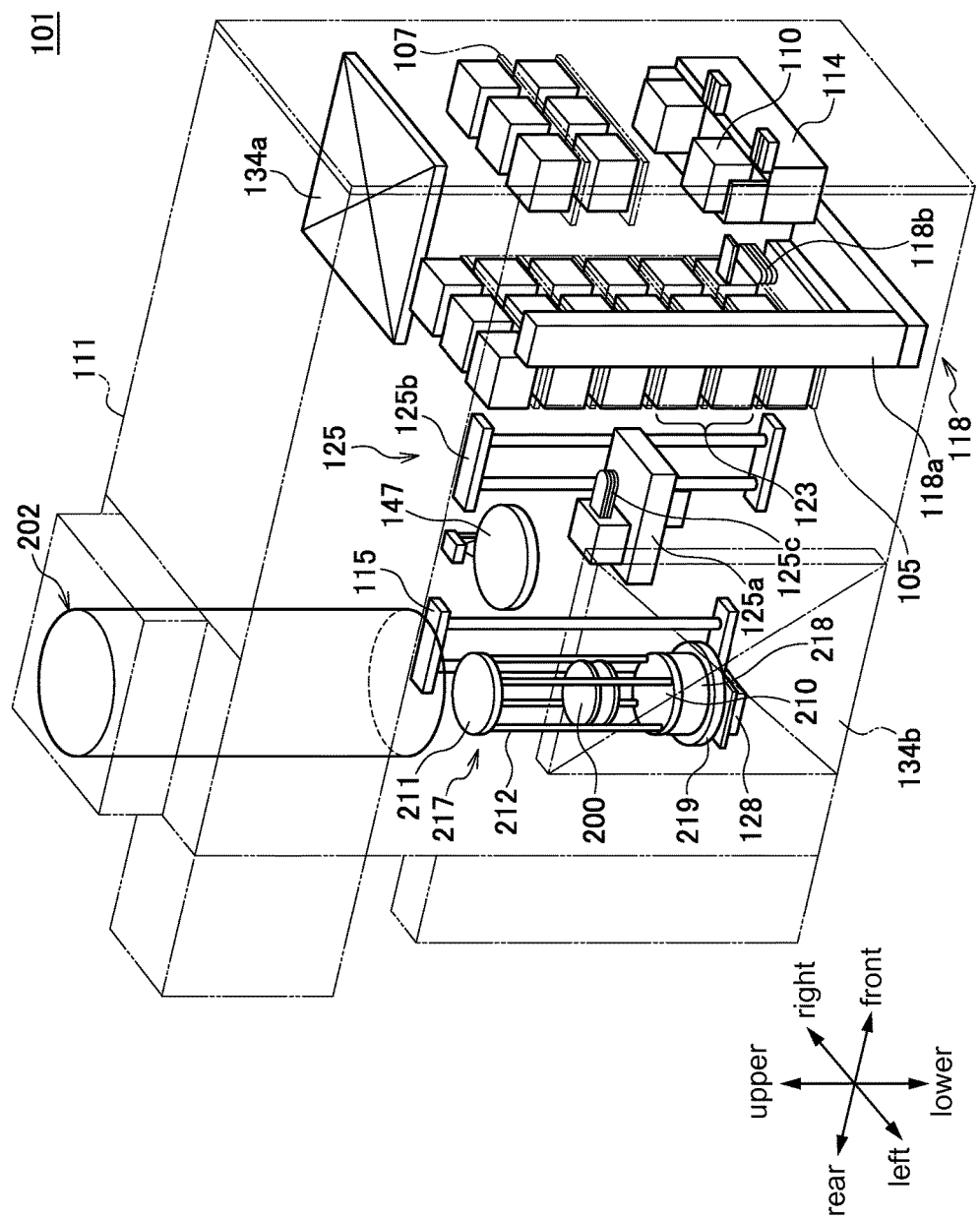
FIG. 1 is a perspective view schematically illustrating the configuration of a substrate processing apparatus suitably used in exemplary embodiments of the invention.

Referring to FIG. 1, a cassette 110 housing wafers 200 as an example of a substrate is used in a substrate processing apparatus 101 and the wafers 200 are formed of a material such as semiconductor silicon. The substrate processing apparatus 101 includes a housing 111 and a cassette stage 114 is disposed in the housing 111. The cassette 110 is loaded onto the cassette stage 114 or is unloaded from the cassette stage 114 by the use of an in-process carrier device (not shown).

The cassette 110 is placed on the cassette stage 114 by the use of the in-process carrier device (not shown) in a state in which wafers 200 in the cassettes 110 hold a vertical posture and a wafer gateway of the cassette 110 is directed upward. The cassette stage 114 is configured to cause the cassette 110 to rotate clockwise to the back of the housing 111 and to rotate vertically by 90° so that the wafers 200 in the cassette 110 are changed to a horizontal posture and the wafer gateway of the cassette 110 faces the back of the housing 111.

A cassette rack 105 is disposed more to the front region than approximately the center in the front-rear direction in the housing 111. The cassette rack 105 is configured to house plural cassettes 110 in plural stages and plural columns. The cassette rack 105 is provided with a transfer rack 123 receiving the cassettes 110 to be carried by a wafer transfer mechanism 125.

A preliminary cassette rack 107 is disposed above the cassette stage 114 and is configured to preliminarily store the cassettes 110.

A cassette carrier device 118 is disposed between the cassette stage 114 and the cassette rack 105. The cassette carrier device 118 includes a cassette elevator 118a elevating with the cassette 110 supported and a cassette carrying mechanism 118b as a carrying mechanism. The cassette carrier device 118 is configured to carry the cassette 110 among the cassette stage 114, the cassette rack 105, and the preliminary cassette rack 107 by the ganged operation of the cassette elevator 118a and the cassette carrying mechanism 118b.

A wafer transfer mechanism 125 is disposed in the back of the cassette rack 105. The wafer transfer mechanism 125 includes a wafer transfer device 125a that can rotate or transfer a wafer 200 in the horizontal direction and a wafer transfer device elevator 125b that elevates the wafer transfer device 125a. The wafer transfer device 125a is provided with a tweezers 125c that picks up the wafer 200. The wafer transfer mechanism 125 is configured to charge a boat 217 with the wafers 200 or to discharge the wafers 200 from the boat 217 using the tweezers 125c as a platform of the wafers 200 by the ganged operation of the wafer transfer device 125a and the wafer transfer device elevator 125b.

A processing furnace 202 that heats the wafers 200 is disposed on the upside of the rear part of the housing 111 and the lower end of the processing furnace 202 is opened or closed by a furnace opening shutter 147.

A boat elevator 115 that elevates the boat 217 relative to the processing furnace 202 is disposed below the processing furnace 202. An arm 128 is connected to an elevation platform of the boat elevator 115 and a sealing cap 219 is horizontally fixed to the arm 128. The sealing cap 219 is configured to vertically support the boat 217 and to close the lower end of the processing furnace 202.

The boat 217 includes plural support members and is configured to horizontally support plural (for example, 50 to 150 sheets of) wafers 200 in a state in which the wafers are concentrically arranged in the vertical direction.

A clean unit 134a that supplies clean air which is a cleaned atmosphere is disposed above the cassette rack 105. The clean unit 134a includes a feed fan (not shown) and a dust-proof filter (not shown) and is configured to cause the clean air to circulate inside the housing 111.

A clean unit 134b that supplies clean air is disposed at the left end of the housing 111. The clean unit 134b includes a feed fan (not shown) and a dust-proof filter (not shown) and is configured to cause the clean air to circulate in the vicinity of the wafer transfer device 125a, the boat 217, or the like. The clean air circulates in the vicinity of the wafer transfer device 125a, the boat 217, or the like and is then discharged from the housing 111.

The main operation of the substrate processing apparatus 101 will be described below.

When a cassette 110 is loaded into the cassette stage 114 by the use of the in-process carrier device (not shown), the cassette 110 is placed on the cassette stage 114 in a state in which the wafers 200 hold a vertical posture on the cassette stage 114 and the wafer gateway of the cassette 110 faces the upside. Thereafter, the cassette 110 is made to rotate clockwise to the back of the housing 111 and to rotate vertically by 90° by the cassette stage 114, so that the wafers 200 in the cassette 110 are changed to a horizontal posture and the wafer gateway of the cassette 110 faces the back of the housing 111.

Thereafter, the cassette 110 is automatically carried and handed over to a designated rack position of the cassette rack 105 or the preliminary cassette rack 107, is temporarily stored therein, is then transferred to the transfer rack 123 from the cassette rack 105 or the preliminary cassette rack 107 by the cassette carrier device 118, or is directly carried to the transfer rack 123.

When the cassette 110 is transferred to the transfer rack 123, a wafer 200 is picked up from the cassette 110 via the wafer gateway of the cassette 110 by the use of the tweezers 125c of the wafer transfer device 125a and is charged in the boat 217. The wafer transfer device 125a handing over the wafer 200 to the boat 217 is returned to the cassette 110 and charges the boat 217 with a subsequent wafer 200.

When the boat 217 is charged with a predetermined number of wafers 200, the furnace opening shutter 147 closing the lower end of the processing furnace 202 is opened to open the lower end of the processing furnace 202. Thereafter, the boat 217 supporting the wafers 200 is loaded into the processing furnace 202 by the elevating operation of the boat elevator 115 and the bottom of the processing furnace 202 is closed by the sealing cap 219.

After the loading, a desired process is performed on the wafers 200 in the processing furnace 202. After performing the desired process, the wafers 200 and the cassette 110 are unloaded from the housing 111 reversely in the above-mentioned order.

First to Seventh Embodiments

The background of first to seventh exemplary embodiments of the invention will be described below.

For example, at a low substrate temperature of 650° C. or lower, the formation of an amorphous silicon nitride film on a substrate is carried out by the use of the ALD method using DCS (DiChloroSilane) and plasma-excited $NH_3$ (ammonia). The formation of the amorphous silicon nitride film on the substrate using the ALD method is carried out by repeatedly performing (performing a cyclic process) four steps of a step of supplying the DCS to the substrate, a step of removing residual gas such as the DCS, a step of supplying the plasma-excited $NH_3$, and a step of removing residual gas such as $NH_3$. The thickness of the film can be controlled depending on the number of cyclic processes in the ALD method.

With the recent finer design rules of semiconductor devices, at a temperature of 300° C. more or less, it has been tried to form an amorphous silicon nitride film on a metal film formed on the surface of a substrate through the use of the ALD method using plasma. However, when the amorphous silicon nitride film is formed at such a low temperature, there is a problem in that the adhesion between the metal film and the amorphous silicon nitride film is poor and the amorphous silicon nitride film is peeled off.

The present inventors discovered that particles are generated when forming the amorphous silicon nitride film through the use of the ALD method using plasma, and the adhesion between the metal film and the amorphous silicon nitride film is poor and thus the amorphous silicon nitride film is easily peeled off when the number of particles is great.

The present inventors thought that the DCS is easily subjected to chemical adsorption when the substrate temperature is a high temperature of 400° C. or higher, but the physical adsorption is superior to the chemical adsorption and thus the DCS does not form a combined hand with the metal film formed on the surface of the substrate well when the substrate temperature is lower than 400° C., thereby deteriorating the adhesion.

The first to seventh exemplary embodiments of the invention to be described below are based on such finding or consideration. Particularly, when an amorphous silicon nitride film is formed at a low temperature (350° C. or lower) through the use of the ALD method using plasma, the number of particles generated can be reduced to improve the adhesion, or a pre-process can be performed to improve the adhesion before forming the amorphous silicon nitride film through the use of the ALD method using plasma.

First Embodiment

A processing furnace 202 according to the first exemplary embodiment used in the substrate processing apparatus 101 will be described below with reference to FIGS. 2 and 3.

Figure 2:
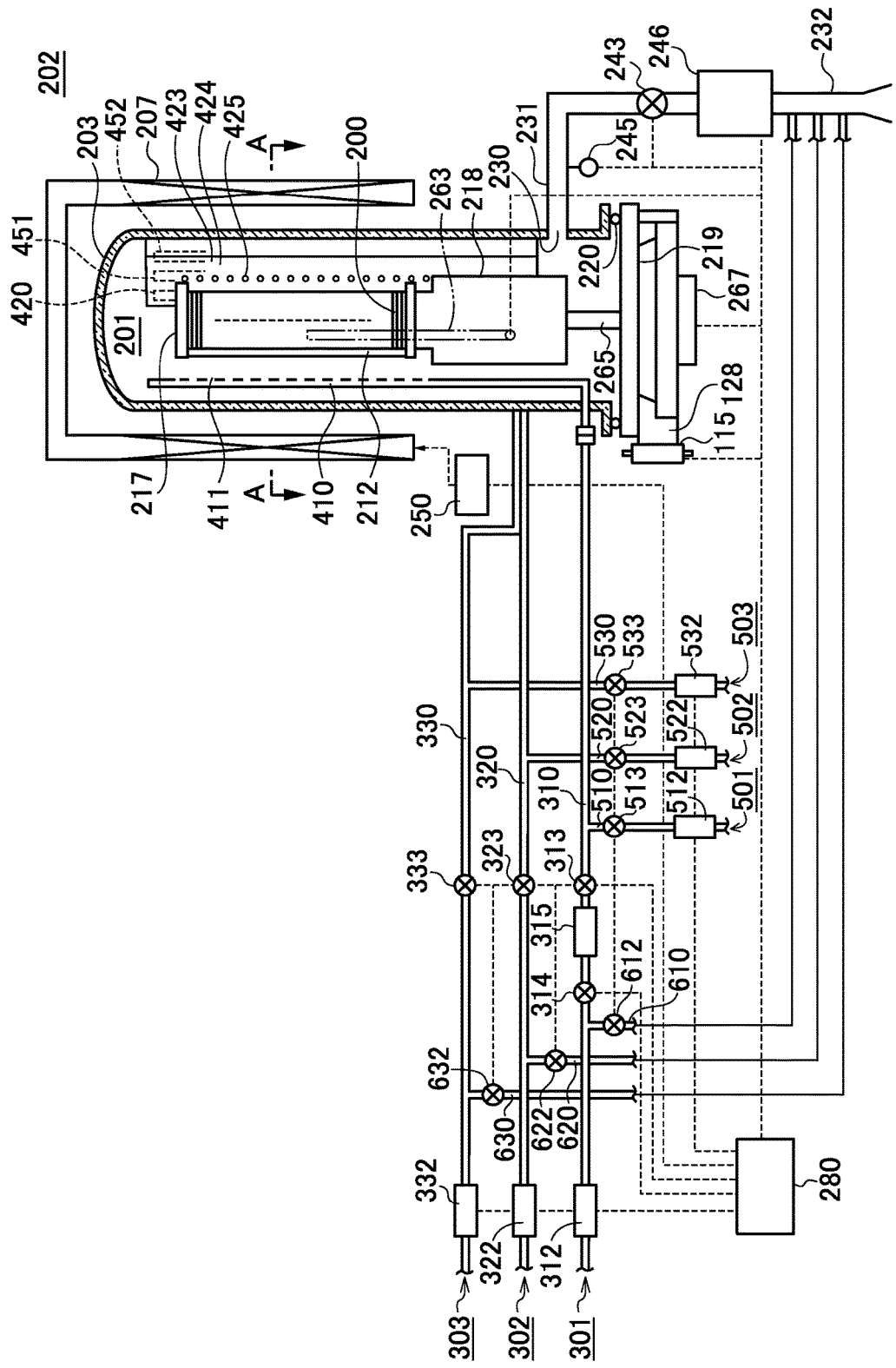
FIG. 2 is a diagram schematically illustrating an example of a processing furnace and members accompanied therewith, which are suitably used in first to third exemplary embodiments of the invention and is a schematic longitudinal sectional view taken along line B-B of FIG. 3, in which the schematic longitudinal section of the processing furnace is shown.
Figure 3:
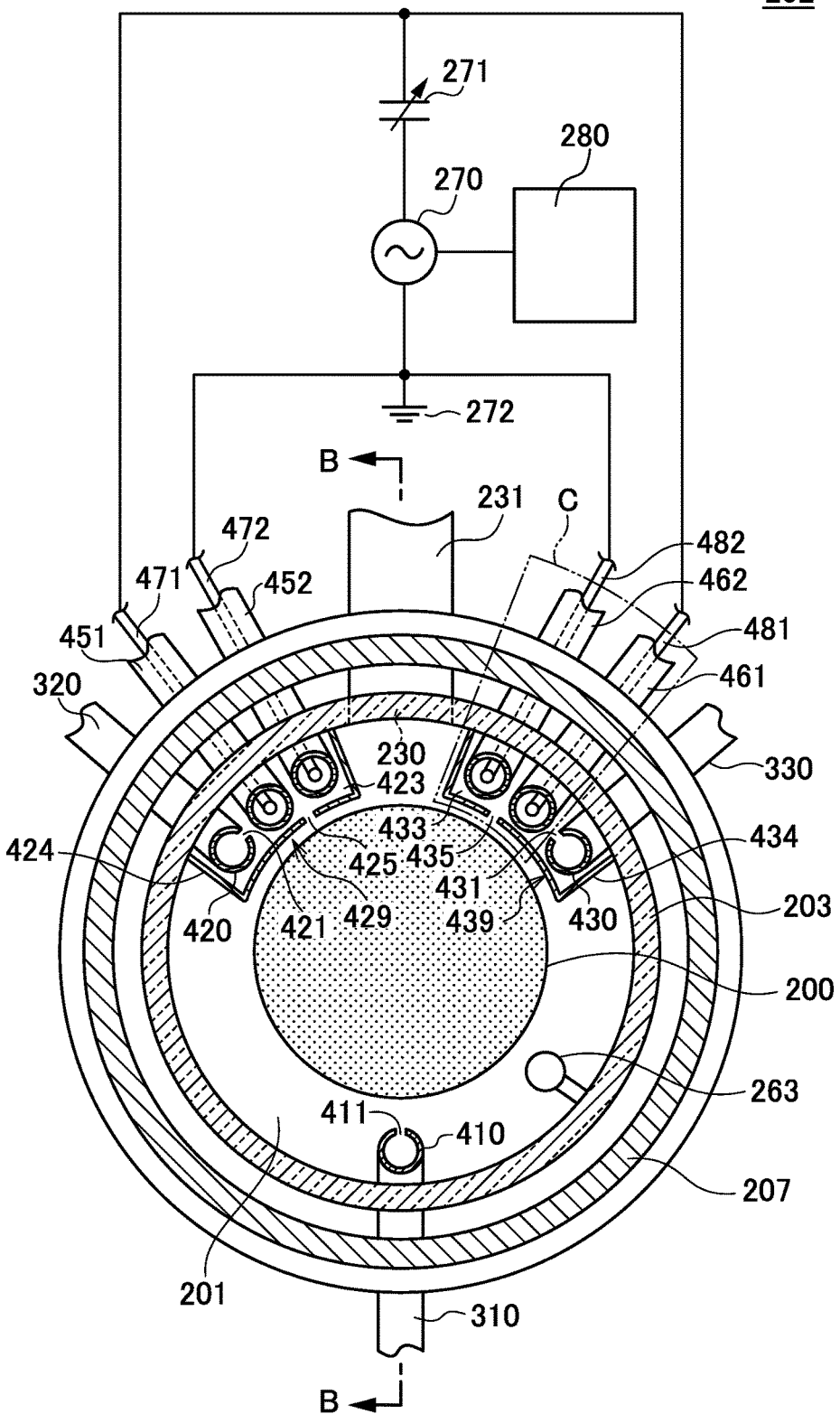
FIG. 3 is a schematic transverse sectional view taken along line A-A in the processing furnace shown in FIG. 2.

Referring to FIGS. 2 and 3, the processing furnace 202 is provided with a heater 207 which is a heating device (heating means) heating the wafers 200. The heater 207 includes a heat-insulating member having a cylindrical shape having a closed top and plural heater wires and has a unit configuration in which the heater wires are disposed in the heat-insulating member. Inside the heater 207, a quartz reaction tube 203 used to process the wafers 200 is disposed to be coaxial with the heater 207.

A sealing cap 219 as a furnace opening lid that can air-tightly close the lower opening of the reaction tube 203 is disposed below the reaction tube 203. The sealing cap 219 comes in contact with the lower end of the reaction tube 203 from the lower side in the vertical direction. The sealing cap 219 is formed of metal such as stainless steel in a disc shape. An airtight member (hereinafter, referred to as an O ring) 220 is disposed between an annular flange disposed at an end of the lower opening of the reaction tube 203 and the surface of the sealing cap 219 so as to air-tightly seal a space therebetween. A processing chamber 201 is formed at least by the reaction tube 203 and the sealing cap 219.

A boat support 218 supporting the boat 217 is disposed on the sealing cap 219. The boat support 218 is formed of a heat-resistant material such as quartz or silicon carbide and serves as a heat-insulating portion and a support supporting the boat. The boat 217 is disposed upright on the boat support 218. The boat 217 is formed of a heat-resistant material such as quartz or silicon carbide. The boat 217 includes a bottom plate 210 fixed to the boat support 218 and a top plate 211 disposed at the top and has a configuration in which plural pillars 212 are installed between the bottom plate 210 and the top plate 211 (see FIG. 1). Plural sheets of wafers 200 are stored in the boat 217. The plural sheets of wafers 200 are stacked in plural stages in the tube axis direction of the reaction tube 203 and are supported by the pillars 212 of the boat 217 in a state in which the wafers have a horizontal posture with a constant gap therebetween and are arranged to be concentric.

A boat rotating mechanism 267 causing the boat to rotate is disposed on the side of the sealing cap 219 opposed to the processing chamber 201. The rotation shaft 265 of the boat rotating mechanism 267 is connected to the boat support 218 via the sealing cap and the boat 217 is made to rotate via the boat support 218 by the boat rotating mechanism 267, whereby the wafers 200 rotate.

The sealing cap 219 elevates in the vertical direction by a boat elevator 115 as an elevation mechanism disposed outside the reaction tube 203, whereby the boat 217 can be loaded into and unloaded from the processing chamber 201.

In the processing furnace 202, the boat 217 is supported by the boat support 218 and is input to the processing chamber 201 in the state in which plural sheets of wafers 200 to be processed in a batch are stacked in plural stages in the boat 217, and the wafers 200 input to the processing chamber 201 are heated to a predetermined temperature by the heater 207.

Referring to FIGS. 2 and 3, three gas supply pipes 310, 320, and 330 supplying a source gas are connected.

Nozzles 410, 420, and 430 are disposed in the processing chamber 201. The nozzles 410, 420, and 430 pass through the lower part of the reaction tube 203. The nozzle 410 is connected to the gas supply pipe 310, the nozzle 420 is connected to the gas supply pipe 320, and the nozzle 430 is connected to the gas supply pipe 330.

A mass flow controller 312 which is a flow rate controller, a valve 314 which is an on-off valve, a gas reservoir 315, and a valve 313 which is an on-off valve are disposed sequentially from upstream in the gas supply pipe 310.

A downstream end of the gas supply pipe 310 is connected to an end of the nozzle 410. The nozzle 410 is disposed in an arc-like space between the inner wall of the reaction tube 203 and the wafers 200 so as to rise up in the stacking direction of the wafers 200 along the inner wall of the reaction tube 203 from the lower part to the upper part. The nozzle 410 is configured as an L-shaped long nozzle. Plural gas supply holes 411 supplying source gas are formed in the side surface of the nozzle 410. The gas supply holes 411 are opened to face the center of the reaction tube 203. The gas supply holes 411 are disposed at a constant pitch from the lower part to the upper part with the same or varying opening area.

The gas reservoir 315 gathering the gas supplied via the gas supply pipe 310 is disposed in the middle of the gas supply pipe 310. The gas reservoir 315 is formed, for example, by a gas tank or a spiral pipe having a larger capacity than the general pipe. By turning on and off the valve 314 upstream and the valve 313 downstream from the gas reservoir 315, the gas supplied via the gas supply pipe 310 can be gathered in the gas reservoir 315 or the gas gathered in the gas reservoir 315 can be supplied to the processing chamber 201.

In the gas supply pipe 310, a vent line 610 and a valve 612 connected to an exhaust pipe 232 to be described later are disposed between the valve 314 and the mass flow controller 312.

The gas supply pipe 310, the mass flow controller 312, the valve 314, the gas reservoir 315, the valve 313, the nozzle 410, the vent line 610, and the valve 612 constitute a gas supply system 301.

A carrier gas supply pipe 510 supplying carrier gas (inert gas) is connected to the gas supply pipe 310 on the downstream side of the valve 313. A mass flow controller 512 and a valve 513 are disposed in the carrier gas supply pipe 510. The carrier gas supply pipe 510, the mass flow controller 512, and the valve 513 constitute a carrier gas supply system (inert gas supply system) 501.

In the gas supply pipe 310, the flow rate of source gas is adjusted by the mass flow controller 312 and the source gas is supplied to the gas reservoir 315 and is gathered in the gas reservoir 315, in a state in which the valve 313 is turned off and the valve 314 is turned on. When a predetermined amount of source gas is gathered in the gas reservoir 315, the valve 314 is turned off.

When the source gas is not being supplied to the gas reservoir 315, the valve 314 is turned off and the valve 612 is turned on, whereby the source gas is made to flow to the vent line 610 via the valve 612.

When supplying the source gas to the processing chamber 201, the valves 314 and 513 are turned off and the valve 313 is turned on, whereby the source gas is supplied to the processing chamber 201 via the gas supply pipe 310 downstream from the valve 313 at a time.

Sequentially from the upstream, a mass flow controller 322 which is a flow rate controller and a vale 323 which is an on-off valve are disposed in the gas supply pipe 320.

The downstream end of the gas supply pipe 320 is connected to an end of the nozzle 420. The nozzle 420 is disposed in a buffer chamber 423 which is a gas dispersion space (a discharge chamber, a discharge space). Electrode protecting pipes 451 and 452 to be described later are disposed in the buffer chamber 423. The nozzle 420, the electrode protecting pipe 451, and the electrode protecting pipe 452 are disposed in the buffer chamber 423 in this order.

The buffer chamber 423 is formed by the inner wall of the reaction tube 203 and a buffer chamber wall 424. The buffer chamber wall 424 is disposed in the stacking direction of the wafers 200 in the inner wall of the reaction tube 203 extending from the lower part to the upper part in an arc-like space between the inner wall of the reaction tube 203 and the wafers 200. A gas supply hole 425 supplying gas is formed in the wall of the buffer chamber wall 424 close to the wafers 200. The gas supply hole 425 is disposed between the electrode protecting pipe 451 and the electrode protecting pipe 452. The gas supply hole 425 is opened to face the center of the reaction tube 203. The plural gas supply holes 425 are disposed over from the lower part to the upper part of the reaction tube 203 and have the same opening area and the same pitch.

The nozzle 420 is disposed at an end of the buffer chamber 423 so as to rise up in the stacking direction of the wafers 200 along the inner wall of the reaction tube 203 from the bottom to the top. The nozzle 420 is configured as an L-shaped long nozzle. A gas supply hole 421 supplying source gas is formed in the side surface of the nozzle 420. The gas supply hole 421 is opened to face the center of the buffer chamber 423. The plural gas supply holes 421 are disposed over from the lower part of the reaction tube 203 to the upper part, similarly to the gas supply holes 425 of the buffer chamber 423. The plural gas supply holes 421 are disposed with the same opening area at the same pitch from the upstream (the lower part) to the downstream (the upper part) when the pressure difference between the buffer chamber 423 and the nozzle 420 is small, but the opening area becomes gradually larger or the pitch becomes smaller from the upstream to the downstream when the pressure difference is large.

In this embodiment, by adjusting the opening area or the opening pitch of the gas supply holes 421 of the nozzles 420 from the upstream to the downstream as described above, gas having a difference in flow rate but almost the same flow volume is ejected from the gas supply holes 421. The gas ejected from the gas supply holes 421 is once introduced into the buffer chamber 423 and the flow rate of the gas is uniformized in the buffer chamber 423.

That is, the gas ejected into the buffer chamber 423 from the gas supply holes 421 of the nozzle 420 is alleviated in particle speed of the gas in the buffer chamber 423 and is then ejected into the processing chamber 201 from the gas supply holes 425 of the buffer chamber 423. Accordingly, the gas ejected into the buffer chamber 423 from the gas supply holes 421 of the nozzle 420 is changed to gas having uniform flow volume and rate when the gas is ejected into the processing chamber 201 from the gas supply holes 425 of the buffer chamber 423.

In the gas supply pipe 320, a vent line 620 and a valve 622 connected to the exhaust pipe 232 to be described later are disposed between the valve 323 and the mass flow controller 322.

The gas supply pipe 320, the mass flow controller 322, the valve 323, the nozzle 420, the buffer chamber 423, the vent line 620, and the valve 622 constitute a gas supply system 302.

A carrier gas supply pipe 520 supplying carrier gas (inert gas) is connected to the gas supply pipe 320 on the downstream side of the valve 323. A mass flow controller 522 and a valve 523 are disposed in the carrier gas supply pipe 520. The carrier gas supply pipe 520, the mass flow controller 522, and the valve 523 constitute a carrier gas supply system (inert gas supply system) 502.

In the gas supply pipe 320, the flow rate of source gas is adjusted by the mass flow controller 322 and the source gas is then supplied.

When the source gas is not being supplied to the processing chamber 201, the valve 323 is turned off and the valve 622 is turned on, whereby the source gas is made to flow to the vent line 620 via the valve 622.

When supplying the source gas to the processing chamber 201, the valve 622 is turned off and the valve 323 is turned on, whereby the source gas is supplied to the gas supply pipe 320 downstream from the valve 323. On the other hand, carrier gas is adjusted in flow rate by the mass flow controller 522 and is supplied from the carrier gas supply pipe 520 via the valve 523. The source gas is merged with the carrier gas downstream from the valve 323 and the merged gas is supplied to the processing chamber 201 via the nozzle 420 and the buffer chamber 423.

Sequentially from the upstream, a mass flow controller 332 which is a flow rate controller and a vale 333 which is an on-off valve are disposed in the gas supply pipe 330.

The downstream end of the gas supply pipe 330 is connected to an end of the nozzle 430. The nozzle 430 is disposed in a buffer chamber 433 which is a gas dispersion space (a discharge chamber, a discharge space). Electrode protecting pipes 461 and 462 to be described later are disposed in the buffer chamber 433. The nozzle 430, the electrode protecting pipe 461, and the electrode protecting pipe 462 are disposed in the buffer chamber 433 in this order.

The buffer chamber 433 is formed by the inner wall of the reaction tube 203 and a buffer chamber wall 434. The buffer chamber wall 434 is disposed in the stacking direction of the wafers 200 in the inner wall of the reaction tube 203 extending from the lower part to the upper part in an arc-like space between the inner wall of the reaction tube 203 and the wafers 200. A gas supply hole 435 supplying gas is formed in the wall of the buffer chamber wall 434 close to the wafers 200. The gas supply hole 435 is disposed between the electrode protecting pipe 461 and the electrode protecting pipe 462. The gas supply hole 435 is opened to face the center of the reaction tube 203. The plural gas supply holes 435 are disposed over from the lower part to the upper part of the reaction tube 203 and have the same opening area and the same pitch.

The nozzle 430 is disposed at an end of the buffer chamber 433 so as to rise up in the stacking direction of the wafers 200 along the inner wall of the reaction tube 203 from the bottom to the top. The nozzle 430 is configured as an L-shaped long nozzle. A gas supply holes 431 supplying source gas is formed in the side surface of the nozzle 430. The gas supply hole 431 is opened to face the center of the buffer chamber 433. The plural gas supply holes 431 are disposed over from the lower part of the reaction tube 203 to the upper part, similarly to the gas supply holes 435 of the buffer chamber 433. The plural gas supply holes 431 are disposed with the same opening area at the same pitch from the upstream (the lower part) to the downstream (the upper part) when the pressure difference between the buffer chamber 433 and the nozzle 430 is small, but the opening area becomes gradually larger or the pitch becomes smaller from the upstream to the downstream when the pressure difference is large.

In this embodiment, by adjusting the opening area or the opening pitch of the gas supply holes 431 of the nozzles 430 from the upstream to the downstream as described above, gas having a difference in flow rate but almost the same flow volume is ejected from the gas supply holes 431. The gas ejected from the gas supply holes 431 is once introduced into the buffer chamber 433 and the flow rate of the gas is uniformized in the buffer chamber 433.

That is, the gas ejected into the buffer chamber 433 from the gas supply holes 431 of the nozzle 430 is alleviated in particle speed of the gas in the buffer chamber 433 and is then ejected into the processing chamber 201 from the gas supply holes 435 of the buffer chamber 433. Accordingly, the gas ejected into the buffer chamber 433 from the gas supply holes 431 of the nozzle 430 is changed to gas having uniform flow volume and rate when the gas is ejected into the processing chamber 201 from the gas supply holes 435 of the buffer chamber 433.

In the gas supply pipe 330, a vent line 630 and a valve 632 connected to the exhaust pipe 232 to be described later are disposed between the valve 333 and the mass flow controller 332.

The gas supply pipe 330, the mass flow controller 332, the valve 333, the nozzle 430, the buffer chamber 433, the vent line 630, and the valve 632 constitute a gas supply system 303.

A carrier gas supply pipe 530 supplying carrier gas (inert gas) is connected to the gas supply pipe 330 on the downstream side of the valve 333. A mass flow controller 532 and a valve 533 are disposed in the carrier gas supply pipe 530. The carrier gas supply pipe 530, the mass flow controller 532, and the valve 533 constitute a carrier gas supply system (inert gas supply system) 503.

In the gas supply pipe 330, the flow rate of source gas is adjusted by the mass flow controller 332 and the source gas is then supplied.

When the source gas is not being supplied to the processing chamber 201, the valve 333 is turned off and the valve 632 is turned on, by which the source gas is made to flow to the vent line 630 via the valve 632.

When supplying the source gas to the processing chamber 201, the valve 632 is turned off and the valve 333 is turned on, by which the source gas is supplied to the gas supply pipe 330 downstream from the valve 333. On the other hand, carrier gas is adjusted in flow rate by the mass flow controller 532 and is supplied from the carrier gas supply pipe 530 via the valve 533. The source gas is merged with the carrier gas downstream from the valve 333 and the merged gas is supplied to the processing chamber 201 via the nozzle 430 and the buffer chamber 433.

In the buffer chamber 423, a rod-like electrode 471 and a rod-like electrode 472 having a long and thin shape are disposed in the stacking direction of the wafers 200 from the lower part to the upper part of the reaction tube 203. The rod-like electrode 471 and the rod-like electrode 472 are disposed in parallel to the nozzle 420. The rod-like electrode 471 and the rod-like electrode 472 are covered with electrode protecting pipes 451 and 452 which are protecting pipes protecting the electrodes, respectively, from the upper part to the lower part and are thus protected. The rod-like electrode 471 is connected to an RF (Radio Frequency) power source 270 via a matching unit 271 and the rod-like electrode 472 is connected to an earth 272 which is a reference potential. As a result, plasma is generated in a plasma generating area between the rod-like electrode 471 and the rod-like electrode 472. The rod-like electrode 471, the rod-like electrode 472, the electrode protecting pipe 451, the electrode protecting pipe 452, the buffer chamber 423, and the gas supply holes 425 constitute a first plasma generating structure 429. The rod-like electrode 471, the rod-like electrode 472, the electrode protecting pipe 451, the electrode protecting pipe 452, the matching unit 271, and the RF power source 270 constitute a first plasma source as a plasma generator (plasma generating unit). The first plasma source serves as an activation mechanism activating gas with plasma. The buffer chamber 423 serves as a plasma generating chamber.

In the buffer chamber 433, a rod-like electrode 481 and a rod-like electrode 482 having a long and thin shape are disposed in the stacking direction of the wafers 200 from the lower part to the upper part of the reaction tube 203. The rod-like electrode 481 and the rod-like electrode 482 are disposed in parallel to the nozzle 420. The rod-like electrode 481 and the rod-like electrode 482 are covered with electrode protecting pipes 461 and 462 which are protecting pipes protecting the electrodes, respectively, from the upper part to the lower part and are thus protected. The rod-like electrode 481 is connected to an RF (Radio Frequency) power source 270 via a matching unit 271 and the rod-like electrode 482 is connected to an earth 272 which is a reference potential. As a result, plasma is generated in a plasma generating area between the rod-like electrode 481 and the rod-like electrode 482. The rod-like electrode 481, the rod-like electrode 482, the electrode protecting pipe 461, the electrode protecting pipe 462, the buffer chamber 433, and the gas supply holes 425 constitute a first plasma generating structure 439. The rod-like electrode 481, the rod-like electrode 482, the electrode protecting pipe 461, the electrode protecting pipe 462, the matching unit 271, and the RF power source 270 constitute a second plasma source as a plasma generator (plasma generating unit). The second plasma source serves as an activation mechanism activating gas with plasma. The buffer chamber 433 serves as a plasma generating chamber.

The electrode protecting pipe 451 and the electrode protecting pipe 452 are inserted into the buffer chamber 423 via through-holes (not shown) formed in the reaction tube 203 at a height position close to the lower part of the boat support 218. The electrode protecting pipe 461 and the electrode protecting pipe 462 are inserted into the buffer chamber 433 via through-holes (not shown) formed in the reaction tube 203 at a height position close to the lower part of the boat support 218.

The electrode protecting pipe 451 and the electrode protecting pipe 452 are configured to insert the rod-like electrode 471 and the rod-like electrode 472 into the buffer chamber 423 in a state in which they are isolated from the atmosphere of the buffer chamber 423. The electrode protecting pipe 461 and the electrode protecting pipe 462 are configured to insert the rod-like electrode 481 and the rod-like electrode 482 into the buffer chamber 433 in a state in which they are isolated from the atmosphere of the buffer chamber 433. When the insides of the electrode protecting pipes 451, 452, 461, and 462 have the same atmosphere as external air (atmospheric air), the rod-like electrodes 471, 472, 481, and 482 inserted into the electrode protecting pipes 451, 452, 461, and 462 are oxidized by the heat from the heater 207. Therefore, an inert gas purging mechanism (not shown) charging and purging inert gas such as nitrogen and suppressing the oxygen concentration to be sufficiently low to prevent the oxidation of the rod-like electrodes 471, 472, 481, and 482 is disposed in the electrode protecting pipes 451, 452, 461, and 462.

The plasma generated in this embodiment is referred to as remote plasma. The remote plasma means plasma used to transport the plasma generated between the electrodes to the surface of a processing target through the use of a gas flow or the like to perform a plasma process. In this embodiment, since two rod-like electrodes 471 and 472 are received in the buffer chamber 423 and two rod-like electrodes 481 and 482 are received in the buffer chamber 433, ions damaging the wafers 200 hardly leak into the processing chamber 201 other than the buffer chambers 423 and 433. An electric field is generated to surround the two rod-like electrodes 471 and 472 (that is, to surround the electrode protecting pipes 451 and 452 receiving the two rod-like electrodes 471 and 472, respectively) to generate plasma, and an electric field is generated to surround the two rod-like electrodes 481 and 482 (that is, to surround the electrode protecting pipes 461 and 462 receiving the two rod-like electrodes 481 and 482, respectively) to generate plasma. Active species contained in the plasma are supplied to the center of the wafers 200 from the outer edge of the wafers 200 via the gas supply holes 425 of the buffer chamber 423 and the gas supply holes 435 of the buffer chamber 433. As in this embodiment, in a vertical batch apparatus in which plural sheets of wafers 200 are stacked in the state in which the main surfaces thereof are parallel to the horizontal plane, since the buffer chambers 423 and 433 are disposed on the inner wall surface of the reaction tube 203, that is, at the positions close to the wafers 200 to be processed, the active species can easily reach the surfaces of the wafers 200 without being deactivated.

Referring to FIGS. 2 and 3, an exhaust hole 230 is disposed in the lower part of the reaction tube. The exhaust hole 230 is connected to an exhaust pipe 231. The gas supply holes 411 of the nozzle 410 and the exhaust hole 230 are disposed at positions (opposite positions by 180 degrees) opposed to each other with the wafers 200 interposed therebetween. Accordingly, since the source gas supplied from the gas supply holes 411 flows horizontally over the main surfaces of the wafers 200 toward the exhaust pipe 231, the source gas can be easily uniformly supplied to the entire surface of each wafer 200 and thus a uniform film can be formed on the wafer 200.

In this embodiment, the first plasma source constituted by the rod-like electrode 471, the rod-like electrode 472, the electrode protecting pipe 451, the electrode protective pipe 452, the matching unit 271, and the RF power source 270 and the second plasma source constituted by the rod-like electrode 481, the rod-like electrode 482, the electrode protecting pipe 461, the electrode protective pipe 462, the matching unit 271, and the RF power source 270 are provided. When only one plasma source is provided, the input RF power density per unit volume is great and a lot of particles are generated. However, in this embodiment, since two plasma sources of the first plasma source and the second plasma source are provided, the RF power supplied to the respective plasma sources can be reduced (by half) to reduce the number of particles generated, compared with the case in which only one plasma source is provided. Since the RF power supplied to the plasma sources can be reduced, the damage to the wafers 200 or the films formed on the wafers 200 can be reduced. Even when the RF power supplied to the plasma sources is reduced, a sufficient amount of plasma to process a substrate can be generated by the two plasma sources, thereby lowering the processing temperature of the wafers 200.

Since the first plasma generating structure 429 constituted by the rod-like electrode 471, the rod-like electrode 472, the electrode protecting pipe 451, the electrode protective pipe 452, the buffer chamber 423, and the gas supply holes 425 and the second plasma generating structure 439 constituted by the rod-like electrode 481, the rod-like electrode 482, the electrode protecting pipe 461, the electrode protective pipe 462, the buffer chamber 433, and the gas supply holes 435 are disposed symmetric with respect to a line passing through the center of the wafers 200 (the center of the reaction tube 203), it is easy to supply plasma uniformly to the entire surfaces of the wafers 200 from both plasma generating structures and it is thus possible to form a uniform film on the wafers 200.

Since the exhaust hole 230 is disposed on the line passing through the center of the wafers 200 (the center of the reaction tube 203), it is easy to supply plasma uniformly to the entire surfaces of the wafers 200 from both plasma generating structures and it is thus possible to form a uniform film on the wafers 200. Since the gas supply holes 411 of the nozzle 410 are also disposed in the line passing through the center of the wafers 200 (the center of the reaction tube 203), it is easy to supply plasma uniformly to the entire surfaces of the wafers 200 from both plasma generating structures and it is thus possible to form a uniform film on the wafers 200.

Since the gas supply holes 411, the gas supply holes 425, and the gas supply holes 435 are disposed so that the distance between the gas supply holes 411 of the nozzle 410 and the gas supply holes 425 of the buffer chamber 423 is equal to the distance between the gas supply holes 411 of the nozzle 410 and the gas supply holes 435 of the buffer chamber 433, it is possible to form a uniform film on the wafers 200.

Referring to FIGS. 2 and 3 again, the exhaust pipe 231 discharging the atmosphere in the processing chamber 201 is connected to the exhaust hole 230 in the lower part of the reaction tube. A pressure sensor 245 as a pressure detector (pressure detecting unit) detecting the pressure in the processing chamber 201 and a vacuum pump 246 as a vacuum exhaust device via an APC (Auto Pressure Controller) valve 243 as a pressure controller (pressure control unit) are connected to the exhaust pipe 231, by which the processing chamber 201 is exhausted by vacuum so that the pressure in the processing chamber is a predetermined pressure (degree of vacuum). The exhaust pipe 232 downstream from the vacuum pump 246 is connected to a waste gas processing device (not shown) or the like. The APC valve 243 is an on-off valve that can turn on and off its valve to perform the vacuum exhaust or the vacuum exhaust stop of the processing chamber 201 and that can adjust the valve aperture ratio to adjust the conductance so as to adjust the pressure in the processing chamber 201. The exhaust pipe 231, the APC valve 243, the vacuum pump 246, and the pressure sensor 245 constitute an exhaust system.

A temperature sensor 263 as a temperature detector is disposed in the reaction tube 203 and the processing chamber 201 has a desired temperature distribution by adjusting supply power to the heater 207 on the basis of temperature information detected by the temperature sensor 263. The temperature sensor 263 is formed in an L shape, is introduced into the reaction tube 203 through a manifold 209, and is disposed along the inner wall of the reaction tube 203.

The boat 271 is disposed at the center of the reaction tube 203. The boat 217 can be elevated (loaded and unloaded) relative to the reaction tube 203 through the use of the boat elevator 115. When the boat 217 is loaded into the reaction tube 203, the lower end of the reaction tube 203 is air-tightly sealed via the O ring 220 by the sealing cap 219. The boat 217 is supported by the boat support 218. To improve the uniformity of processes, the boat rotating mechanism 267 is driven to rotate the boat 217 supported by the boat support 218.

Figure 4:
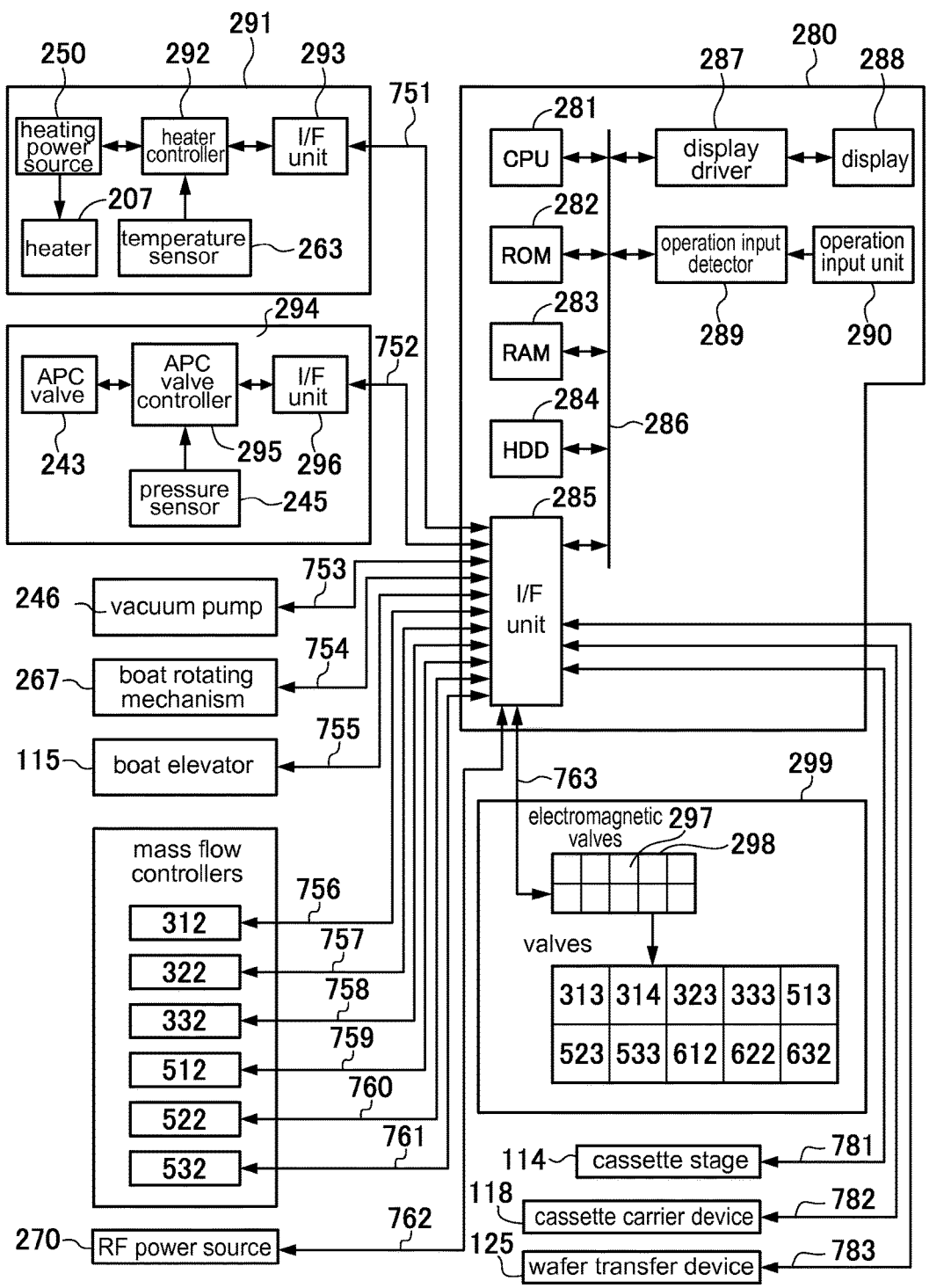
FIG. 4 is a block diagram illustrating a controller suitably used in a substrate processing apparatus according to first to seventh exemplary embodiments of the invention and members controlled by the controller.

Referring to FIG. 4, a controller 280 includes a display 288 displaying an operation menu and the like and an operation input unit 290 having plural keys and receiving various information or an operation instruction. The controller 280 includes a CPU 281 controlling the overall operation of the substrate processing apparatus 101, a ROM 282 storing various programs including a control program in advance, a RAM 283 temporarily storing a variety of data, an HDD 284 storing and holding a variety of data, a display driver 287 controlling the display of a variety of information on the display 288 and receiving operation information from the display 288, an operation input detecting unit 289 detecting an operation state on the operation input unit 290, and a communication interface (I/F) unit 285 transmitting and receiving a variety of information to and from various members such as a temperature controller 291 to be described later, a pressure controller 294 to be described later, the vacuum pump 246, the boat rotating mechanism 267, the boat elevator 115, the mass flow controllers 312, 322, 332, 512, 522, and 532, a valve controller 299 to be described later, the cassette stage 114, the cassette carrier device 118, and the wafer transfer device 125.

The CPU 281, the ROM 282, the RAM 283, the HDD 284, the display driver 287, the operation input detecting unit 289, and the communication I/F unit 285 are connected to each other via a system bus 286. Accordingly, the CPU 281 can access the ROM 282, the RAM 283, and the HDD 284, can control the display of a variety of information on the display 288 via the display driver 287, can grasp the operation information from the display 288, and can control the transmission and reception of a variety of information to and from various members via the communication I/F unit 285. The CPU 281 can grasp a user's operation state on the operation input unit 290 via the operation input detecting unit 289.

The temperature controller 291 includes a heater 207, a heating power source 250 supplying power to the heater 207, a temperature sensor 263, an communication I/F unit 293 transmitting and receiving a variety of information such as set temperature information to and from the controller 280, and a heater controller 292 controlling the supply power from the heating power source 250 to the heater 207 on the basis of the received set temperature information and the temperature information from the temperature sensor 263. The heater controller 292 is embodied by a computer. The communication I/F unit 293 of the temperature controller 291 and the communication I/F unit 285 of the controller 280 are connected to each other via a cable 751.

The pressure controller 294 includes an APC valve 243, a pressure sensor 245, a communication I/F unit 296 transmitting and receiving a variety of information such as set pressure information and on-off information of the APC valve 243 to and from the controller 280, and an APC valve controller 295 controlling the turning-on and turning-off or the aperture ratio of the APC valve 243 on the basis of the received set pressure information, the on-off information of the APC valve 243, the pressure information from the pressure sensor 245, and the like. The APC valve controller 295 is also embodied by a computer. The communication I/F unit 296 of the pressure controller 294 and the communication I/F unit 285 of the controller 280 are connected to each other via a cable 752.

The vacuum pump 246, the boat rotating mechanism 267, the boat elevator 115, the mass flow controllers 312, 322, 332, 512, 522, and 532, the RF power source 270, the cassette stage 114, the cassette carrier device 118, and the wafer transfer device 125 are connected to the communication I/F unit 285 of the controller 280 via cables 753, 754, 755, 756, 757, 758, 759, 760, 761, 762, 781, 782, and 783, respectively.

The valve controller 299 includes valves 313, 314, 323, 333, 513, 523, 533, 612, 622, and 632 and an electromagnetic valve group 298 controlling the supply of air to the valves 313, 314, 323, 333, 513, 523, 533, 612, 622, and 632 which are air valves. The electromagnetic valve group 298 includes electromagnetic valves 297 corresponding to the valves 313, 314, 323, 333, 513, 523, 533, 612, 622, and 632. The electromagnetic valve group 298 and the communication I/F unit 285 of the controller 280 are connected to each other via a cable 763.

In this way, various members such as the mass flow controllers 312, 322, 332, 512, 522, and 532, the valves 313, 314, 323, 333, 513, 523, 533, 612, 622, and 632, the APC valve 243, the heating power source 250, the temperature sensor 263, the pressure sensor 245, the vacuum pump 246, the boat rotating mechanism 267, the boat elevator 115, and the RF power source 270 are connected to the controller 280. The controller 280 performs the posture control of the cassette 110 through the use of the cassette stage 114, the carrying operation control of the cassette 110 through the use of the cassette carrier device 118, the transfer operation control of the wafers 200 through the use of the wafer transfer device 125, the flow rate control of the mass flow controllers 312, 322, 332, 512, 522, and 532, the on-off operation control of the valves 313, 314, 323, 333, 513, 523, 533, 612, 622, and 632, the on-off control of the APC valve 243, the pressure control through the use of the aperture ratio adjusting operation based on the pressure information from the pressure sensor 245, the temperature control through the use of the power supply adjusting operation from the heating power source 250 to the heater 207 on the basis of the temperature information from the temperature sensor 263, the control of the RF power supplied from the RF power source 270, the start and stop control of the vacuum pump 246, the rotation speed control of the boat rotating mechanism 267, the elevation operation control of the boat elevator 115, and the like.

An example of a semiconductor device manufacturing process of manufacturing a large scale integration circuit (LSI) using the above-mentioned substrate processing apparatus will be described below. In the following description, the operations of the constituent units of the substrate processing apparatus are controlled by the controller 280.

The LSI is manufactured by performing a wafer process of processing a wafer and then going through an assembly process, a test process, and a reliability test process. The wafer process is divided into a substrate process of performing processes of oxidation, diffusion, and the like on a silicon wafer and a wiring process of forming wires on the surface thereof. In the wiring process, a cleaning process, a thermal treatment process, a film forming process, and the like in addition to a lithography process are repeatedly performed. In the lithography process, a resist pattern is formed and the underlying layer of the pattern is processed by performing an etching process using the pattern as a mask.

An example in which an amorphous silicon nitride film is formed on a GST (GeSbTe) film which is a metal film formed on the surface of the wafer 200 in the substrate process or the wiring process by the use of the substrate processing apparatus 101 will be described below.

In the CVD method of the CVD method and the ALD method, plural types of gas containing plural elements constituting a film to be formed are simultaneously supplied. In the ALD method, plural types of gas containing plural elements constituting a film to be formed are alternately supplied. By controlling the processing conditions such as a supply flow rate, a supply time, and plasma power at the time of supply, a silicon oxide film (SiO film) or a silicon nitride film (SiN film) is formed. In such a technique, the supply conditions are controlled so that the composition ratio of a film is a stoichiometric composition $O/Si \approx 2$, for example, when an SiO film is formed and the composition ratio of a film is a stoichiometric composition $N/Si \approx 1.33$.

On the other hand, unlike the ALD, the supply condition may be controlled so that the composition ratio of a film to be formed is a predetermined composition ratio different from the stoichiometric composition. That is, the supply condition is controlled so that at least one element among plural elements constituting the film to be formed is more excessive with respect to the stoichiometric composition than the other elements. In this way, the film may be formed while controlling the ratio of plural elements constituting the film to be formed, that is, controlling the composition ratio of the film. A sequence of forming a silicon oxide film having a stoichiometric composition by alternately supply plural types of gas containing different types of elements using the ALD method will be described below.

Figure 5:
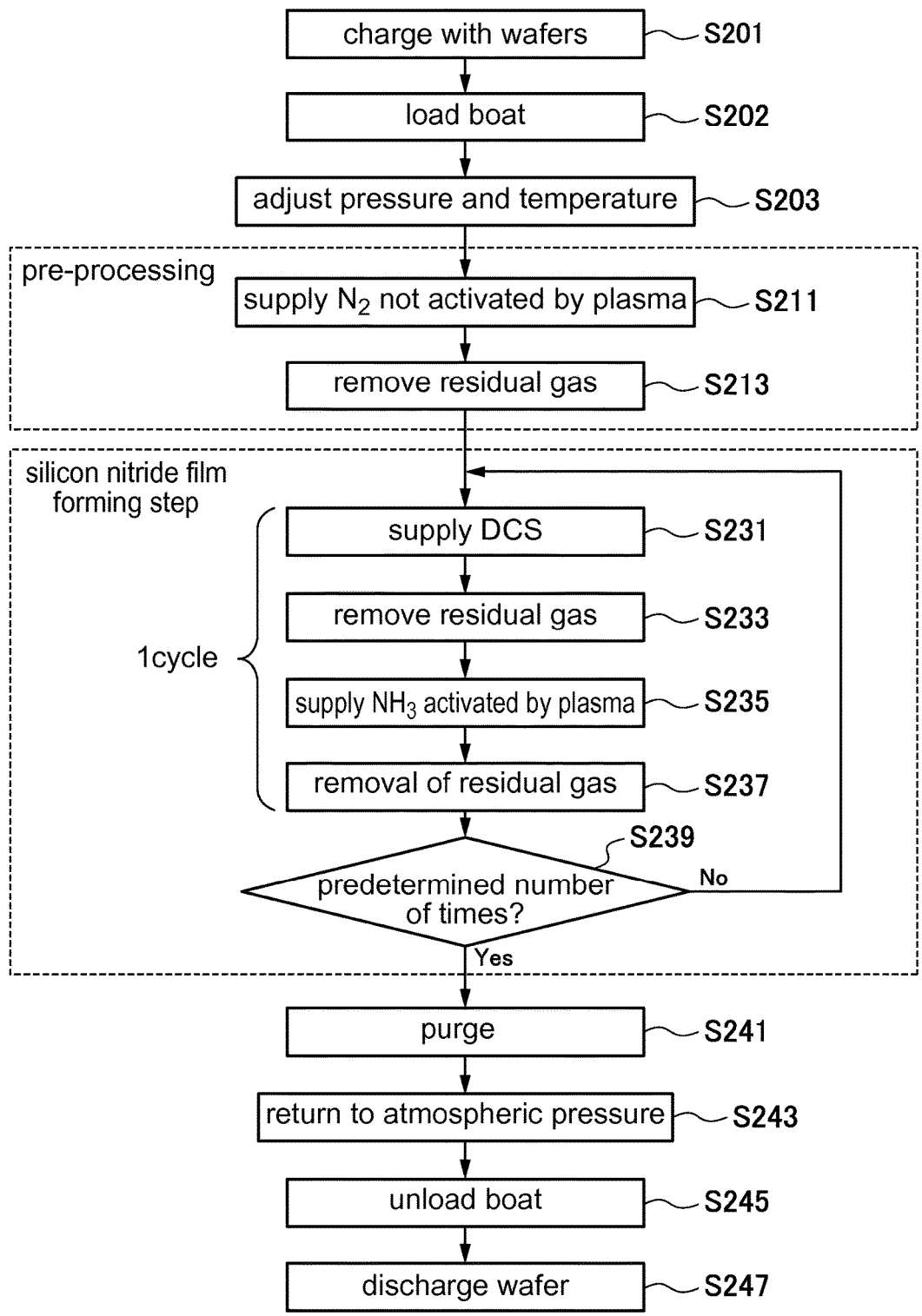
FIG. 5 is a flowchart illustrating a silicon nitride film forming process according to a first exemplary embodiment of the invention.
Figure 6:
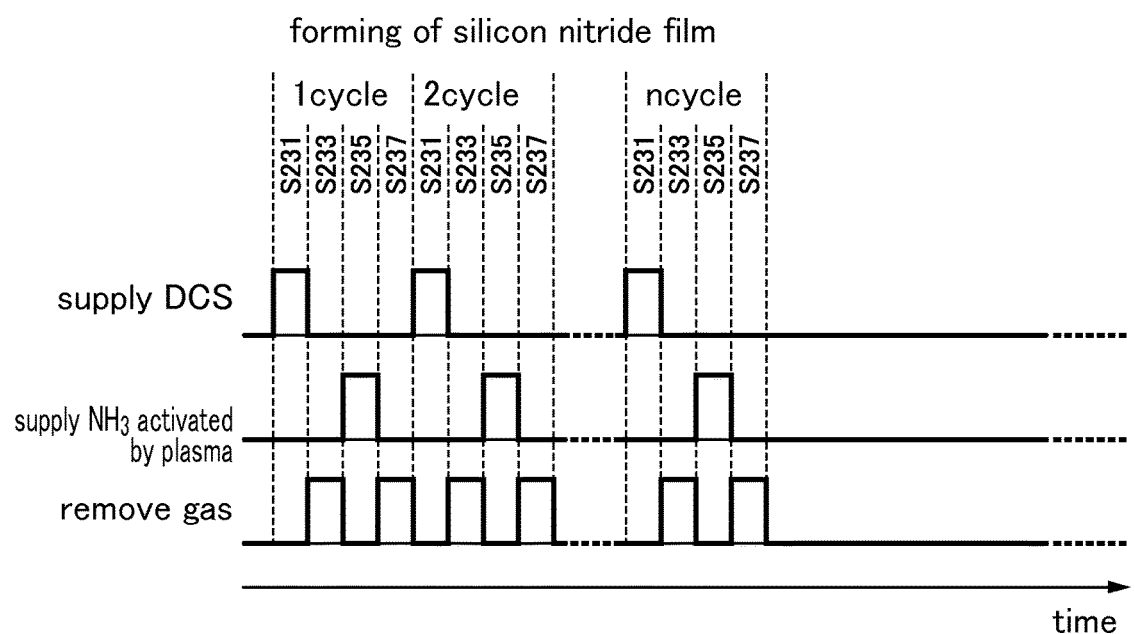
FIG. 6 is a timing diagram illustrating the silicon nitride film forming process according to the first exemplary embodiment of the invention.

Here, an example in which an amorphous silicon nitride film is formed on a GST (GeSbTe) film which is a metal film formed on a wafer 200 using silicon (Si) as a first element, using nitrogen (N) as a second element, using DCS (DiChloroSilane) which is a silicon-containing material as a raw material containing the first element, and using $NH_3$ (ammonia) which is a nitrogen-containing material as a reactant gas containing the second element will be described with reference to FIGS. 5 and 6. FIG. 5 is a flowchart illustrating an amorphous silicon nitride film manufacturing process. FIG. 6 is a timing diagram illustrating the amorphous silicon nitride film manufacturing process.

First, the heating power source 250 supplying power to the heater 207 is controlled to maintain the temperature in the processing chamber 201 at a temperature of 400° C. or lower which is the self-decomposition temperature of the DCS and more preferably at a temperature of 350° C. or lower, for example, at 300° C.

Thereafter, plural sheets (100 sheets) wafers 200 having the GST film formed thereon are charged (wafer charging) in the boat 217 (step S201). The wafers 200 have a diameter of 300 mm.

Thereafter, the vacuum pump 246 is started up. The furnace opening shutter 147 (see FIG. 1) is opened. The boat 217 supporting plural sheets of wafers 200 is elevated by the use of boat elevator 115 and is loaded (boat loading) into the processing chamber 201 (step S202). In this state, the sealing cap 219 seals the lower end of the reaction tube 203 through the use of the O ring 220. Thereafter, the boat 217 is made to rotate by the boat driving mechanism 267 to rotate the wafers 200.

Thereafter, the APC valve 243 is turned on to vacuum-suction the processing chamber 201 so as to reach a desired pressure (degree of vacuum) by the use of the vacuum pump 246. When the temperature of the wafer 200 reaches 300° C. and the temperature is stabilized (step S203), the subsequent steps are sequentially performed in the state in which the temperature in the processing chamber 201 is maintained at 300° C.

At this time, the pressure in the processing chamber 201 is measured by the use of the pressure sensor 245 and the aperture ratio of the APC valve 244 is controlled in a feedback manner on the basis of the measured pressure (pressure adjustment). The processing chamber 201 is heated by the heater 207 so as to reach a desired temperature. At this time, the power supply state from the heating power source 250 to the heater 207 is controlled in a feedback manner on the basis of the temperature information detected by the temperature sensor 263 so that the processing chamber 201 is at a desired temperature (temperature adjustment).

Pre-Process

As a pre-process, $N_2$ not activated by plasma is supplied and residual gas is then removed.

Supply of $N_2$ not Activated by Plasma: Step S211

In step S204, $N_2$ is supplied from the carrier gas supply pipes 501, 502, and 503. The valve 313 is turned off and the valve 513 is turned on, by which $N_2$ is supplied from the carrier gas supply pipe 510. The flow rate of $N_2$ is adjusted by the use of the mass flow controller 512. The valve 323 is turned off and the valve 523 is turned on, by which $N_2$ is supplied from the carrier gas supply pipe 520. The flow rate of $N_2$ is adjusted by the use of the mass flow controller 522. The valve 333 is turned off and the valve 533 is turned on, by which $N_2$ is supplied from the carrier gas supply pipe 530. The flow rate of $N_2$ is adjusted by the use of the mass flow controller 532. Since the RF power is not applied between the rod-like electrode 471 and the rod-like electrode 472 and between the rod-like electrode 481 and the rod-like electrode 482 from the RF power source 270, $N_2$ is supplied in the state in which it is not activated by plasma.

Removal of Residual Gas: Step S213

In step S213, residual $N_2$ is removed from the processing chamber 201. The valve 513 of the carrier gas supply pipe 510 is turned off, the valve 523 of the carrier gas supply pipe 520 is turned off, and the valve 533 of the carrier gas supply pipe 530 is turned off, by which the supply of $N_2$ to the processing chamber 201 is stopped. At this time, the APC valve 243 of the exhaust pipe 231 is fully opened and the processing chamber 201 is exhausted by the use of the vacuum pump 246 up to 20 Pa or less, by which the residual $N_2$ remaining in the processing chamber 201 is removed from the processing chamber 201.

Formation of Amorphous Silicon Nitride Film

A silicon nitride film forming step of forming an amorphous silicon nitride film is performed by supplying DCS gas and $NH_3$ gas to the processing chamber 201. In the silicon nitride film forming step, the following four steps (S231 to S237) are repeatedly performed. In this embodiment, the silicon nitride film is formed using the ALD method.

Supply of DCS: Step S231

In step S231, DCS is supplied to the processing chamber 201 via the gas supply pipe 310 and the nozzle 410 of the gas supply system 301.

In the state in which the valve 313 is turned off and the valve 314 is turned on, the DCS is adjusted in flow rate by the mass flow controller 312, is supplied to the gas reservoir 315, and is gathered in the gas reservoir 315. When a predetermined volume is gathered in the gas reservoir 315, the valve 314 is turned off to trap the DCS in the gas reservoir 315. The DCS is gathered in the gas reservoir 315 so that the pressure is ten times or more the pressure of the processing chamber 201, for example, 13000 Pa or more. The apparatus is configured so that the conductance between the gas reservoir 315 and the processing chamber 201 is $1.5 \times 10^{-3}$ m³/s or more. In consideration of the ratio of the volume of the processing chamber 201 and the volume of the gas reservoir 315, when the volume of the processing chamber 201 is 100 L, the volume of the gas reservoir 315 is preferably in the range of 100 to 300 cc and the volume of the gas reservoir 315 is preferably 1/1000 to 3/1000 times the volume of the processing chamber 201 regarding the volume ratio. In this embodiment, the volume of the gas reservoir 315 is 180 cc. The step of gathering the DCS in the gas reservoir 315 can be first performed in the course of performing the residual gas removing step (step S213) and can be then performed in the course of performing an $NH_3$ supply step (step S235) in the second cycle or later.

When the residual gas removing step (step S213) is ended, the APC valve 243 is turned off to stop the exhausting of the processing chamber 201. Thereafter, the valve 313 downstream from the gas reservoir 315 is turned on. Accordingly, the DCS gathered in the gas reservoir 315 is supplied to the processing chamber 201 at a time. At this time, since the APC valve 243 of the exhaust pipe 231 is turned off, the pressure of the processing chamber 201 rapidly rises up to about 400 to 500 Pa. The time for supplying the DCS is set to 2 to 4 seconds and the time for exposing the wafers to the rising pressure atmosphere is set to 2 to 4 seconds, so that the total time is set to 6 seconds. The heating power source 250 supplying power to the heater 207 is controlled to maintain the inside of the processing chamber 201 at 300° C. When the supply of DCS to the processing chamber 201 is ended, the valve 313 is turned off and the valve 314 is turned on, by which the supply of DCS to the gas reservoir 315 is started.

At this time, the gas flowing in the processing chamber 201 is only DCS and $NH_3$ is not present. Accordingly, the DCS does not cause a gas-phase reaction and performs a surface reaction (chemical adsorption) with the surface of the GST film on the wafer 200 to form a raw material (DCS) adsorbed layer (hereinafter, referred to as an Si-containing layer). The chemical adsorption layer of DCS includes a discontinuous chemical adsorption layer as well as a continuous adsorption layer of DCS molecules.

At the same time, when the valve 523 is turned off to cause $N_2$ (inert gas) to flow from the carrier gas supply pipe 520 connected to the middle of the gas supply tube 320, it is possible to prevent the DCS to flow around to the $NH_3$-side nozzle 420, the buffer chamber 423, or the gas supply pipe 320. Similarly, at the same time, when the valve 533 is turned off to cause $N_2$ (inert gas) to flow from the carrier gas supply pipe 530 connected to the middle of the gas supply tube 330, it is possible to prevent the DCS to flow around to the $NH_3$-side nozzle 430, the buffer chamber 433, or the gas supply pipe 330. Since it is intended to prevent the DCS from flowing around, the flow rate of $N_2$ (inert gas) controlled by the mass flow controllers 522 and 532 may be small.

In an ALD apparatus, gas is adsorbed to the surface of an underlying film. The amount of gas adsorbed is proportional to the pressure of the gas and the exposure time to the gas. Therefore, to adsorb a desired amount of gas for a short time, it is necessary to raise the pressure of gas for a short time. From this point of view, in this embodiment, since the APC valve 243 is turned off and the DCS gathered in the gas reservoir 315 is supplied at a time, it is possible to rapidly raise the pressure of the DCS in the processing chamber 201, thereby instantaneously adsorbing a desired amount of gas.

Removal of Residual Gas: Step S233

In step S233, the residual gas such as residual DCS is removed from the processing chamber 201. The valve 313 of the gas supply pipe 310 is turned off to stop the supply of DCS to the processing chamber 201. At this time, the APC valve 243 of the exhaust pipe 231 is fully turned on and the processing chamber 201 is exhausted up to 20 Pa or lower by the use of the vacuum pump 246 to remove the residual gas such as residual DCS remaining in the processing chamber 201 from the processing chamber 201. At this time, when inert gas such as $N_2$ is supplied to the processing chamber 201 from the gas supply pipes 320 and 330, the effect of removing the residual gas such as residual DCS is improved. The residual gas removing step (step S233) is performed for about 9 seconds.

Supply of NH$_3$ Activated by Plasma: Step S235

In step S235, the NH$_3$ gas is supplied to the buffer chamber 423 from the gas supply pipe 320 of the gas supply system 302 via the gas supply holes 421 of the nozzle 420 and the NH$_3$ gas is supplied to the buffer chamber 433 from the gas supply pipe 330 of the gas supply system 303 via the gas supply holes 431 of the nozzle 430. At this time, by applying RF power across the rod-like electrode 471 and the rod-like electrode 472 from the RF power source 270 via the matching unit 271, the NH$_3$ gas supplied to the buffer chamber 423 is excited by plasma, is supplied as active species to the processing chamber 201 via the gas supply holes 425, and is exhausted via the gas exhaust pipe 231. By applying RF power across the rod-like electrode 481 and the rod-like electrode 482 from the RF power source 270 via the matching unit 271, the NH$_3$ gas supplied to the buffer chamber 433 is excited by plasma, is supplied as active species to the processing chamber 201 via the gas supply holes 435, and is exhausted via the gas exhaust pipe 231.

NH$_3$ is adjusted in flow rate by the mass flow controller 322 and is supplied to the buffer chamber 423 from the gas supply pipe 320. NH$_3$ is adjusted in flow rate by the mass flow controller 332 and is supplied to the buffer chamber 433 from the gas supply pipe 330. Before NH$_3$ is supplied to the buffer chamber 423, the valve 323 is turned off and the valve 622 is turned on, by which NH$_3$ is made to flow to the vent line 620 via the valve 622. Before NH$_3$ is supplied to the buffer chamber 433, the valve 333 is turned off and the valve 632 is turned on, by which NH$_3$ is made to flow to the vent line 630 via the valve 632. When supplying NH$_3$ to the buffer chamber 423, the valve 622 is turned off and the valve 323 is turned on, by which NH$_3$ is supplied to the gas supply pipe 320 downstream from the valve 323. At the same time, the valve 523 is turned on, by which carrier gas (N$_2$) is supplied from the carrier gas supply pipe 520. The flow rate of the carrier gas (N$_2$) is adjusted by the mass flow controller 522. NH$_3$ is merged and mixed with the carrier gas (N$_2$) downstream from the valve 323 and the mixed gas is supplied to the buffer chamber 423 via the nozzle 420. When supplying NH$_3$ to the buffer chamber 433, the valve 632 is turned off and the valve 333 is turned on, by which NH$_3$ is supplied to the gas supply pipe 330 downstream from the valve 333. At the same time, the valve 533 is turned on, by which carrier gas (N$_2$) is supplied from the carrier gas supply pipe 530. The flow rate of the carrier gas (N$_2$) is adjusted by the mass flow controller 532. NH$_3$ is merged and mixed with the carrier gas (N$_2$) downstream from the valve 333 and the mixed gas is supplied to the buffer chamber 433 via the nozzle 430.

When the NH$_3$ gas is excited by plasma and is made to flow as active species, the APC valve 243 is appropriately adjusted to set the pressure in the processing chamber 201 to, for example, 40 to 100 Pa. The supply flow rate of the NH$_3$ gas controlled by the mass flow controller 322 is set to, for example, 3000 sccm. The flow rate of the NH$_3$ gas controlled by the mass flow controller 332 is set to, for example, 3000 sccm. The time for exposing the wafers 200 to the active species obtained by exciting the NH$_3$ gas by plasma, that is, the gas supply time, is set to, for example, 23 seconds. The RF power applied across the rod-like electrode 471 and the rod-like electrode 472 from the RF power source 270 is set to, for example, 50 W. The RF power applied across the rod-like electrode 481 and the rod-like electrode 482 from the RF power source 270 is set to, for example, 50 W. The heating power source 250 supplying power to the heater 207 is controlled to maintain the processing chamber 201 at 300° C.

When the NH$_3$ gas is excited by plasma and is made to flow as active species and when the APC valve 243 disposed in the exhaust pipe 231 is turned off to stop the vacuum exhaust, there is provided a problem in that the active species activated by exciting the NH$_3$ by plasma are deactivated before reaching the wafers 200 and thus the reaction with the surface of the wafers 200 is not caused. Accordingly, when the NH$_3$ gas is excited by plasma and is made to flow as active species, the APC valve 243 is turned on to exhaust the reaction tube 203.

At this time, the gas flowing in the processing chamber 201 is the active species (NH$_3$ plasma) obtained by exciting the NH$_3$ gas by plasma and the DCS gas is not made to flow in the processing chamber 201. Accordingly, the NH$_3$ gas does not cause a gas-phase reaction and the NH$_3$ gas changed to active species or activated reacts with a silicon-containing layer as a first layer formed on the GST film on the wafer 200 in step S231. Accordingly, the silicon-containing layer is nitrified and is deformed into a second layer containing silicon (the first element) and nitrogen (the second element), that is, a silicon nitride layer.

When the valve 513 is turned on to cause N$_2$ (inert gas) to flow from the carrier gas supply pipe 510 connected to the middle of the gas supply pipe 310, it is possible to prevent NH$_3$ from going around to the DCS-side nozzle 410 or the gas supply pipe 310. Since it is intended to prevent NH$_3$ from going around, the flow rate of N$_2$ (inert gas) controlled by the mass flow controller 512 may be small.

When NH$_3$ is excited by plasma and is supplied as active species, the valve 314 upstream from the gas reservoir 315 is turned on and the valve 313 downstream is turned off, by which the DCS is gathered in the gas reservoir 315. When a predetermined pressure and a predetermined amount of DCS is gathered in the gas reservoir 315, the valve 314 upstream is also turned off, by which the DCS is trapped in the gas reservoir 315.

Removal of Residual Gas: Step S237

In step S237, the residual gas such as residual NH$_3$ not reacting or remaining after the oxidation is removed from the processing chamber 201. The valve 323 of the gas supply pipe 320 is turned off to stop the supply of NH$_3$ to the processing chamber 201, the valve 622 is turned on to cause NH$_3$ to flow to the vent line 620, the valve 333 of the gas supply pipe 330 is turned off to stop the supply of NH$_3$ to the processing chamber 201, and the valve 632 is turned on to cause NH$_3$ to flow to the vent line 630. At this time, the APC valve 243 of the exhaust pipe 231 is fully turned on and the processing chamber 201 is exhausted up to 20 Pa or lower by the use of the vacuum pump 246 to remove the residual gas such as residual NH$_3$ remaining in the processing chamber 201 from the processing chamber 201. At this time, when inert gas such as N$_2$ is supplied to the processing chamber 201 from the gas supply pipes 320 and 330 which are NH$_3$ supply lines, the effect of removing the residual gas such as residual NH$_3$ is improved. The residual gas removing step (step S237) is performed for about 5 seconds.

In this embodiment, while the DCS is being gathered in the gas reservoir 315, the step of exciting the NH$_3$ gas by plasma and supplying active species (step S235) and the step of removing the residual gas (step S237) which are steps necessary for the ALD method are performed. Accordingly, any particular step of gathering the DCS is not necessary.

By setting steps S231 to S237 as one cycle and performing at least one cycle (step S239), a silicon nitride film with a predetermined thickness is formed on the GST film on the wafer 200 by the use of the ALD method. In this embodiment, 500 cycles are performed to form a silicon nitride film of 350 Å.

When the film forming process of forming a silicon nitride film with a predetermined thickness is performed, the processing chamber 201 is purged with inert gas by exhausting the processing chamber 201 while supplying inert gas such as $N_2$ to the processing chamber 201 (gas purging step: step S241). The gas purging step is preferably carried out by repeatedly performing both the supply of inert gas such as $N_2$ to the processing chamber 201 which is performed by turning off the APC valve 243 and turning on the valves 513, 523, and 533 after removing the residual gas and the vacuum suction of the processing chamber 201 which is performed by turning off the valves 513, 523, and 533 to stop the supply of the inert gas such as $N_2$ to the processing chamber and turning on the APC valve 243.

Thereafter, the boat rotating mechanism 267 is stopped to stop the rotation of the boat 217. Thereafter, the valves 513, 523, and 533 are turned on to replace the atmosphere of the processing chamber 201 with the inert gas such as $N_2$ (replacement with inert gas) and to return the pressure in the processing chamber 201 to the normal pressure (return to atmospheric pressure: step S243). Thereafter, the sealing cap 219 is elevated down by the boat elevator 115 to open the lower end of the reaction tube 203 and the boat 217 is unloaded to the outside of the processing chamber 201 from the lower end of the reaction tube 203 in the state in which the processed wafers 200 are held in the boat 217 (unloading of boat: step S245). Thereafter, the lower end of the reaction tube 203 is closed with the furnace opening shutter 147. Thereafter, the vacuum pump 246 is stopped. Thereafter, the processed wafers 200 are taken out of the boat 217 (discharging of wafer: step S247). Accordingly, a film forming process (batch process) is ended.

Figure 7:
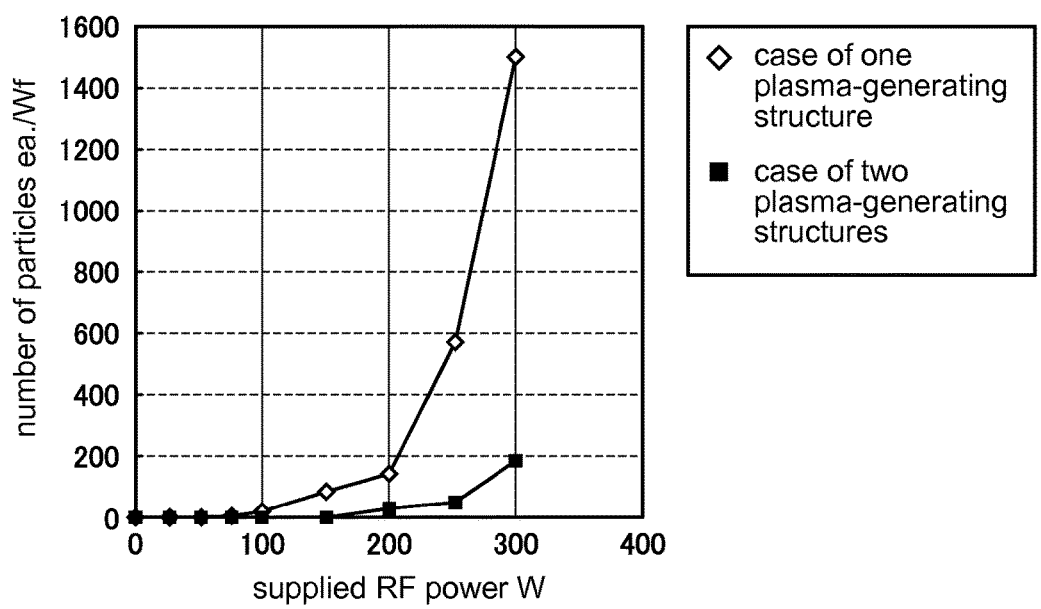
FIG. 7 is a diagram illustrating the relationship between RF power supplied and the number of particles generated.
Figure 8:
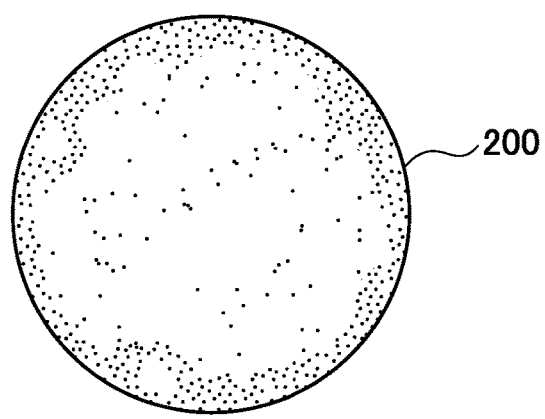
FIG. 8 is a diagram illustrating a typical in-plane particle distribution of a wafer 200.

In this embodiment, the plasma generating structure 429 and the plasma generating structure 439 are provided and the RF power is distributed and supplied to two plasma generating structures by 50 W. On the contrary, in the case in which one plasma generating structure is provided, for example, in the case in which the plasma generating structure 439 is not provided and only the plasma generating structure 429 is provided, power of 100 W is supplied to the plasma generating structure 429. FIG. 7 is a diagram illustrating the relationship between the input RF power (W) and the number of particles generated. In the case in which only one plasma generating structure is provided, the power supplied to the plasma generating structure is the same as the input RF power (W). However, in the case in which two plasma generating structures are provided, the power supplied to the respective plasma generating structures is half the input RF power (W). Referring to FIG. 7, in the case in which two plasma generating structures are provided, it can be seen that the number of particles generated is greatly reduced, compared with the case in which only one plasma generating structure is provided. Accordingly, by providing two plasma generating structures, it is possible to greatly reduce the number of particles generated, thereby suppressing or preventing the silicon nitride film formed on the GST film from being peeled off. FIG. 8 shows a typical in-plane particle distribution in a wafer 200 in the case in which only one plasma generating structure is provided, for example, in the case in which the plasma generating structure 439 is not provided but only the plasma generating structure 429 is provided. In consideration of the fact that the particles lean to the peripheral portion of the wafer and the wafer 200 is processed while rotating, it can be seen that the particle distribution results from the plasma generating structure 429 disposed in the peripheral portion of the wafer 200. On the contrary, when the plasma generating structure 429 and the plasma generating structure 439 are provided and the RF power is distributed and supplied to two plasma generating structures, the particles are not generated well.

When the processing temperature is low, there is a need for raising the input RF power from the viewpoint of maintaining the quality of a formed film. On the other hand, when the input RF power is raised, there is a problem in that the number of particles generated increases, as shown in FIG. 7. As in this embodiment, by providing plural plasma generating structure and distributing and supplying the RF power to the plural plasma generating structures, it is possible to lower the input power density per unit volume of the RF power and thus to reduce the number of particles, thereby improving the adhesion.

Second Embodiment

Figure 9:
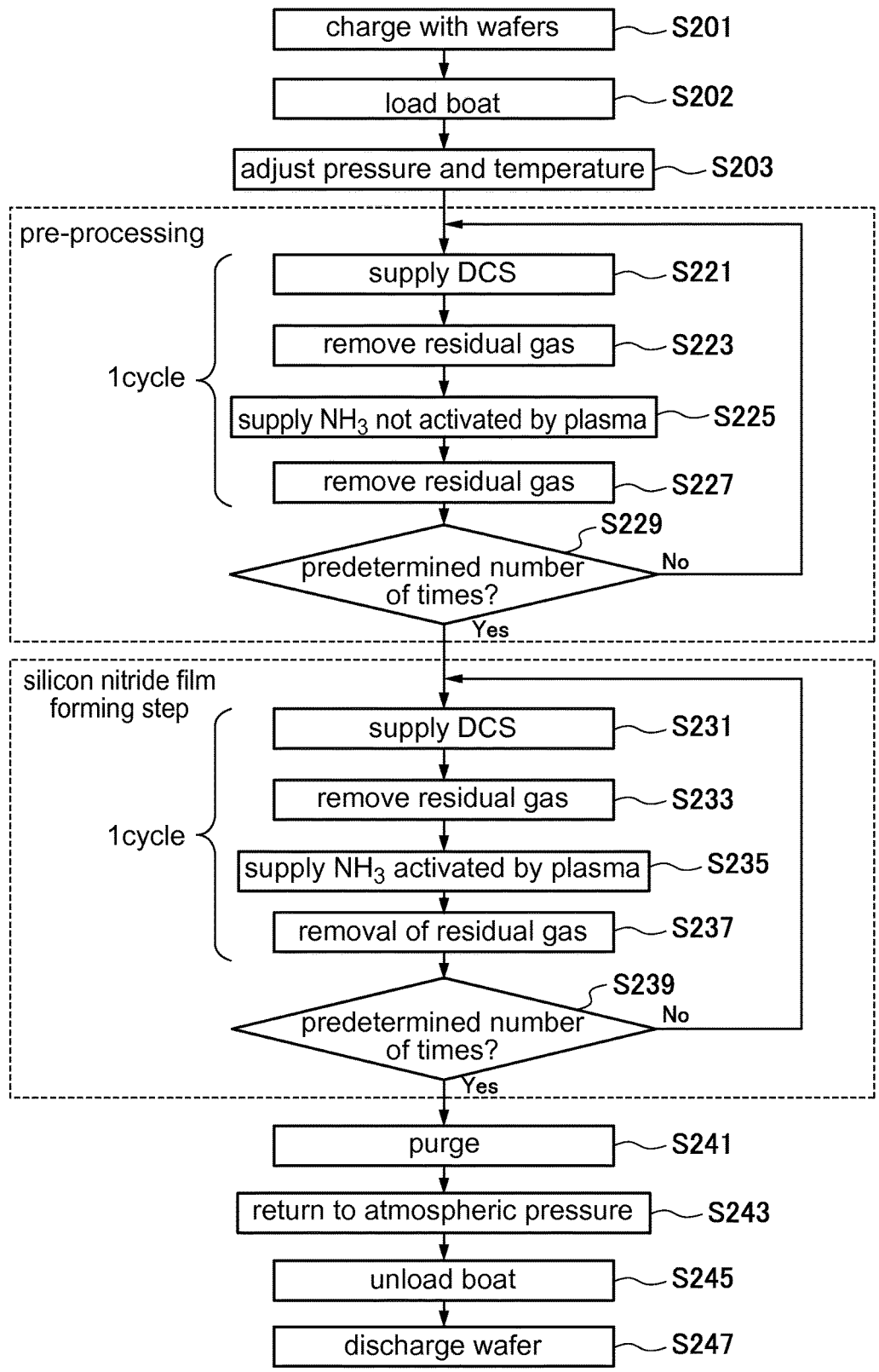
FIG. 9 is a flowchart illustrating a silicon nitride film forming process according to a second exemplary embodiment of the invention.
Figure 10:
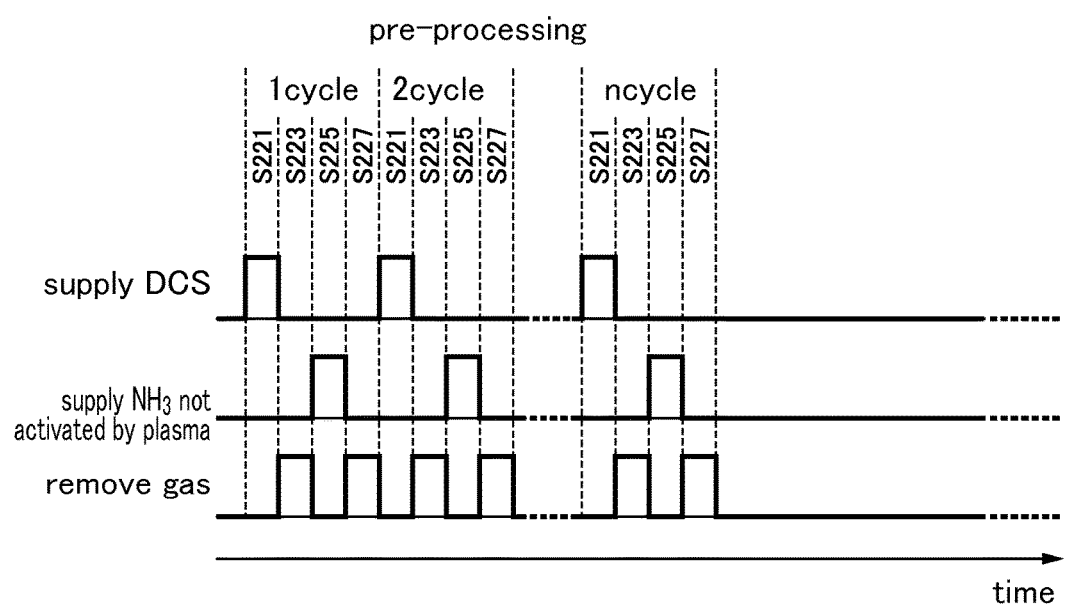
FIG. 10 is a timing diagram illustrating a pre-processing in the silicon nitride film forming process according to the second exemplary embodiment of the invention.

A second embodiment of the invention will be described below with reference to FIGS. 9 and 10.

In the first embodiment, as the pre-process, $N_2$ not activated by plasma is supplied (step S211) and then the residual gas is removed (step S213). This embodiment is different from the first embodiment in that at least one cycle of the supply of DCS (step S221), the removal of residual gas (step S223), the supply of $NH_3$ not excited by plasma (step S225), and the removal of residual gas (step S227) is performed as a pre-process, and is the same as the first embodiment in the other points. The substrate processing apparatus 101 to be used is the same and the silicon nitride film forming step is also the same.

The supply of DCS (step S221) is the same as the supply of DCS (step S231) of the first embodiment, the removal of residual gas (step S223) is the same as the removal of residual gas (step S233) of the first embodiment, and the removal of residual gas (step S227) is the same as the removal of residual gas (step S237) of the first embodiment. In the supply of $NH_3$ excited by plasma (step S235) in the first embodiment, the RF power is applied across the rod-like electrode 471 and the rod-like electrode 472 from the RF power source 270 and the RF power is applied across the rod-like electrode 481 and the rod-like electrode 482 from the RF power source 270. This embodiment is different from the supply of $NH_3$ excited by plasma (step S235) in the first embodiment, in that the RF power is not applied across the rod-like electrode 471 and the rod-like electrode 472 and across the rod-like electrode 481 and the rod-like electrode 482 from the RF power source 270 in the supply of $NH_3$ not excited by plasma (step S225), but is the same in the other points.

Third Embodiment

A third embodiment of the invention will be described below with reference to FIG. 11.

In the first embodiment, as the pre-process, $N_2$ not activated by plasma is supplied (step S211) and then the residual gas is removed (step S213). This embodiment is different from the first embodiment, in that DCS not activated by plasma is supplied (step S215) and then the residual gas is removed (step S217), but is the same as the first embodiment in the other points. The substrate processing apparatus 101 to be used is the same and the silicon nitride film forming step is also the same.

Figure 12:
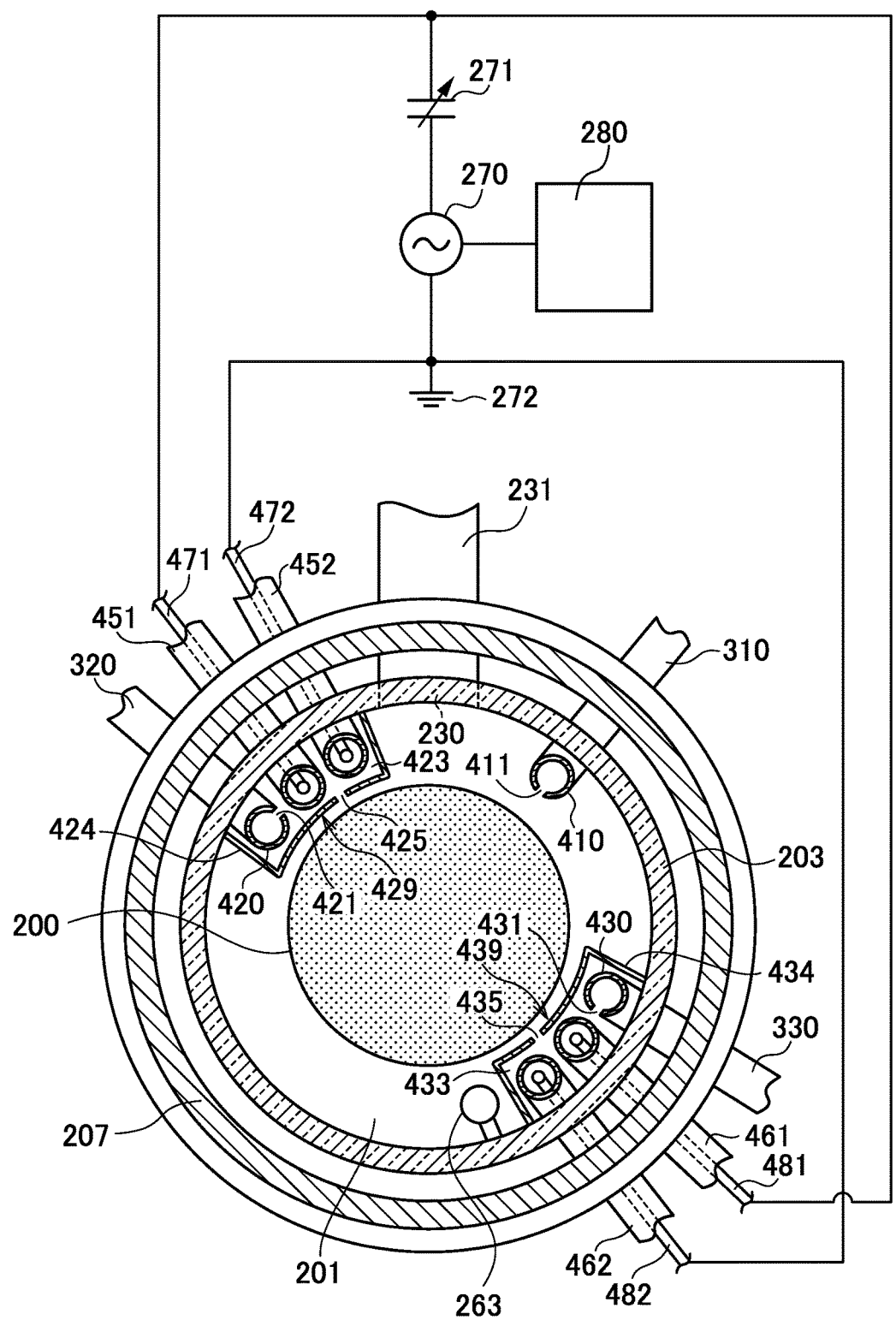
FIG. 12 is a schematic transverse sectional view illustrating a modification of the first to third exemplary embodiments of the invention.

A modification of the first to third embodiments will be described below with reference to FIG. 12.

In the first to third embodiments, the first plasma generating structure 429 constituted by the rod-like electrode 471, the rod-like electrode 472, the electrode protecting pipe 451, the electrode protecting pipe 452, the buffer chamber 423, and the gas supply holes 425 and the second plasma generating structure 439 constituted by the rod-like electrode 481, the rod-like electrode 482, the electrode protecting pipe 461, the electrode protecting pipe 462, the buffer chamber 433, and the gas supply holes 435 are symmetric with the line passing through the center of the wafers 200 (the center of the reaction tube 203), the exhaust hole 230 is disposed in the line passing through the centers of the wafers 200 (the center of the reaction tube 203), the gas supply holes 411 of the nozzle 410 are disposed in the line passing through the centers of the wafers 200 (the center of the reaction tube 203), and the first plasma generating structure 429 and the second plasma generating structure 439 are disposed in the vicinity of the exhaust hole 230. This modification is different from the first embodiment, in that the first plasma generating structure 429 and the second plasma generating structure 439 are disposed at the positions (different by 180°) opposed to each other with the wafers 200 interposed therebetween, are disposed symmetric about the center of the wafer 200 and the center of the reaction tube 203, and the nozzle 410 is disposed between the exhaust hole 230 and the second plasma generating structure 439, but is the same as the first embodiment in the other points.

In this modification, the first plasma source constituted by the rod-like electrode 471, the rod-like electrode 472, the electrode protecting pipe 451, the electrode protective pipe 452, the matching unit 271, and the RF power source 270 and the second plasma source constituted by the rod-like electrode 481, the rod-like electrode 482, the electrode protecting pipe 461, the electrode protective pipe 462, the matching unit 271, and the RF power source 270 are provided. Therefore, compared with the case in which only one plasma source is provided, it is possible to lower the input power density per unit volume of the RF power by distributing and supplying the RF power to plural plasma sources, and thus to reduce the number of particles generated, thereby improving the adhesion. Further, since the RF power supplied to the plasma sources can be reduced, the damage to the wafers 200 or the films formed on the wafers 200 can be reduced. Even when the RF power supplied to the plasma sources is reduced, a sufficient amount of plasma to process a substrate can be generated by the two plasma sources, thereby lowering the processing temperature of the wafers 200.

Since the first plasma generating structure 429 constituted by the rod-like electrode 471, the rod-like electrode 472, the electrode protecting pipe 451, the electrode protective pipe 452, the buffer chamber 423, and the gas supply holes 425 and the second plasma generating structure 439 constituted by the rod-like electrode 481, the rod-like electrode 482, the electrode protecting pipe 461, the electrode protective pipe 462, the buffer chamber 433, and the gas supply holes 435 are disposed at the positions (different by 180°) opposed to each other with the wafers 200 interposed therebetween and are disposed symmetric about the center of the wafer 200 and the center of the reaction tube 203, it is easy to supply plasma uniformly to the entire surfaces of the wafers 200 from both plasma generating structures and it is thus possible to form a uniform film on the wafers 200.

Another modification of the first to third embodiments will be described below with reference to FIG. 13.

In the first embodiment, the first plasma generating structure 429 constituted by the rod-like electrode 471, the rod-like electrode 472, the electrode protecting pipe 451, the electrode protecting pipe 452, the buffer chamber 423, and the gas supply holes 425 and the second plasma generating structure 439 constituted by the rod-like electrode 481, the rod-like electrode 482, the electrode protecting pipe 461, the electrode protecting pipe 462, the buffer chamber 433, and the gas supply holes 435 are symmetric with respect to the line passing through the center of the wafers 200 (the center of the reaction tube 203) and the gas supply holes 411 of the nozzle 410 are disposed in the line passing through the centers of the wafers 200 (the center of the reaction tube 203). This modification is different from the first to third embodiments, in that the first plasma generating structure 429 and the second plasma generating structure 439 are disposed symmetric with respect to the line passing through the centers of the wafers 200 (the center of the reaction tube 203) but the gas supply holes 411 of the nozzle 410 are not disposed in the line passing through the centers of the wafers 200 (the center of the reaction tube 203), but is the same as the first to third embodiments in the other points.

In this modification, the first plasma source constituted by the rod-like electrode 471, the rod-like electrode 472, the electrode protecting pipe 451, the electrode protective pipe 452, the matching unit 271, and the RF power source 270 and the second plasma source constituted by the rod-like electrode 481, the rod-like electrode 482, the electrode protecting pipe 461, the electrode protective pipe 462, the matching unit 271, and the RF power source 270 are provided. Therefore, compared with the case in which only one plasma source is provided, it is possible to lower the input power density per unit volume of the RF power by distributing and supplying the RF power to plural plasma sources, and thus to reduce the number of particles generated, thereby improving the adhesion. Further, since the RF power supplied to the plasma sources can be reduced, the damage to the wafers 200 or the films formed on the wafers 200 can be reduced. Even when the RF power supplied to the plasma sources is reduced, a sufficient amount of plasma to process a substrate can be generated by the two plasma sources, thereby lowering the processing temperature of the wafers 200.

Since the first plasma generating structure constituted by the rod-like electrode 471, the rod-like electrode 472, the electrode protecting pipe 451, the electrode protective pipe 452, the buffer chamber 423, and the gas supply holes 425 and the second plasma generating structure constituted by the rod-like electrode 481, the rod-like electrode 482, the electrode protecting pipe 461, the electrode protective pipe 462, the buffer chamber 433, and the gas supply holes 435 are disposed symmetric with respect to a line passing through the center of the wafers 200 (the center of the reaction tube 203), it is easy to supply plasma uniformly to the entire surfaces of the wafers 200 from both plasma generating structures and it is thus possible to form a uniform film on the wafers 200.

Figure 14:
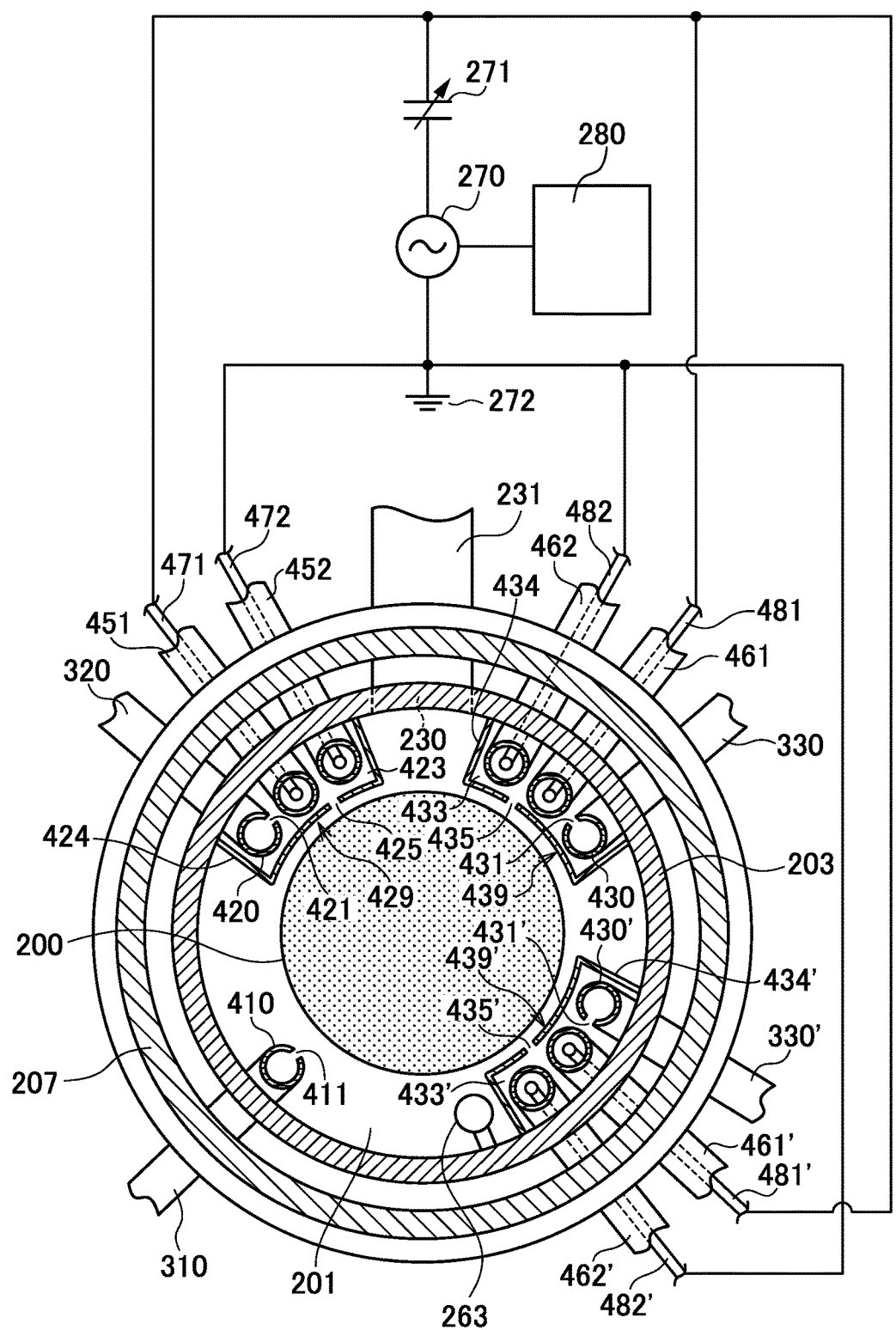
FIG. 14 is a schematic transverse sectional view illustrating still another modification of the first to third exemplary embodiments of the invention.

Still another modification of the embodiment will be described below with reference to FIG. 14.

Figure 13:
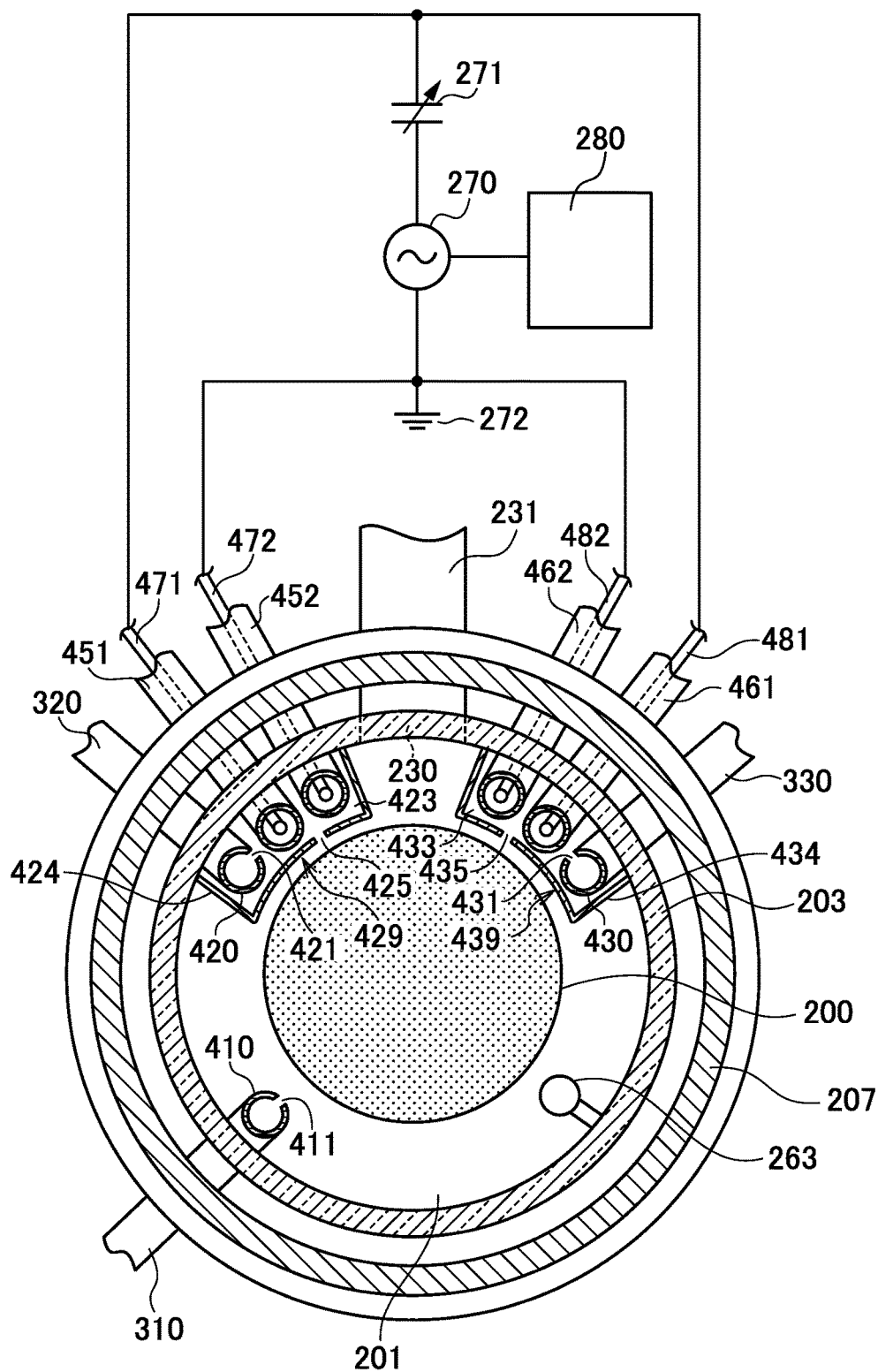
FIG. 13 is a schematic transverse sectional view illustrating another modification of the first to third exemplary embodiments of the invention.

In this modification, a third plasma generating structure 439' constituted by a rod-like electrode 481', a rod-like electrode 482', an electrode protecting pipe 461', an electrode protecting pipe 462', a buffer chamber 433', and a gas supply holes 435' and having the same structure as the second plasma generating structure 439 constituted by the rod-like electrode 481, the rod-like electrode 482, the electrode protecting pipe 461, the electrode protecting pipe 462, the buffer chamber 433, and the gas supply holes 435 is added to the modification shown in FIG. 13, and the third plasma generating structure 439' and the first plasma generating structure 429 constituted by the rod-like electrode 471, the rod-like electrode 472, the electrode protecting pipe 451, the electrode protecting pipe 452, the buffer chamber 423, and the gas supply holes 425 are disposed to be symmetric with respect to the line passing through the center of the wafers 200 and the center of the reaction tube 203.

In this modification, the third plasma source constituted by the rod-like electrode 481', the rod-like electrode 482', the electrode protecting pipe 461', the electrode protective pipe 462', the matching unit 271, and the RF power source 270 is added to the first plasma source constituted by the rod-like electrode 471, the rod-like electrode 472, the electrode protecting pipe 451, the electrode protective pipe 452, the matching unit 271, and the RF power source 270 and the second plasma source constituted by the rod-like electrode 481, the rod-like electrode 482, the electrode protecting pipe 461, the electrode protective pipe 462, the matching unit 271, and the RF power source 270. Therefore, compared with the case in which two plasma sources are provided, it is possible to still lower the input power density per unit volume of the RF power by distributing and supplying the RF power to the three plasma sources, and thus to further reduce the number of particles generated, thereby further improving the adhesion. Further, since the RF power supplied to the plasma sources can be further reduced, the damage to the wafers 200 or the films formed on the wafers 200 can be further reduced. Even when the RF power supplied to the plasma sources is reduced, a sufficient amount of plasma to process a substrate can be generated by the three plasma sources, thereby lowering the processing temperature of the wafers 200.

Fourth Embodiment

Figure 15:
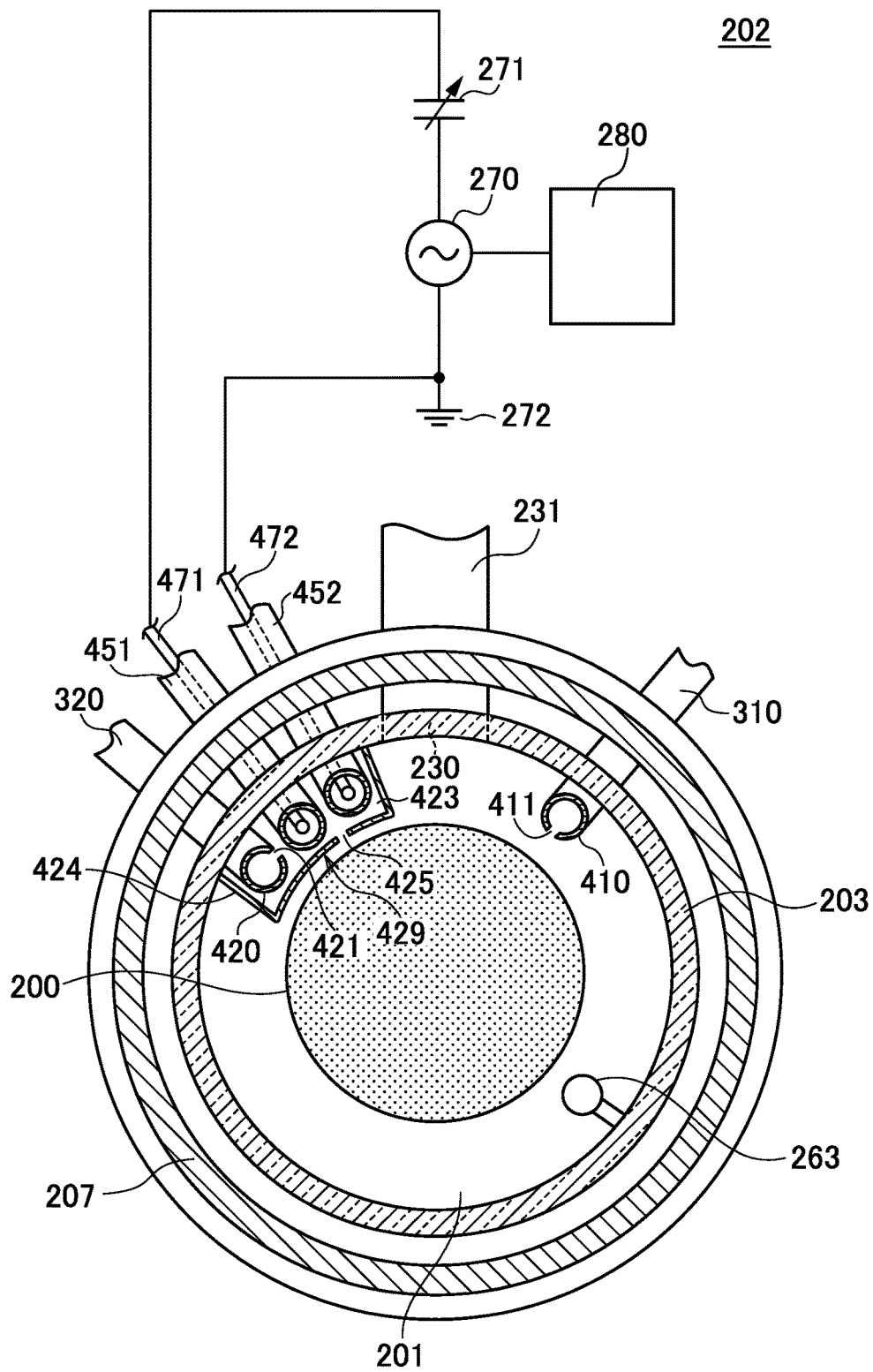
FIG. 15 is a schematic transverse sectional view for explaining fourth and fifth exemplary embodiments of the invention.

Referring to FIG. 15, in the second embodiment, the plasma generating structure 429 constituted by the rod-like electrode 471, the rod-like electrode 472, the electrode protecting pipe 451, the electrode protecting pipe 452, the buffer chamber 423, and the gas supply holes 425 and the plasma generating structure 439 constituted by the rod-like electrode 481, the rod-like electrode 482, the electrode protecting pipe 461, the electrode protecting pipe 462, the buffer chamber 433, and the gas supply holes 435 are provided and the gas supply system includes the gas supply system 301 having the gas supply tube 310, the gas supply system 302 having the gas supply tube 320, and the gas supply system 303 having the gas supply tube 330. This embodiment is different from the second embodiment, in that the plasma generating structure 439 is not provided but only the plasma generating structure 429 constituted by the rod-like electrode 471, the rod-like electrode 472, the electrode protecting pipe 451, the electrode protecting pipe 452, the buffer chamber 423, and the gas supply holes 425 is provided, and the gas supply system 303 is not provided but only the gas supply system 301 having the gas supply tube 310 and the gas supply system 302 having the gas supply tube 320 are provided, but is the same in the other points.

In the second embodiment and this embodiment (the fourth embodiment), by performing at least one cycle of the supply of DCS (step S221), the removal of residual gas (step S223), the supply of NH$_3$ not excited by plasma (step S225), and the removal of residual gas (step S227) as the pre-process, it is possible to reduce the number of particles generated, thereby improving the adhesion. As in the second embodiment, the configuration having two plasma generating structures has a great effect of reducing the number of particles generated to improve the adhesion. However, in this embodiment including one plasma generating structure, it is also possible to reduce the number of particles generated, thereby improving the adhesion.

The principle of the pre-process using DCS and NH$_3$ not activated by plasma is considered as the following. When DCS is supplied to a substrate in which a metal film such as a GST film is exposed, a reaction intermediate of metal and Si with a small thickness is formed on the substrate. At this time, it is considered that Cl contained in the DCS is also adsorbed to the substrate. When NH$_3$ is supplied thereto, NH$_3$ reacts with Si adsorbed to the substrate to form silicide and ammonium chloride, by which Cl is removed from the film. At a low temperature, NH$_3$ does not form a silicon nitride film when it is not excited by plasma. Accordingly, by using NH$_3$ not activated by plasma, the above-mentioned effect is achieved.

Fifth Embodiment

Referring to FIG. 15, in the third embodiment, the plasma generating structure 429 constituted by the rod-like electrode 471, the rod-like electrode 472, the electrode protecting pipe 451, the electrode protecting pipe 452, the buffer chamber 423, and the gas supply holes 425 and the plasma generating structure 439 constituted by the rod-like electrode 481, the rod-like electrode 482, the electrode protecting pipe 461, the electrode protecting pipe 462, the buffer chamber 433, and the gas supply holes 435 are provided and the gas supply system includes the gas supply system 301 having the gas supply tube 310, the gas supply system 302 having the gas supply tube 320, and the gas supply system 303 having the gas supply tube 330. This embodiment is different from the third embodiment, in that the plasma generating structure 439 is not provided but only the plasma generating structure 429 constituted by the rod-like electrode 471, the rod-like electrode 472, the electrode protecting pipe 451, the electrode protecting pipe 452, the buffer chamber 423, and the gas supply holes 425 is provided, and the gas supply system 303 is not provided but only the gas supply system 301 having the gas supply tube 310 and the gas supply system 302 having the gas supply tube 320 are provided, but is the same in the other points.

In the third embodiment and this embodiment (the fifth embodiment), by supplying DCS not activated by plasma (step S215) and then removing the residual gas (step S217) as the pre-process, it is possible to reduce the number of particles generated, thereby improving the adhesion. As in the third embodiment, the configuration having two plasma generating structures has a great effect of reducing the number of particles generated to improve the adhesion. However, in this embodiment including one plasma generating structure, it is also possible to reduce the number of particles generated, thereby improving the adhesion.

Sixth Embodiment

Figure 16:
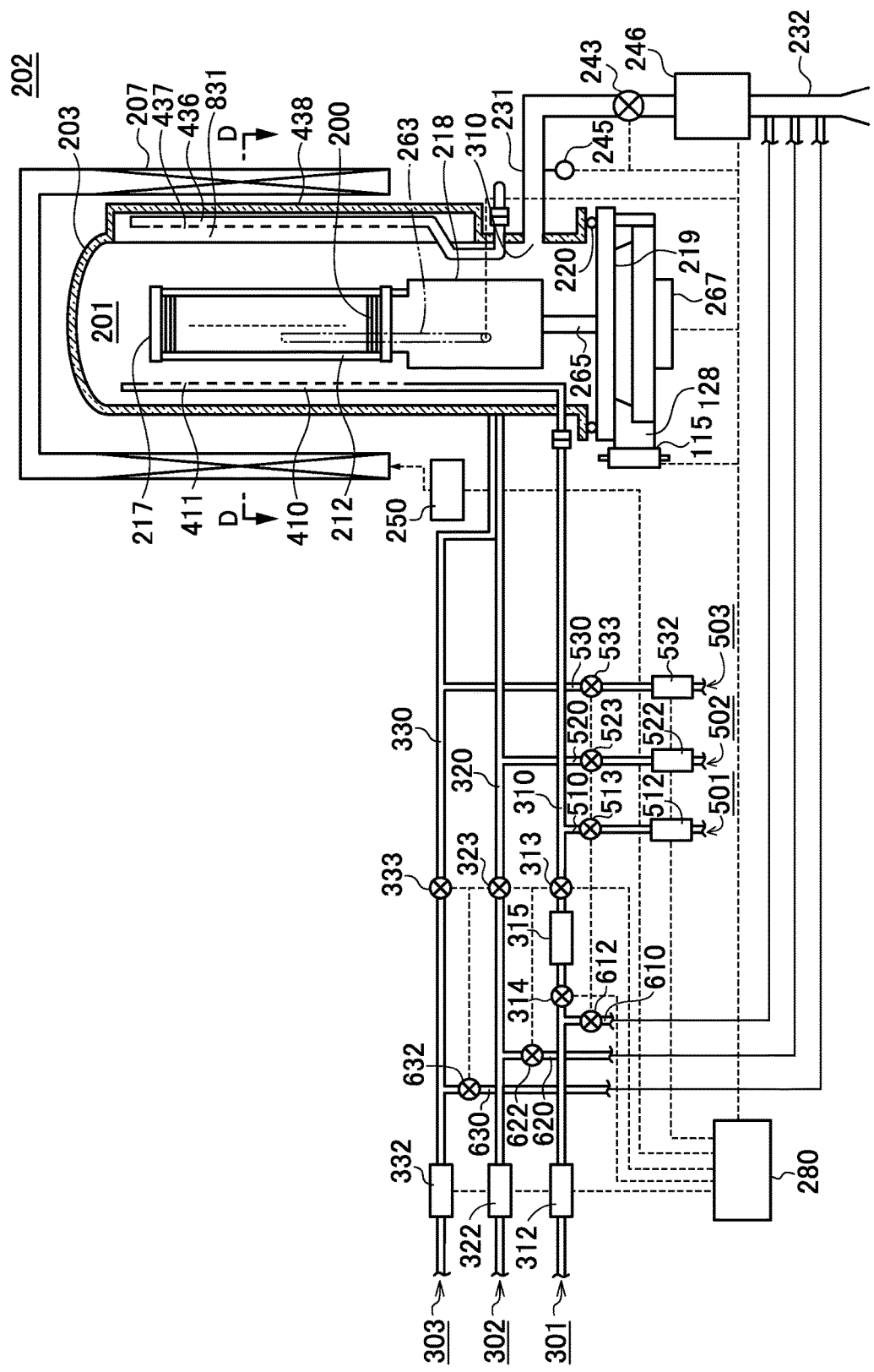
FIG. 16 is a diagram schematically illustrating an example of a processing furnace and members accompanied therewith, which are suitably used in an eighth exemplary embodiment of the invention and is a schematic longitudinal sectional view taken along line E-E of FIG. 17, in which the schematic longitudinal section of the processing furnace is shown.
Figure 17:
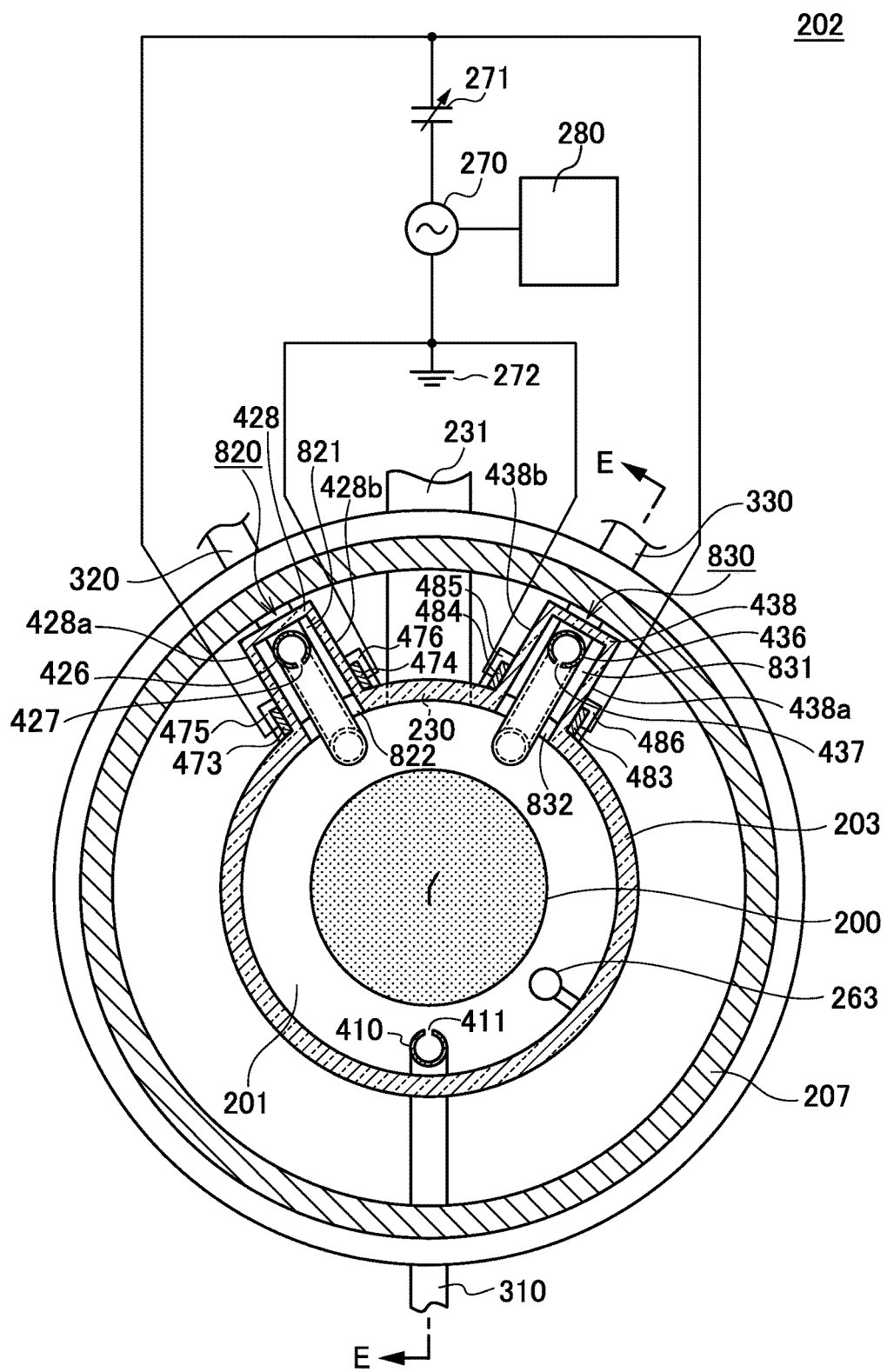
FIG. 17 is a schematic transverse sectional view taken along line D-D in the processing furnace shown in FIG. 16.

A sixth embodiment of the invention will be described below with reference to FIGS. 16 and 17.

In the first to third embodiments, the first plasma generating structure 429 constituted by the rod-like electrode 471, the rod-like electrode 472, the electrode protecting pipe 451, the electrode protecting pipe 452, the buffer chamber 423, and the gas supply holes 425 and the second plasma generating structure 439 constituted by the rod-like electrode 481, the rod-like electrode 482, the electrode protecting pipe 461, the electrode protecting pipe 462, the buffer chamber 433, and the gas supply holes 435 are disposed inside the reaction tube 203. This embodiment is different from the first to third embodiments, in that the plasma generating structures are disposed to protrude to the outside from the reaction tube 203, but is the same in the other points.

A long and thin rectangular opening 822 extending from the lower part of the reaction tube to the upper part is disposed in the side wall of the reaction tube 203 and a plasma generating chamber wall 428 is disposed on the outer wall of the reaction tube 203 to cover the opening 822. The plasma generating chamber wall 428 is formed vertically long and thin with a sectional shape of "⊃". The plasma generating chamber wall 428 is formed of, for example, quartz. A plasma generating chamber 821 is formed in the plasma generating chamber wall 428. The plasma generating chamber 821 communicates with the inside of the reaction tube 203 via the opening 822. The opening 822 extends vertically long and thin from a part lower than the lowest part of the plural wafers 200 stacked and stored in the boat 217 to the upside.

A nozzle 426 is disposed upright at a position (position most apart from the center of the reaction tube 203) inside the plasma generating chamber 821. The lower part of the nozzle 426 is once bent to the inside of the reaction tube 203 and then protrudes to the outside of the reaction tube 203 from the wall of the reaction tube 203 below the plasma generating chamber wall 428, and the end is connected to the gas supply pipe 320.

The nozzle 426 is disposed to rise to the upside in the stacking direction of the wafers 200 along the inner wall of the reaction tube 203 from the lower part to the upper part. The upper end of the nozzle 426 is closed. In the side surface of the nozzle 426, plural gas supply holes 427 supplying gas are disposed in the stacking direction of the wafers 200 from a part lower than the lowest part of the plural wafers 200 stacked and stored in the boat 217 to a part upper than the lowest part. The gas supply holes 427 are opened to face the center of the reaction tube 203. The plural gas supply holes 427 are disposed with the same opening area and at the same pitch.

A pair of long and thin plasma generating electrodes 473 and 474 opposed to each other is disposed in the vertical direction on the outer surfaces of both side walls 428a and 428b of the plasma generating chamber wall 428. Electrode covers 475 and 476 are disposed to cover the plasma generating electrodes 473 and 474, respectively. An inert gas purging mechanism charging or purging inert gas such as nitrogen to suppress the oxygen concentration sufficiently low and to prevent the oxidation of the plasma generating electrodes 473 and 474 is disposed in the electrode covers 475 and 476.

The plasma generating electrode 473 is connected to the RF power source 270 via the matching unit 271 and the plasma generating electrode 474 is connected to the earth 272 which is a reference potential. The plasma generating electrodes 473 and 474, the plasma generating chamber wall 428, the plasma generating chamber 821, the opening 822, the nozzle 426, and the gas supply holes 427 constitute a first plasma generating structure 820. The plasma generating electrode 473 and 474, the matching unit 271, and the RF power source 270 constitute a first plasma source as a plasma generator (plasma generating unit).

According to this configuration, gas is supplied between the plasma generating electrodes 473 and 474 from the gas supply holes 427 of the nozzle 426 disposed inside the plasma generating chamber 821, plasma is generated in the plasma generating area between the plasma generating electrodes 473 and 474, and the gas diffuses and flows to the center of the reaction tube 203 via the opening 822.

A long and thin rectangular opening 832 extending from the lower part of the reaction tube to the upper part is disposed in the side wall of the reaction tube 203 and a plasma generating chamber wall 438 is disposed on the outer wall of the reaction tube 203 to cover the opening 832. The plasma generating chamber wall 438 is formed vertically long and thin with a sectional shape of "⊃". The plasma generating chamber wall 438 is formed of, for example, quartz. A plasma generating chamber 831 is formed in the plasma generating chamber wall 438. The plasma generating chamber 831 communicates with the inside of the reaction tube 203 via the opening 832. The opening 832 extends vertically long and thin from a part lower than the lowest part of the plural wafers 200 stacked and stored in the boat 217 to the upside.

A nozzle 436 is disposed upright at a position (position most apart from the center of the reaction tube 203) inside the plasma generating chamber 821. The lower part of the nozzle 436 is once bent to the inside of the reaction tube 203 and then protrudes to the outside of the reaction tube 203 from the wall of the reaction tube 203 below the plasma generating chamber wall 438, and the end is connected to the gas supply pipe 330.

The nozzle 436 is disposed to rise to the upside in the stacking direction of the wafers 200 along the inner wall of the reaction tube 203 from the lower part to the upper part. The upper end of the nozzle 436 is closed. In the side surface of the nozzle 436, plural gas supply holes 437 supplying gas are disposed in the stacking direction of the wafers 200 from a part lower than the lowest part of the plural wafers 200 stacked and stored in the boat 217 to a part upper than the lowest part. The gas supply holes 437 are opened to face the center of the reaction tube 203. The plural gas supply holes 437 are disposed with the same opening area and at the same pitch.

A pair of long and thin plasma generating electrodes 483 and 484 opposed to each other is disposed in the vertical direction on the outer surfaces of both side walls 438a and 438b of the plasma generating chamber wall 438. Electrode covers 485 and 486 are disposed to cover the plasma generating electrodes 483 and 484, respectively. An inert gas purging mechanism charging or purging inert gas such as nitrogen to suppress the oxygen concentration sufficiently low and to prevent the oxidation of the plasma generating electrodes 483 and 484 is disposed in the electrode covers 485 and 486.

The plasma generating electrode 483 is connected to the RF power source 270 via the matching unit 271 and the plasma generating electrode 484 is connected to the earth 272 which is a reference potential. The plasma generating electrodes 483 and 484, the plasma generating chamber wall 438, the plasma generating chamber 831, the opening 832, the nozzle 436, and the gas supply holes 437 constitute a first plasma generating structure 830. The plasma generating electrode 483 and 484, the matching unit 271, and the RF power source 270 constitute a second plasma source as a plasma generator (plasma generating unit).

According to this configuration, gas is supplied between the plasma generating electrodes 483 and 484 from the gas supply holes 437 of the nozzle 436 disposed inside the plasma generating chamber 831, plasma is generated in the plasma generating area between the plasma generating electrodes 483 and 484, and the gas diffuses and flows to the center of the reaction tube 203 via the opening 832.

Remote plasma is generated by the plasma generating structures 820 and 830 having the above-mentioned configuration. That is, radicals generated in the plasma generating structures 820 and 830 are not deactivated until reaching the entire surfaces of the wafers 200 in the processing chamber 201 and ions generated by the plasma generating structures 820 and 830 do not reach the wafers to such an extent to damage the wafers 200 in the processing chamber.

As in this embodiment, when the plasma generating structures 820 and 830 are disposed to protrude to the outside of the reaction tube 203, the distance between the outer peripheries of the wafers 200 and the inner peripheral surface of the reaction tube 203 can be reduced, compared with the case in which the buffer chambers 423 and 433 are disposed inside the reaction tube 203 as in the first embodiment.

In this embodiment, the first plasma source constituted by plasma generating electrodes 473 and 474, the matching unit 271, and the RF power source 270 and the second plasma source constituted by the plasma generating electrodes 483 and 484, the matching unit 271, and the RF power source 270 are provided. Therefore, compared with the case in which only one plasma source is provided, even when the RF power supplied to the each plasma source is reduced, a sufficient amount of plasma to process a substrate can be generated by the two plasma sources, thereby the damage to the wafers 200 or the films formed on the wafers 200 can be reduced, and the processing temperature of the wafers 200 can be lowered.

Since the first plasma generating structure 820 constituted by the plasma generating electrodes 473 and 474, the plasma generating chamber wall 428, the plasma generating chamber 821, the opening 822, the nozzle 426, and the gas supply holes 427 and the second plasma generating structure 830 constituted by the plasma generating electrodes 483 and 484, the plasma generating chamber wall 438, the plasma generating chamber 831, the opening 832, the nozzle 436, and the gas supply holes 437 are disposed symmetric with respect to a line passing through the center of the wafers 200 (the center of the reaction tube 203), it is easy to supply plasma uniformly to the entire surfaces of the wafers 200 from both plasma generating structures and it is thus possible to form a uniform film on the wafers 200.

Since the exhaust hole 230 is disposed on the line passing through the center of the wafers 200 (the center of the reaction tube 203), it is easy to supply plasma uniformly to the entire surfaces of the wafers 200 and it is thus possible to form a uniform film on the wafers 200. Since the gas supply holes 411 of the nozzle 410 are also disposed on the line passing through the center of the wafers 200 (the center of the reaction tube 203), it is easy to supply plasma uniformly to the entire surfaces of the wafers 200 and it is thus possible to form a uniform film on the wafers 200.

In the substrate processing apparatus having the structure according to this embodiment, the processing method of supplying $N_2$ not activated by plasma (step S211), removing the residual gas (step S213), and then forming a silicon nitride film (steps S231 to S237) as a pre-process, which is described with reference to FIG. 5, the processing method of performing at least one cycle of the supply of DCS (step S221), the removal of residual gas (step S223), the supply of $NH_3$ not excited by plasma (step S225), and the removal of residual gas (step S227) and then forming a silicon nitride film (steps S231 to S237) as a pre-process, which is described with reference to FIG. 9, or the processing method of supplying DCS not activated by plasma (step S215), removing the residual gas (step S217), and then forming a silicon nitride film (steps S231 to S237) as a pre-process, which is described with reference to FIG. 11 can be used. Accordingly, it is possible to reduce the number of particles generated, thereby improving the adhesion.

Seventh Embodiment

Figure 18:
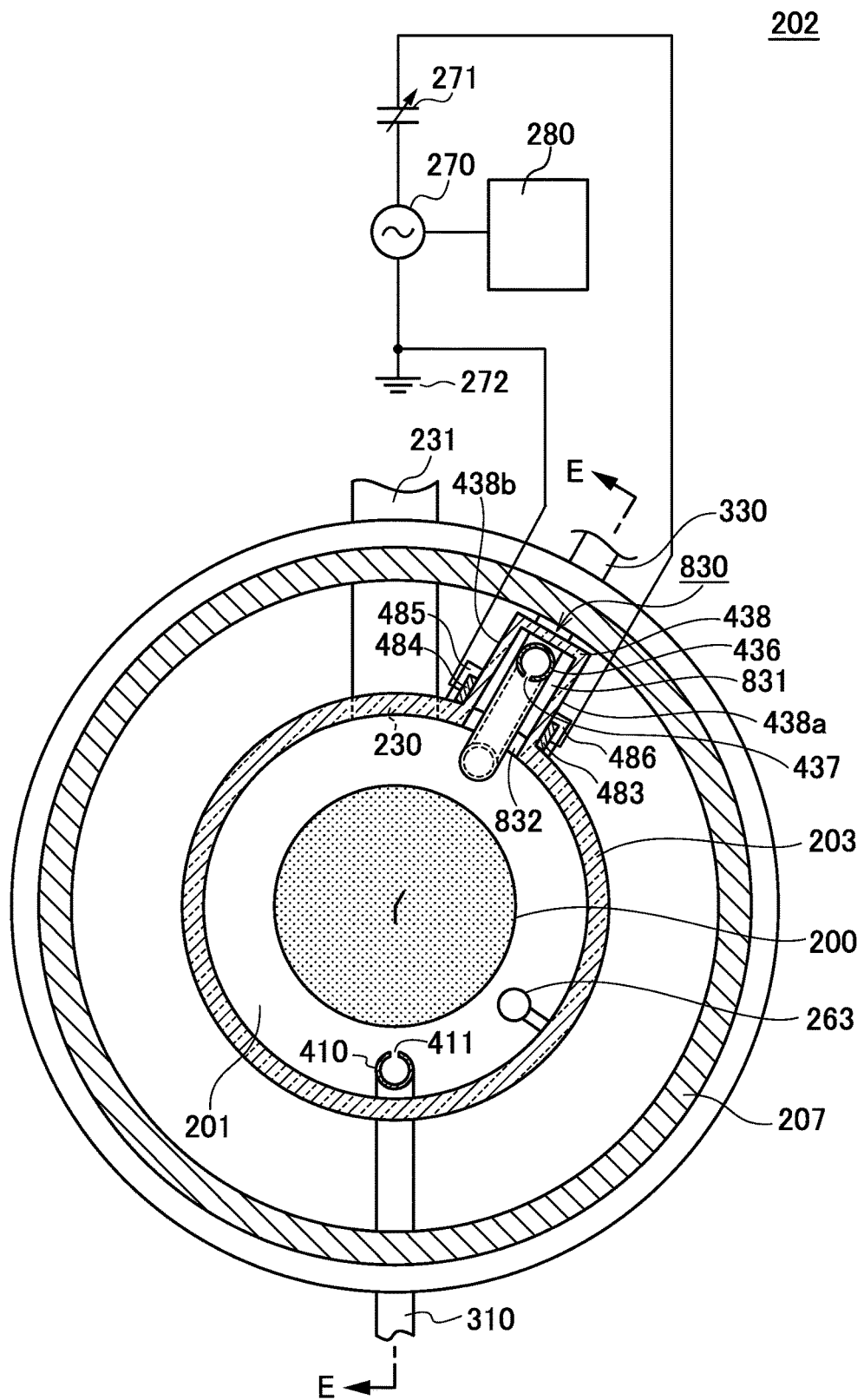
FIG. 18 is a schematic transverse sectional view for explaining a seventh exemplary embodiment of the invention.

Referring to FIG. 18, the sixth embodiment includes the plasma generating structure 820 constituted by the electrodes 473 and 474, the electrode cover 475, the electrode cover 476, the plasma generating chamber 821, and the opening 822 and the plasma generating structure 830 constituted by the electrode 483, the electrode 484, the electrode cover 485, the electrode cover 486, the plasma generating chamber 831, and the opening 832 and the gas supply system includes the gas supply system 301 having the gas supply tube 310, the gas supply system 302 having the gas supply tube 320, and the gas supply system 303 having the gas supply tube 330. This embodiment is different from the sixth embodiment, in that the plasma generating structure 820 is not provided but only the plasma generating structure 830 constituted by the electrode 483, the electrode 484, the electrode cover 485, the electrode cover 486, the plasma generating chamber 831, and the opening 832 is provided, and the gas supply system 303 is not provided but only the gas supply system 301 having the gas supply tube 310 and the gas supply system 302 having the gas supply tube 320 are provided, but is the same in the other points.

In the substrate processing apparatus having the structure according to this embodiment, the processing method of performing at least one cycle of the supply of DCS (step S221), the removal of residual gas (step S223), the supply of $NH_3$ not excited by plasma (step S225), and the removal of residual gas (step S227) as a pre-process and then forming a silicon nitride film (steps S231 to S237), which is described with reference to FIG. 9, or the processing method of supplying DCS not activated by plasma (step S215), removing the residual gas (step S217) as a pre-process, and then forming a silicon nitride film (steps S231 to S237), which is described with reference to FIG. 11, can be used. Accordingly, it is possible to reduce the number of particles generated, thereby improving the adhesion.

In the above-mentioned embodiments, the amorphous silicon nitride film is formed on the GST film, but the embodiments can be applied to a metal film other than the GST film. Examples of the metal films which can be suitably employed include Ti, TiN, TiSi, W, WN, WSi, Co, CoSi, Al, AlSi, Cu, and alloys thereof.

Eighth Embodiment

Figure 19:
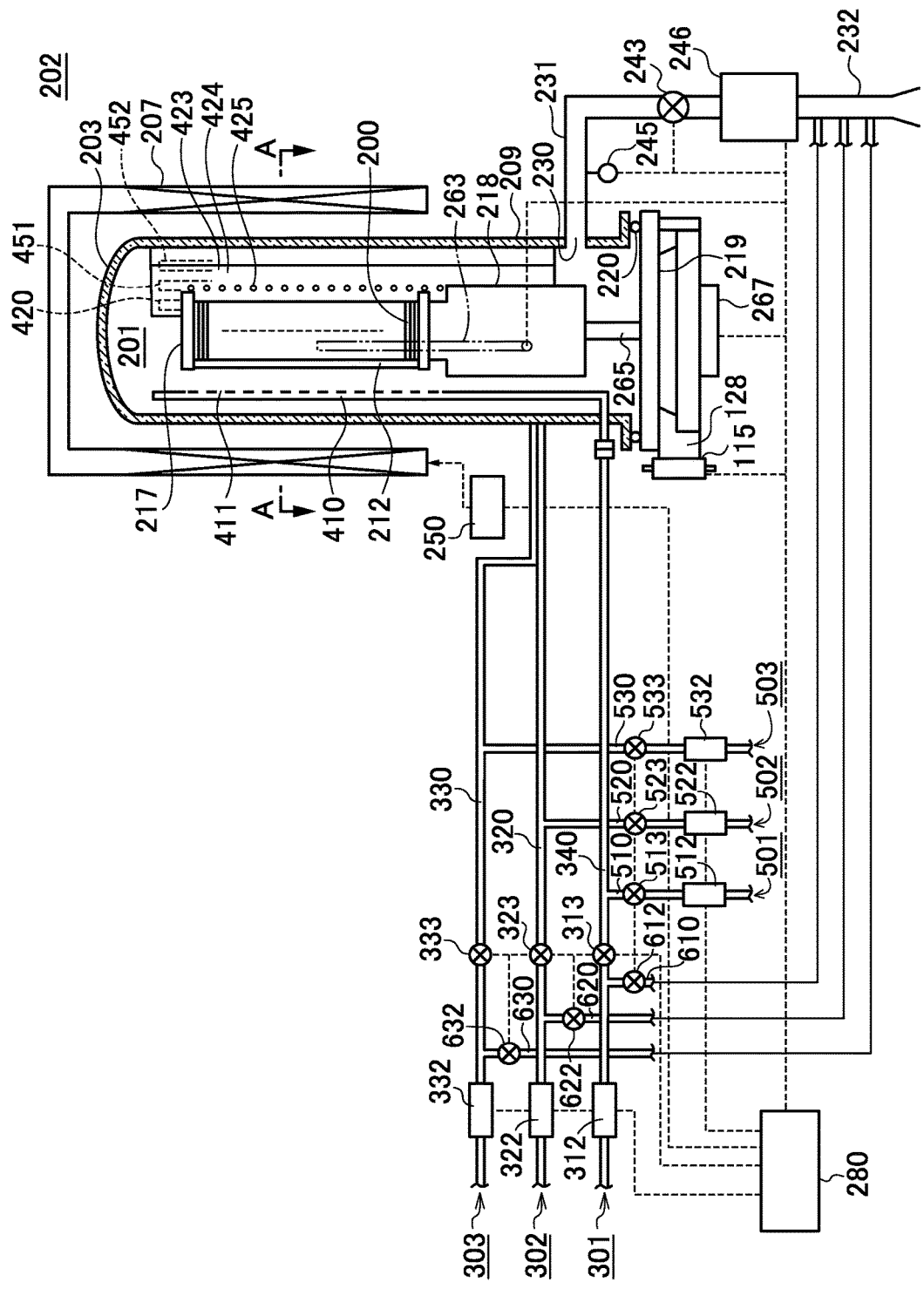
FIG. 19 is a diagram schematically illustrating an example of a processing furnace and members accompanied therewith, which are suitably used in an eighth exemplary embodiment of the invention and is a schematic longitudinal sectional view taken along line B-B of FIG. 20, in which the schematic longitudinal section of the processing furnace is shown.

An eighth embodiment of the invention will be described with reference to FIGS. 19 and 20.

Figure 11:
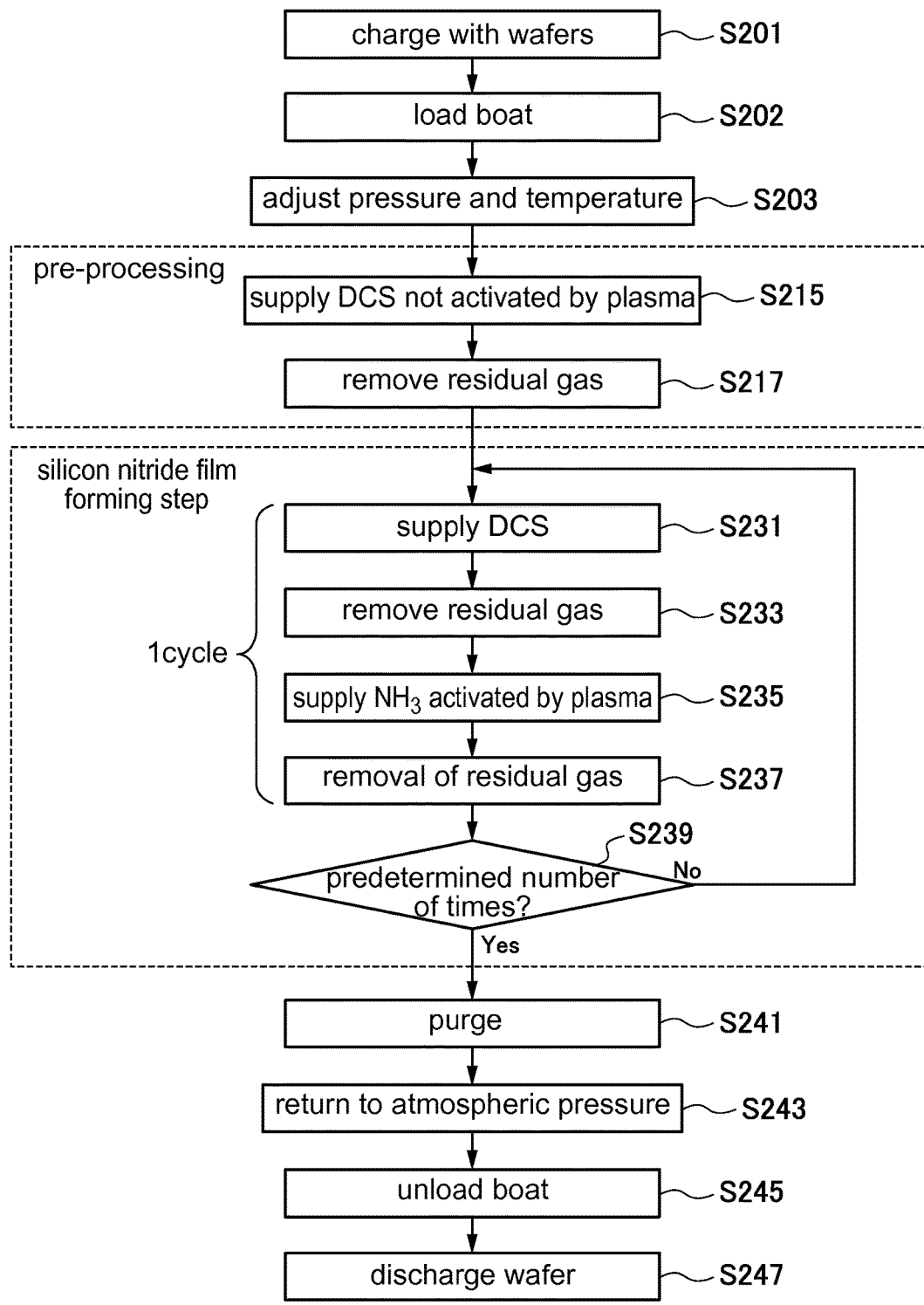
FIG. 11 is a flowchart illustrating a silicon nitride film forming process according to a third exemplary embodiment of the invention.

In the above-mentioned embodiments, the processing method of supplying $N_2$ not activated by plasma (step S211) and then removing the residual gas (step S213) as a pre-process, which is described with reference to FIG. 5, the processing method of performing at least one cycle of the supply of DCS (step S221), the removal of residual gas (step S223), the supply of $NH_3$ not excited by plasma (step S225), and the removal of residual gas (step S227) as a pre-process, which is described with reference to FIG. 9, or the processing method of supplying DCS not activated by plasma (step S215) and then removing the residual gas (step S217) as a pre-process, which is described with reference to FIG. 11, is performed. This embodiment is different from the embodiments, in that the pre-process is not performed, but is the same in the other points. The apparatus used in this embodiment is different from the apparatus used in the modifications of the first to third embodiments described with reference to FIGS. 2, 4, and 13, in that the gas reservoir 315 and the valve 314 upstream from the gas reservoir 315 are not used, but is the same in the other points.

Figure 21:
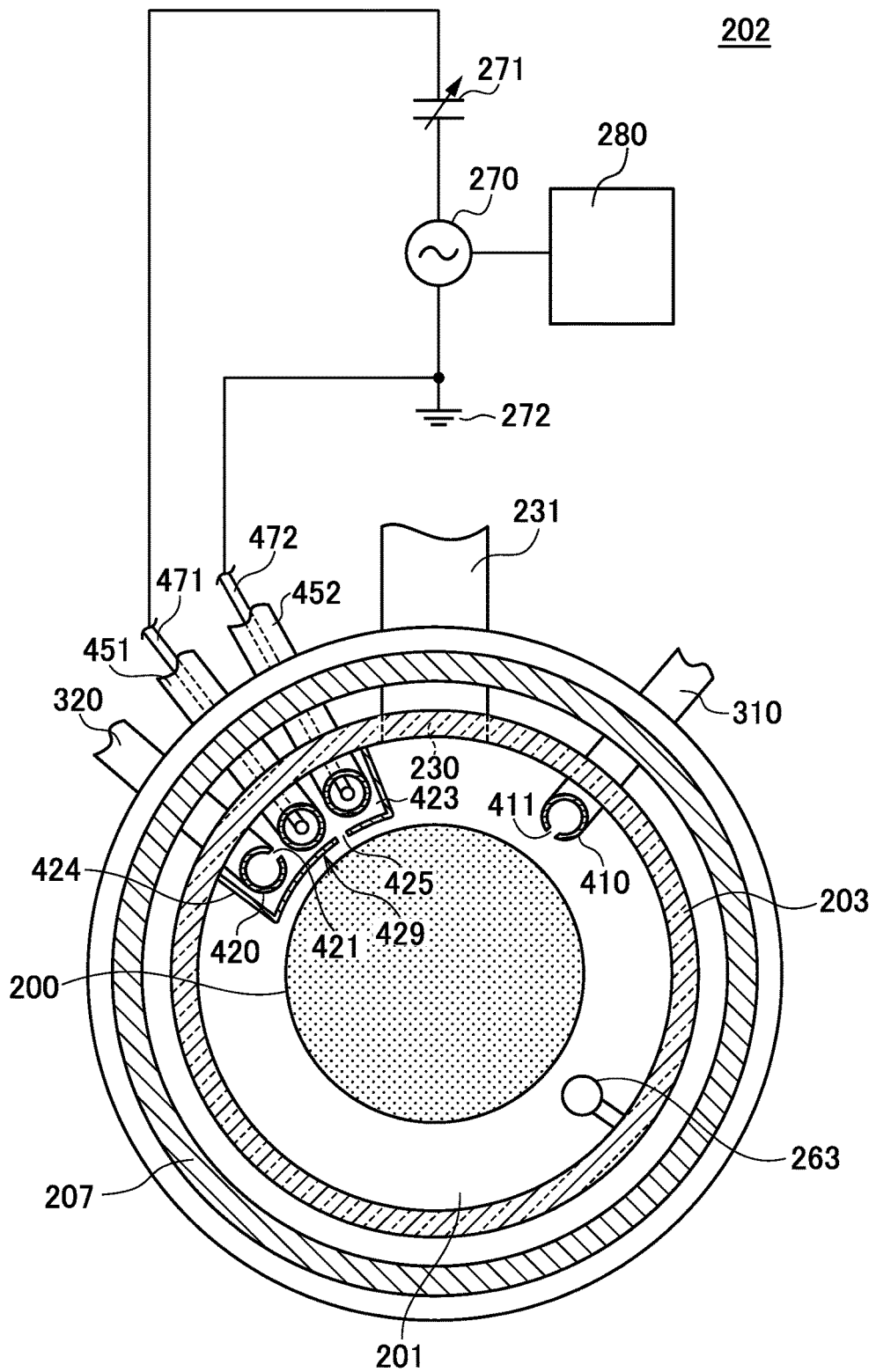
FIG. 21 is a schematic transverse sectional view illustrating a comparative example.

As a comparative example, as shown in FIG. 21, the substrate processing apparatus 101 in which only the plasma generating structure 429 constituted by the rod-like electrode 471, the rod-like electrode 472, the electrode protecting pipe 451, the electrode protecting pipe 452, the buffer chamber 423, and the gas supply holes 425 is provided and the gas supply system does not include the gas supply system 303 but includes only the gas supply system 304 having the gas supply tube 340 and the gas supply system 302 having the gas supply tube 320 is used.

In this comparative example, at a low substrate temperature of about 650° C., an amorphous silicon nitride film (hereinafter, abbreviated as "SiN") is formed by the use of the ALD method using DCS (DiChloroSilane) and $NH_3$ (ammonia) plasma. The formation of the amorphous silicon nitride film on the wafer 200 is carried out by repeatedly performing four steps of a step of supplying the DCS, a step of removing the DCS, a step of supplying the $NH_3$ plasma, and a step of removing the $NH_3$. By repeatedly performing these four steps, it is possible to deposit an SiN film with a predetermined thickness on the wafer 200. The thickness of the film can be controlled depending on the number of cycles in the ALD method.

However, the ALD method using plasma has a problem in that particles can be easily generated, compared with the method not using plasma. This problem is considered to be based on peeled particle contamination due to the generation of micro cracks in an accumulated film deposited at a position other than the wafers 200 as a processing substrate. The problem is also a problem with area particles markedly generated when the thickness of the continuously-accumulated film increases. When the RF power is raised, the number of particles increases to deteriorate the problem. The generation of particles is considered to be partially based on the RF power. With the decrease in size in manufacturing a semiconductor device, the temperature of the wafers 200 tends to be lowered. Accordingly, since it is necessary to raise the RF power so as to compensate for the insufficient energy, more particles are generated.

In this embodiment, the first plasma generating structure 429 constituted by the rod-like electrode 471, the rod-like electrode 472, the electrode protecting pipe 451, the electrode protective pipe 452, the buffer chamber 423, and the gas supply holes 425 and the second plasma generating structure 439 constituted by the rod-like electrode 481, the rod-like electrode 482, the electrode protecting pipe 461, the electrode protective pipe 462, the buffer chamber 433, and the gas supply holes 435 are provide, and the first plasma source constituted by the rod-like electrode 471, the rod-like electrode 472, the electrode protecting pipe 451, the electrode protective pipe 452, the matching unit 271, and the RF power source 270 and the second plasma source constituted by the rod-like electrode 481, the rod-like electrode 482, the electrode protecting pipe 461, the electrode protective pipe 462, the matching unit 271, and the RF power source 270 are provided. Therefore, the RF power can be dispersed, and compared with the case in which only one plasma source is provided, even when the RF power supplied to each of the plasma sources is reduced, a sufficient amount of plasma to process a substrate can be generated by the two plasma sources, thereby the damage to the wafers 200 or the films formed on the wafers 200 can be reduced and the processing temperature of the wafers 200 can be lowered. Further, the generation of the above-mentioned area particles can be suppressed.

Figure 20:
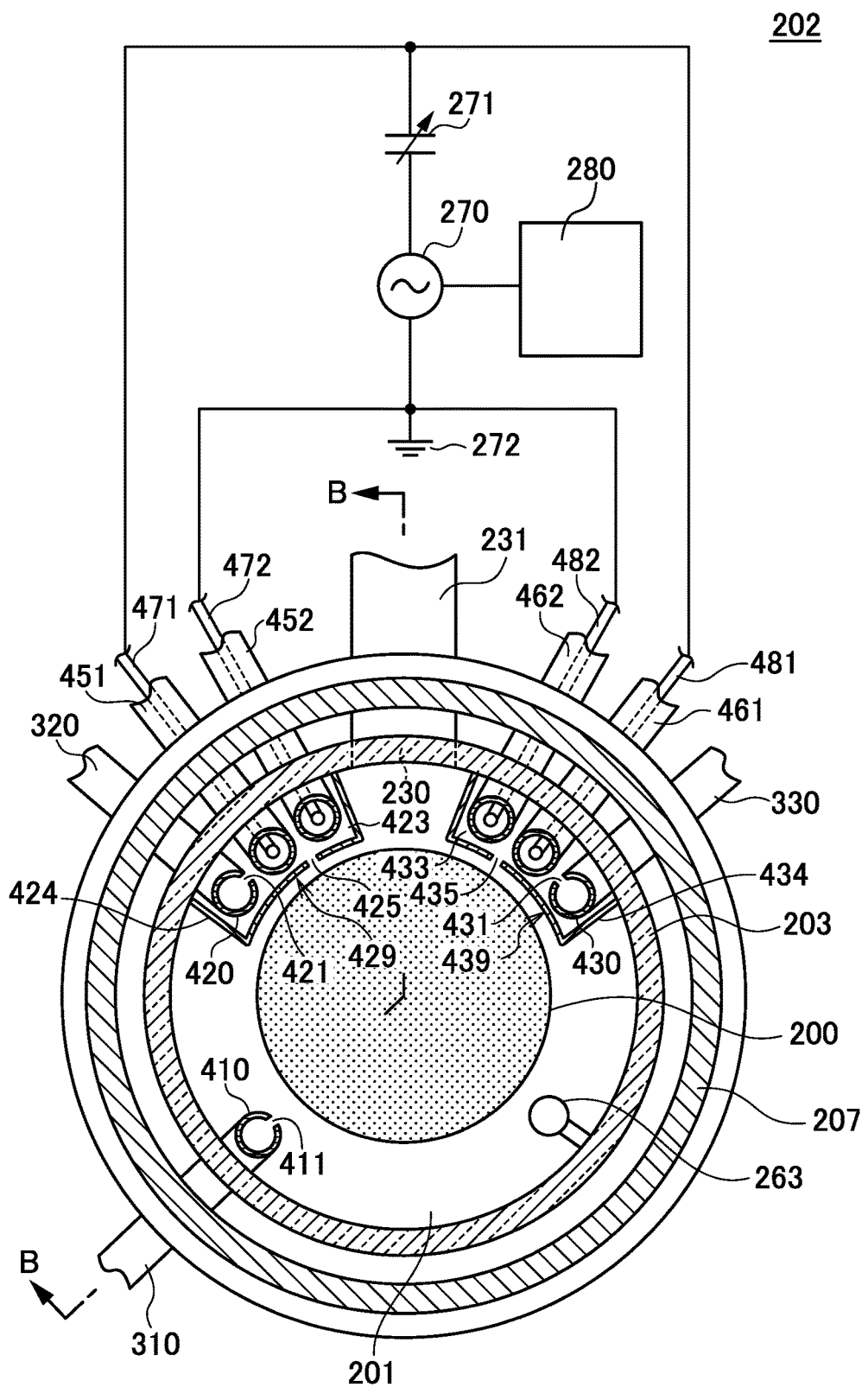
FIG. 20 is a schematic transverse sectional view taken along line A-A in the processing furnace shown in FIG. 19.
Figure 24:
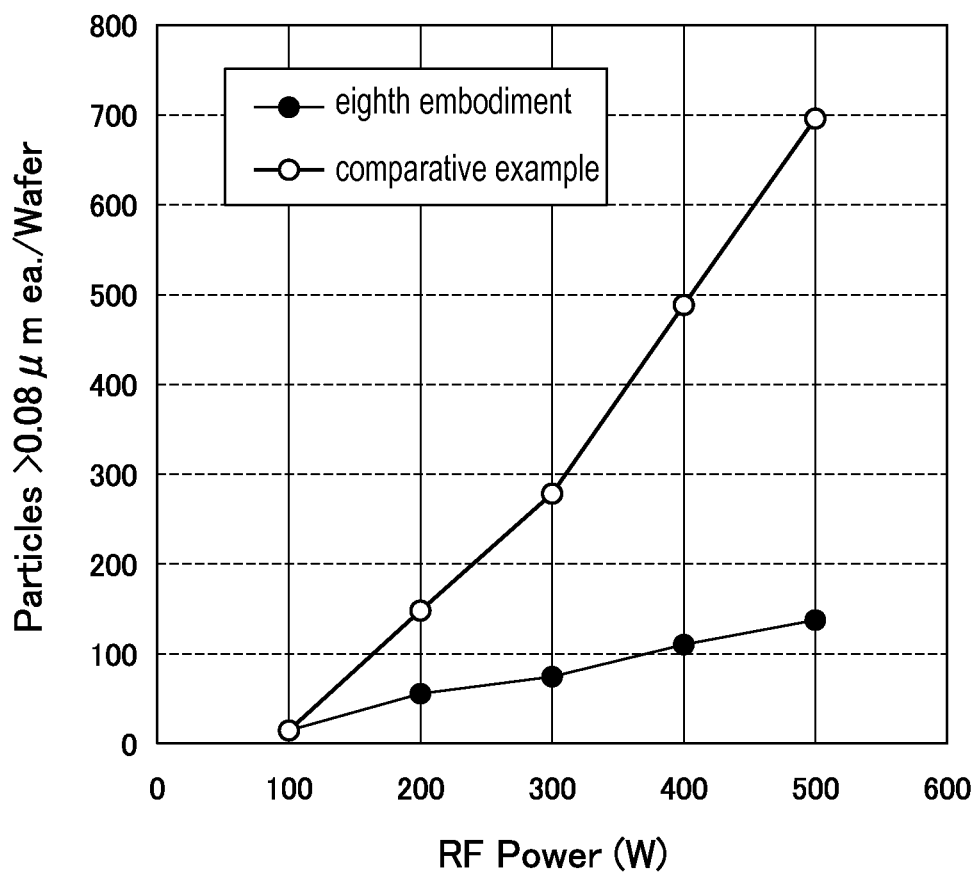
FIG. 24 is a diagram illustrating the relationship between RF power and particles in an example of the eighth exemplary embodiment of the invention and a comparative example.

The number of particles generated is compared under the film forming conditions shown in FIG. 22 by using both the substrate processing apparatus according to this embodiment shown in FIG. 20 and the substrate processing apparatus according to the comparative example shown in FIG. 21, using a 300 mm wafer as the wafer 200, and setting the temperature of the wafer 200 to 350° C. The results are on the premise that the accumulated SiN film thickness of the reaction tube 203 is 1.2 μm to 1.3 μm. The values in the X axis of the RF power in FIG. 22 are described in the X axis column of the RF power in FIG. 23. FIG. 23 is a table illustrating the relationship between the RF power and the number of particles generated with a size of 0.08 μm and FIG. 24 is a graph illustrating the table shown in FIG. 23.

As can be clearly seen from this result, the configuration in which the RF power is distributed and supplied as in this embodiment causes the smaller number of particles generated even with the same RF power. As shown in FIG. 14, the configuration in which the RF power is distributed to three parts achieves a superior effect.

Since the most SiN film forming apparatuses using the ALD method are operated to repeat the film forming process and the gas cleaning process, the number of particles generated can be suppressed according to this embodiment, thereby elongating the period of the gas cleaning.

Ninth Embodiment

Figure 25:
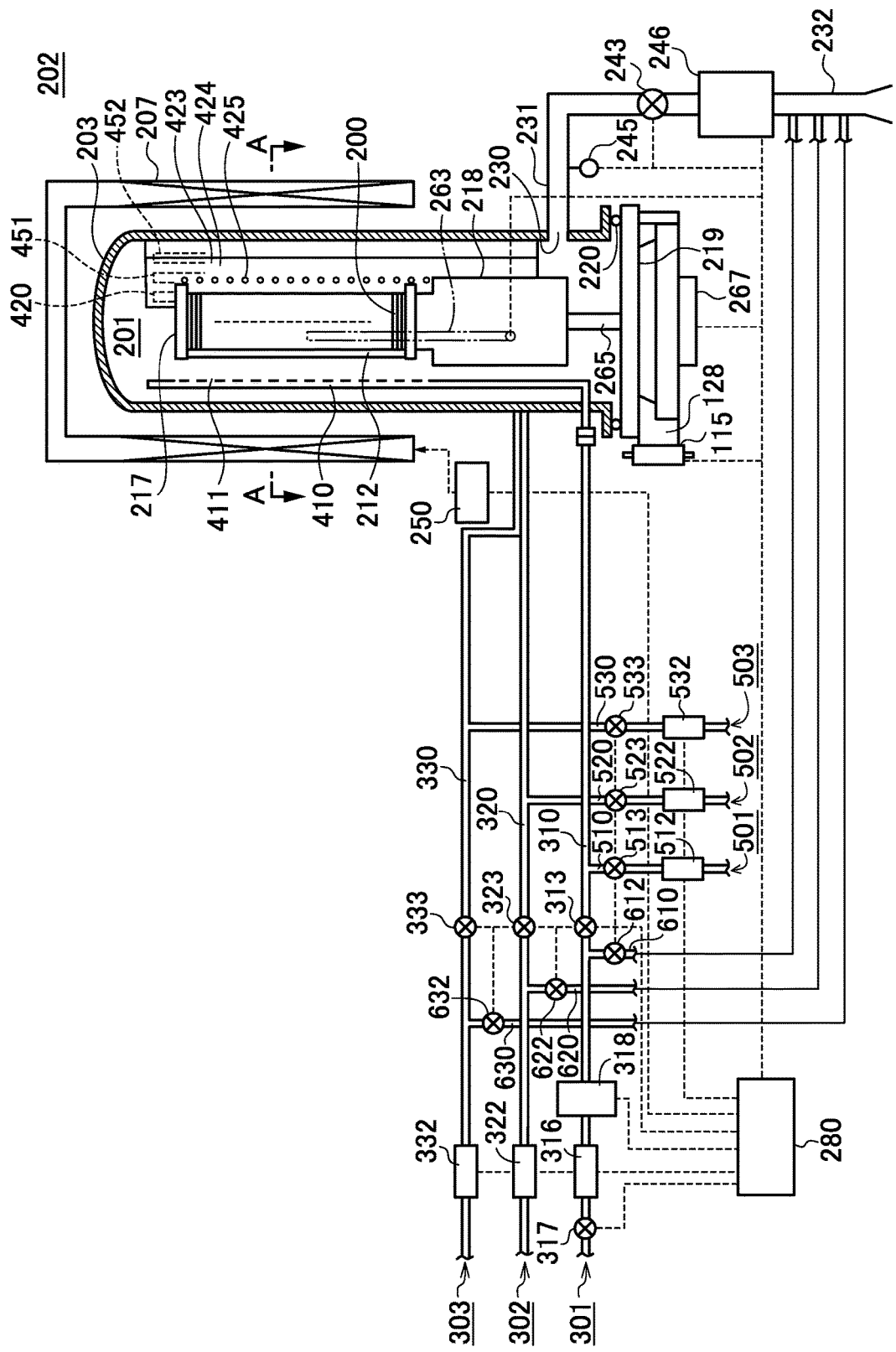
FIG. 25 is a diagram schematically illustrating an example of a processing furnace and members accompanied therewith, which are suitably used in an eighth exemplary embodiment of the invention and is a schematic longitudinal sectional view taken along line B-B of FIG. 26, in which the schematic longitudinal section of the processing furnace is shown.
Figure 26:
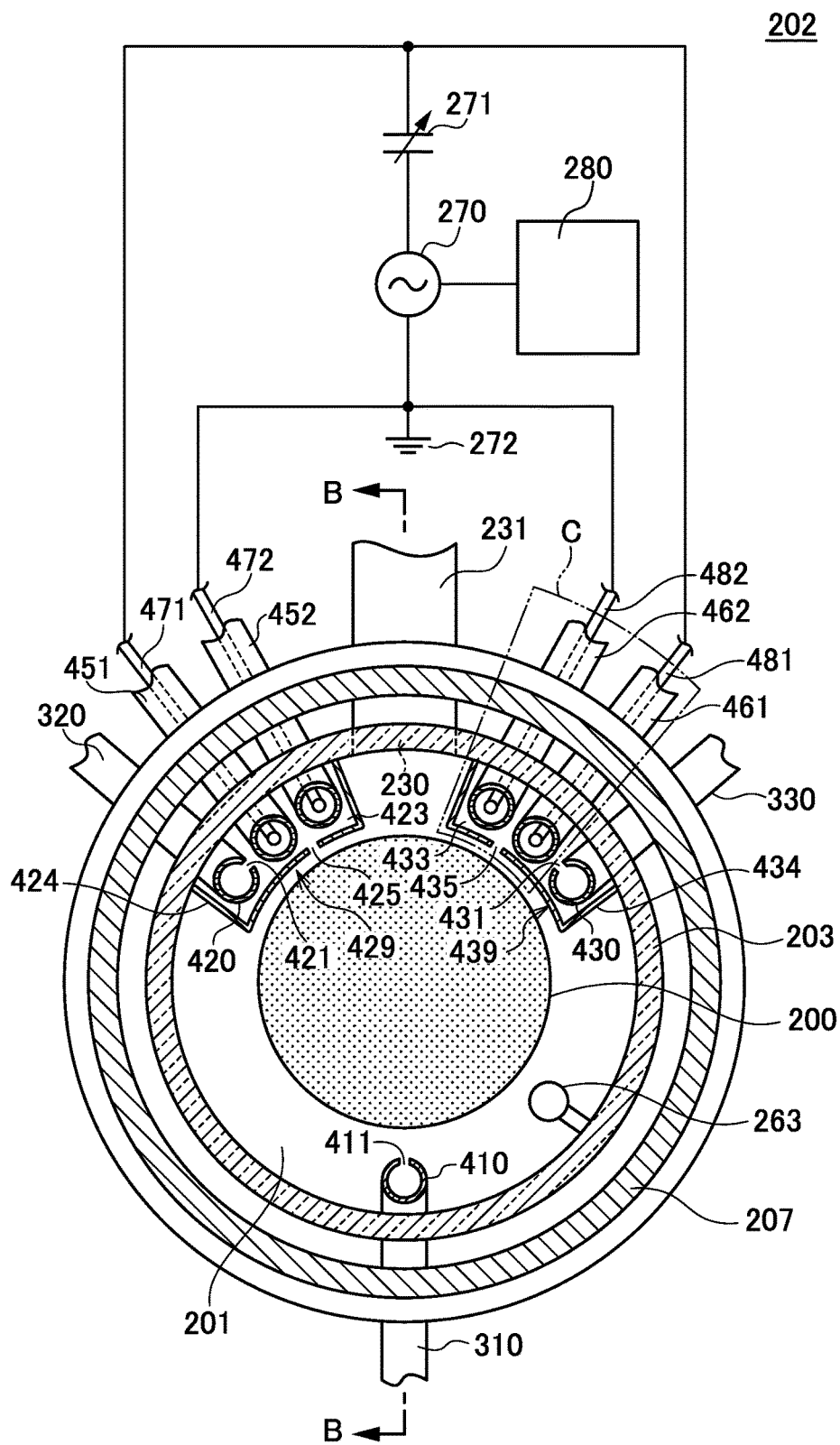
FIG. 26 is a schematic transverse sectional view taken along line A-A in the processing furnace shown in FIG. 25.

A processing furnace 202 according to a ninth embodiment used in the substrate processing apparatus 101 will be described below with reference to FIGS. 25 and 26.

The above-mentioned embodiments employ the structure in which the buffer chambers 423, 433, and 433' or the plasma generating chambers 821 and 831 are supplied with $O_2$ gas to generate plasma of $NH_3$ (ammonia). However, as long as it is a structure in which plasma is generated using a buffer chamber or a plasma generating chamber, the film type or the gas type is not particularly limited. For example, a silicon oxide film may be formed using BTBAS ($SiH_2(NH(C_4H_9)_2$, bistertialbutylaminosilane) and $O_2$. The following embodiment relates to such a case.

In the first embodiment described with reference to FIGS. 2 and 3, since gas-phase DCS is used in the gas supply system 301, $NH_3$ is supplied from the gas supply systems 302 and 303 using the mass flow controller 312, the gas reservoir 315, and the valve 314 between the gas reservoir 315 and the mass flow controller 312. In this embodiment, liquid-phase BTBAS is used. Accordingly, this embodiment is different from the first embodiment, in that a liquid mass flow controller 316, a vaporizer 318, a valve 317 upstream from the liquid mass flow controller 316 are used instead of the mass flow controller 312, the gas reservoir 315, and the valve 314 of the gas supply system 301 and $O_2$ is supplied from the gas supply systems 302 and 303, but is the same in the other points.

Sequentially from the upstream, a valve 317 which is an on-off valve, a liquid mass flow controller 316 which is a flow rate control unit of a liquid material, a vaporizer 318 which is a vaporization unit (vaporizer), and a valve 313 which is an on-off valve are disposed in the gas supply pipe 310 of the gas supply system 301.

In the gas supply pipe 310, a vent line 610 and a valve 612 connected to the exhaust pipe 232 are disposed between the valve 313 and the vaporizer 318.

The gas supply pipe 310, the valve 317, the liquid mass flow controller 316, the vaporizer 318, the valve 313, the nozzle 410, the vent line 610, and the valve 612 constitute the gas supply system 301.

In the gas supply pipe 310, a liquid material is adjusted in flow rate by the liquid mass flow controller 316, is supplied to the vaporizer 318, is vaporized, and is then supplied as source gas.

When the source gas is not being supplied to the processing chamber 201, the valve 313 is turned off and the valve 612 is turned on, by which the source gas is made to flow to the vent line 610 via the valve 612.

When supplying the source gas to the processing chamber 201, the valve 612 is turned off and the valve 313 is turned on, by which the source gas is supplied to the gas supply pipe 310 downstream from the valve 313. On the other hand, the carrier gas is adjusted in flow rate by the mass flow controller 512 and is supplied from the carrier gas supply pipe 510 via the valve 513, the source gas is merged with the carrier gas downstream from the valve 313, and the merged gas is supplied to the processing chamber 201 via the nozzle 410.

In the buffer chamber 423, a rod-like electrode 471 and a rod-like electrode 472 having a long and thin shape are disposed in the stacking direction of the wafers 200 from the lower part to the upper part of the reaction tube 203. The rod-like electrode 471 and the rod-like electrode 472 are covered with electrode protecting pipes 451 and 452 which are protecting pipes protecting the electrodes, respectively, from the upper part to the lower part and are thus protected. In the buffer chamber 433, a rod-like electrode 481 and a rod-like electrode 482 having a long and thin shape are disposed in the stacking direction of the wafers 200 from the lower part to the upper part of the reaction tube 203. The rod-like electrode 481 and the rod-like electrode 482 are covered with electrode protecting pipes 461 and 462 which are protecting pipes protecting the electrodes, respectively, from the upper part to the lower part and are thus protected.

Figure 27:
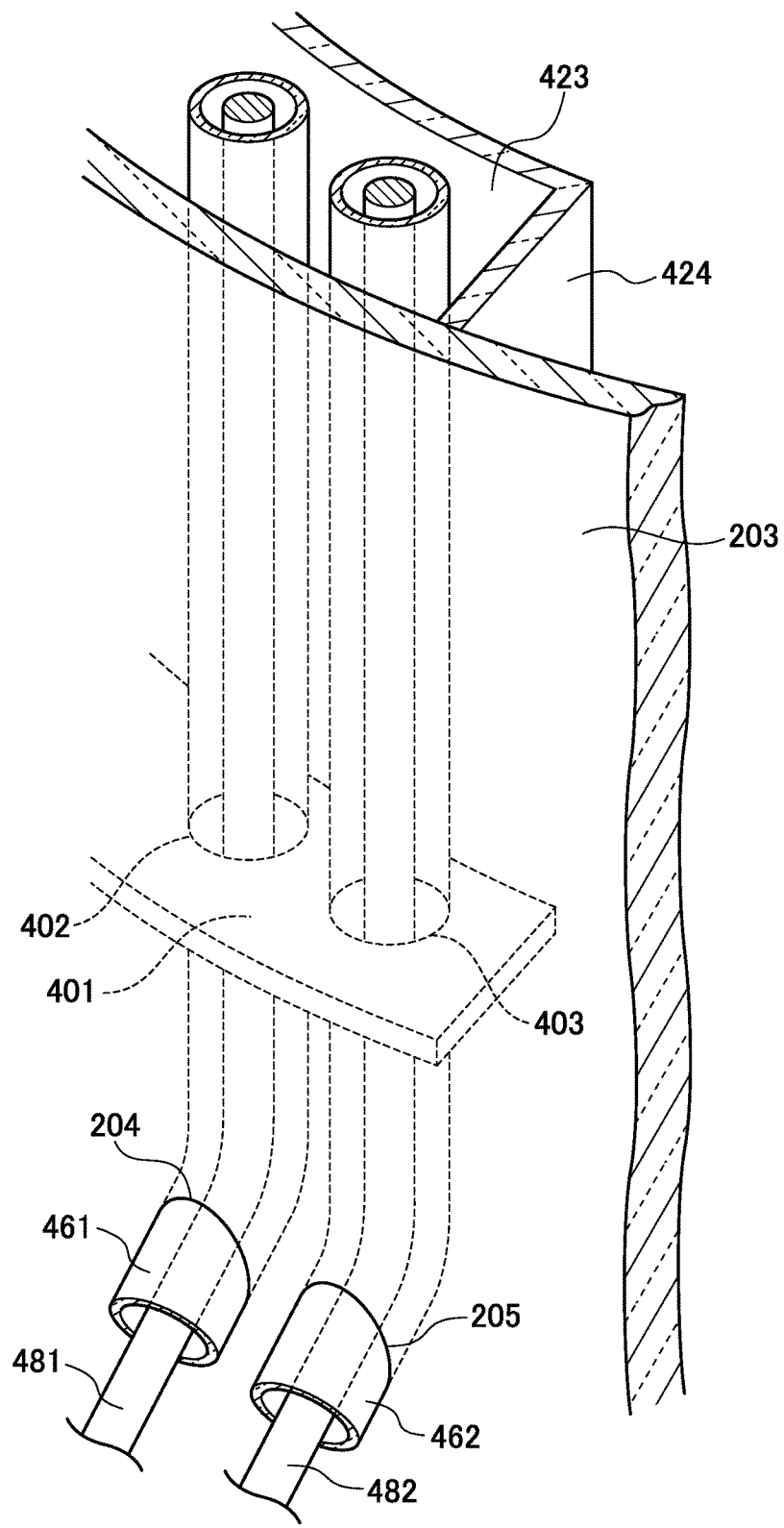
FIG. 27 is a partially-enlarged schematic perspective view illustrating the C part of FIG. 26.
Figure 28:
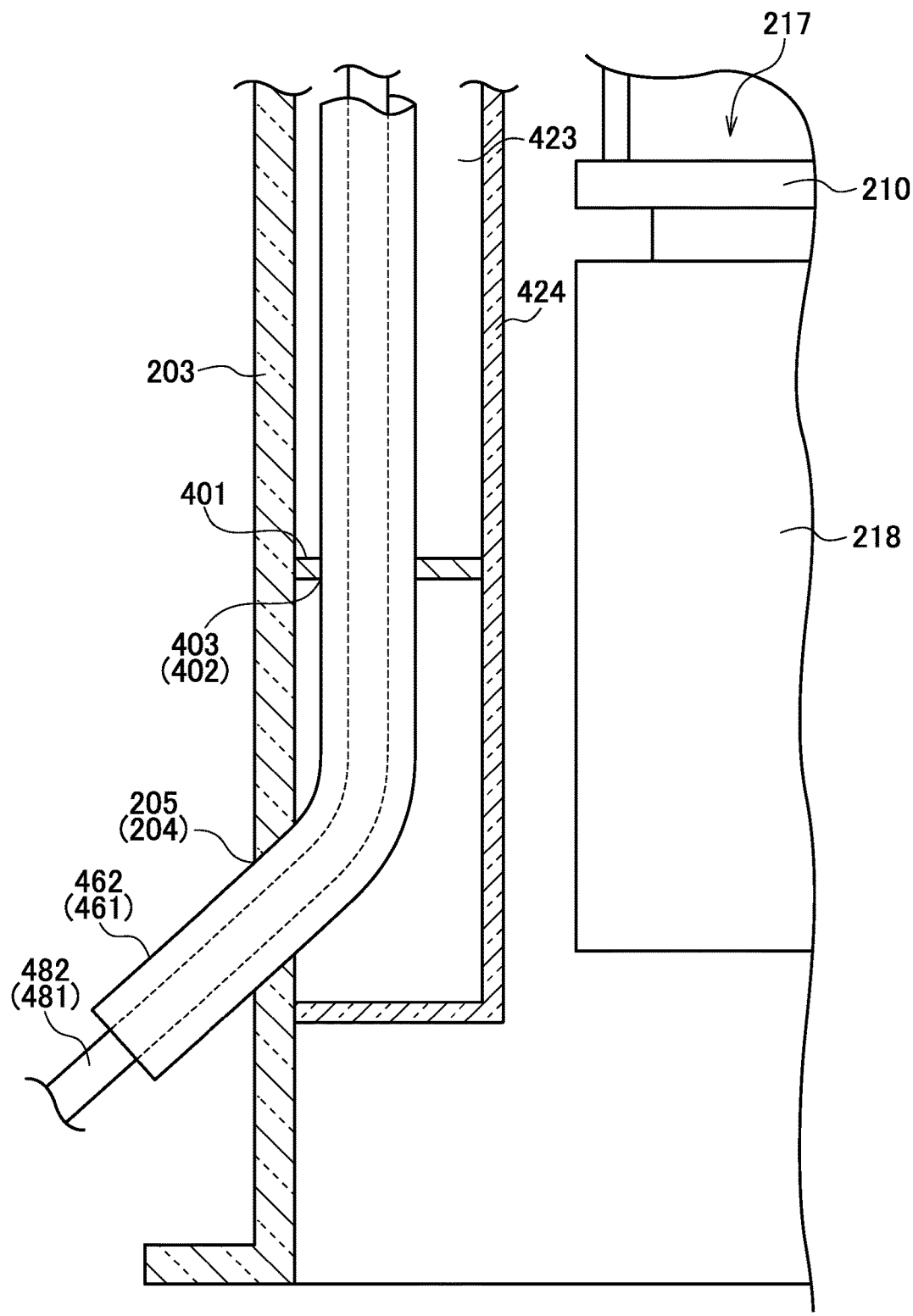
FIG. 28 is a partially-enlarged schematic longitudinal sectional view illustrating the C part of FIG. 26.

Referring to FIGS. 27 and 28, the electrode protecting pipe 461 and the electrode protecting pipe 462 are inserted into the buffer chamber 423 via through-holes 204 and 205 formed in the reaction tube 203 at a height position close to the lower part of the boat support 218. The electrode protecting pipe 461 and the electrode protecting pipe 462 are fixed to the reaction tube 203 at a height position of the through-holes 204 and 205. The electrode protecting pipe 461 and the electrode protecting pipe 462 are disposed in the buffer chamber 423 to pass through holes 402 and 403 of an attachment plate 401 and are fixed by the attachment plate 401. The attachment plate 401 is fixed to the reaction tube 203 and the buffer chamber wall 424. The electrode protecting pipe 451 and the electrode protecting pipe 452 have the same structure as the electrode protecting pipe 461 and the electrode protecting pipe 462.

In the present embodiment, the first plasma source constituted by the rod-like electrode 471, the rod-like electrode 472, the electrode protecting pipe 451, the electrode protective pipe 452, the matching unit 271, and the RF power source 270 and the second plasma source constituted by the rod-like electrode 481, the rod-like electrode 482, the electrode protecting pipe 461, the electrode protective pipe 462, the matching unit 271, and the RF power source 270 are provided. To lower the processing temperature of the wafer 200 using plasma, it is necessary to raise the RF power for forming the plasma. However, the damage to the wafer 200 or the film to be formed increases when the RF power is raised. On the contrary, this embodiment is provided with two plasma sources of the first plasma source and the second plasma source. Accordingly, even when the RF power supplied to the plasma sources is low, it is possible to generate a sufficient amount of plasma, compared with the case in which only one plasma source is provided. Therefore, when processing the wafer 200 using plasma, it is possible to reduce the damage to the wafer 200 or the film to be formed and to lower the processing temperature of the wafer 200.

Since the first plasma generating structure 429 constituted by the rod-like electrode 471, the rod-like electrode 472, the electrode protecting pipe 451, the electrode protective pipe 452, the buffer chamber 423, and the gas supply holes 425 and the second plasma generating structure 439 constituted by the rod-like electrode 481, the rod-like electrode 482, the electrode protecting pipe 461, the electrode protective pipe 462, the buffer chamber 433, and the gas supply holes 435 are disposed symmetric with respect to a line passing through the center of the wafers 200 (the center of the reaction tube 203), it is easy to supply plasma uniformly to the entire surfaces of the wafers 200 from both plasma generating structures and it is thus possible to form a uniform film on the wafers 200.

Since the exhaust hole 230 is disposed on the line passing through the center of the wafers 200 (the center of the reaction tube 203), it is easy to supply plasma uniformly to the entire surfaces of the wafers 200 from both plasma generating structures and it is thus possible to form a uniform film on the wafers 200. Since the gas supply holes 411 of the nozzle 410 are also disposed in the line passing through the center of the wafers 200 (the center of the reaction tube 203), it is easy to supply plasma uniformly to the entire surfaces of the wafers 200 from both plasma generating structures and it is thus possible to form a uniform film on the wafers 200.

Since the gas supply holes 411, the gas supply holes 425, and the gas supply holes 435 are disposed so that the distance between the gas supply holes 411 of the nozzle 410 and the gas supply holes 425 of the buffer chamber 423 is equal to the distance between the gas supply holes 411 of the nozzle 410 and the gas supply holes 435 of the buffer chamber 433, it is possible to form a uniform film on the wafers 200.

Figure 29:
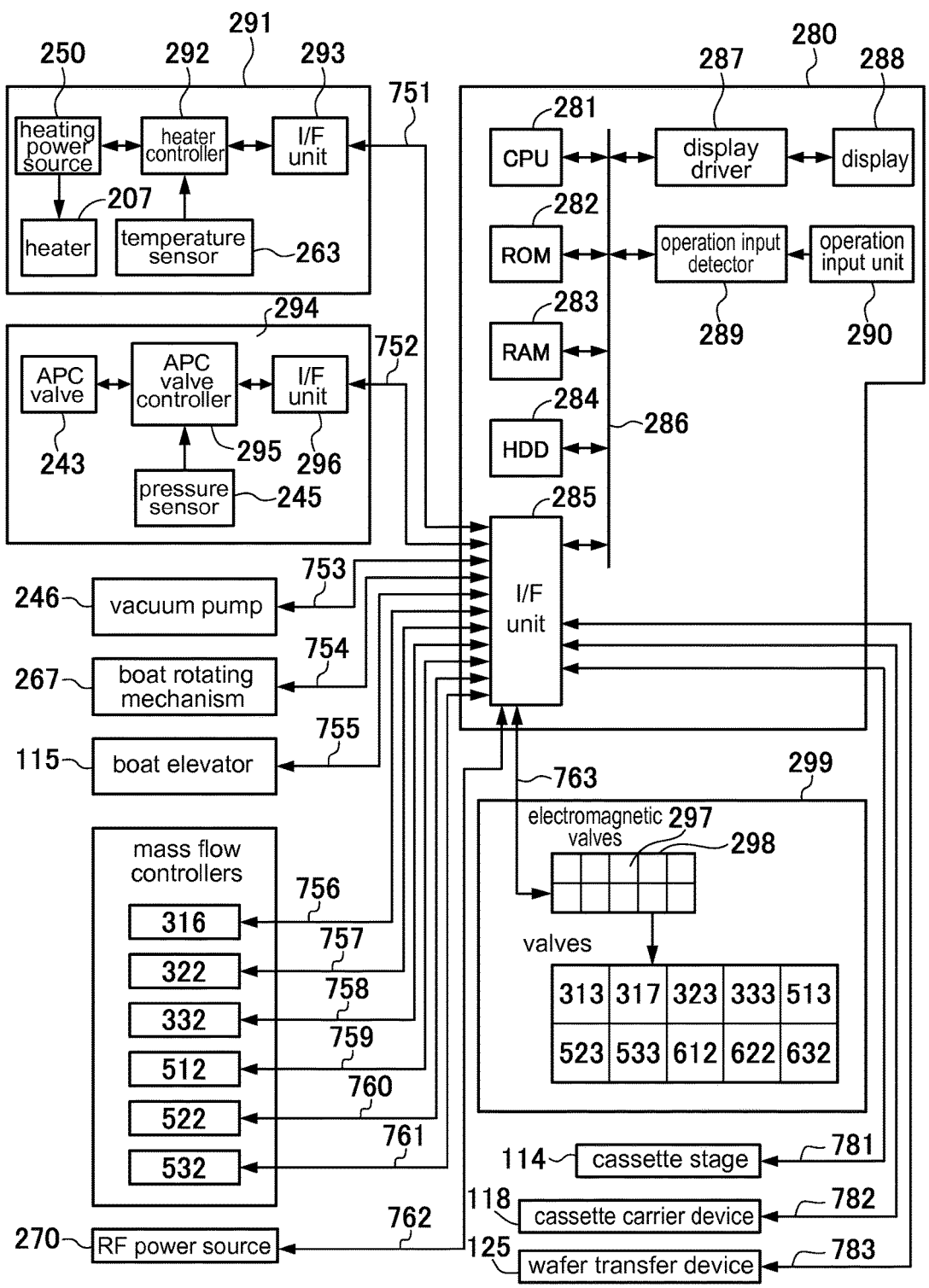
FIG. 29 is a block diagram illustrating a controller suitably used in a substrate processing apparatus according to a ninth exemplary embodiments of the invention and members controlled by the controller.

Referring to FIG. 29, a controller 280 includes a display 288 displaying an operation menu and the like and an operation input unit 290 having plural keys and receiving various information or an operation instruction. The controller 280 includes a CPU 281 controlling the overall operation of the substrate processing apparatus 101, a ROM 282 storing various programs including a control program in advance, a RAM 283 temporarily storing a variety of data, an HDD 284 storing and holding a variety of data, a display driver 287 controlling the display of a variety of information on the display 288 and receiving operation information from the display 288, an operation input detecting unit 289 detecting an operation state on the operation input unit 290, and a communication interface (I/F) unit 285 transmitting and receiving a variety of information to and from various members such as a temperature controller 291 to be described later, a pressure controller 294 to be described later, the vacuum pump 246, the boat rotating mechanism 267, the boat elevator 115, the mass flow controllers 312, 322, 332, 512, 522, and 532, a valve controller 299 to be described later, the cassette stage 114, the cassette carrier device 118, and the wafer transfer device 125.

The CPU 281, the ROM 282, the RAM 283, the HDD 284, the display driver 287, the operation input detecting unit 289, and the communication I/F unit 285 are connected to each other via a system bus 286. Accordingly, the CPU 281 can access the ROM 282, the RAM 283, and the HDD 284, can control the display of a variety of information on the display 288 via the display driver 287, can grasp the operation information from the display 288, and can control the transmission and reception of a variety of information to and from various members via the communication I/F unit 285. The CPU 281 can grasp a user's operation state on the operation input unit 290 via the operation input detecting unit 289.

The temperature controller 291 includes a heater 207, a heating power source 250 supplying power to the heater 207, a temperature sensor 263, an communication I/F unit 293 transmitting and receiving a variety of information such as set temperature information to and from the controller 280, and a heater controller 292 controlling the supply power from the heating power source 250 to the heater 207 on the basis of the received set temperature information and the temperature information from the temperature sensor 263. The heater controller 292 is embodied by a computer. The communication I/F unit 293 of the temperature controller 291 and the communication I/F unit 285 of the controller 280 are connected to each other via a cable 751.

The pressure controller 294 includes an APC valve 243, a pressure sensor 245, a communication I/F unit 296 transmitting and receiving a variety of information such as set pressure information and on-off information of the APC valve 243 to and from the controller 280, and an APC valve controller 295 controlling the turning-on and turning-off or the aperture ratio of the APC valve 243 on the basis of the received set pressure information, the on-off information of the APC valve 243, the pressure information from the pressure sensor 245, and the like. The APC valve controller 295 is also embodied by a computer. The communication I/F unit 296 of the pressure controller 294 and the communication I/F unit 285 of the controller 280 are connected to each other via a cable 752.

The vacuum pump 246, the boat rotating mechanism 267, the boat elevator 115, the liquid mass flow controller 316, the mass flow controllers 322, 332, 512, 522, and 532, the RF power source 270, the cassette stage 114, the cassette carrier device 118, and the wafer transfer device 125 are connected to the communication I/F unit 285 of the controller 280 via cables 753, 754, 755, 756, 757, 758, 759, 760, 761, 762, 781, 782, and 783, respectively.

The valve controller 299 includes valves 313, 314, 323, 333, 513, 523, 533, 612, 622, and 632 and an electromagnetic valve group 298 controlling the supply of air to the valves 313, 314, 323, 333, 513, 523, 533, 612, 622, and 632 which are air valves. The electromagnetic valve group 298 includes electromagnetic valves 297 corresponding to the valves 313, 314, 323, 333, 513, 523, 533, 612, 622, and 632. The electromagnetic valve group 298 and the communication I/F unit 285 of the controller 280 are connected to each other via a cable 763.

The gas-phase DCS is used in the first embodiment, but the liquid-phase BTBAS is used in this embodiment. In this embodiment, the liquid mass flow controller 316, the vaporizer 318, the valve 317 is used in the gas supply system 301 instead of the mass flow controller 312, the gas reservoir 315, and the valve 314 of the first embodiment. Accordingly, referring to FIG. 6, this embodiment is different from the first embodiment, in that the liquid mass flow controller 316 is used instead of the mass flow controller 312 of the first embodiment and the valve 317 is used instead of the valve 314, but is the same in the other points.

In this way, various members such as the liquid mass flow controller 316, the mass flow controllers 322, 332, 512, 522, and 532, the valves 313, 314, 323, 333, 513, 523, 533, 612, 622, and 632, the APC valve 243, the heating power source 250, the temperature sensor 263, the pressure sensor 245, the vacuum pump 246, the boat rotating mechanism 267, the boat elevator 115, and the RF power source 270 are connected to the controller 280. The controller 280 performs the flow rate control of the liquid mass flow controller 316, the mass flow controllers 322, 332, 512, 522, and 532, the on-off operation control of the valves 313, 314, 323, 333, 513, 523, 533, 612, 622, and 632, the on-off control of the APC valve 243, the pressure control through the use of the aperture ratio adjusting operation based on the pressure information from the pressure sensor 245, the temperature control through the use of the power supply adjusting operation from the heating power source 250 to the heater 207 on the basis of the temperature information from the temperature sensor 263, the control of the RF power supplied from the RF power source 270, the start and stop control of the vacuum pump 246, the rotation speed control of the boat rotating mechanism 267, the elevation operation control of the boat elevator 115, and the like.

An example of a semiconductor device manufacturing process of manufacturing a large scale integration circuit (LSI) using the above-mentioned substrate processing apparatus will be described below. In the following description, the operations of the constituent units of the substrate processing apparatus are controlled by the controller 280.

The LSI is manufactured by performing a wafer process of processing a wafer and then going through an assembly process, a test process, and a reliability test process. The wafer process is divided into a substrate process of performing processes of oxidation, diffusion, and the like on a silicon wafer and a wiring process of forming wires on the surface thereof. In the wiring process, a cleaning process, a thermal treatment process, a film forming process, and the like in addition to a lithography process are repeatedly performed. In the lithography process, a resist pattern is formed and the underlying layer of the pattern is processed by performing an etching process using the pattern as a mask.

An example of a processing sequence of forming a resist pattern on a wafer 200 will be described below with reference to FIGS. 30A to 30F.

In this example, a double pattern technology (DPT) of forming a pattern by performing two or more patterning steps is used. According to this DPT, it is possible to form a pattern finer than a pattern formed by one patterning step. In the processing sequence, a first resist pattern forming step of forming a first resist pattern 705 on a wafer 200, a silicon oxide film forming step of forming a silicon oxide film 706 as a first resist protecting film on the first resist pattern 705, and a second resist pattern forming step of forming a second resist pattern 709 on the silicon oxide film 706 are performed in this order. The steps will be described below.

First Resist Pattern Forming Step

In the first resist pattern forming step, the first resist pattern 705 is formed on a hard mask 702 formed on the wafer 200. First, a first resist 703 is applied onto the hard mask 702 formed on the wafer 200 (see FIG. 30A).

Figure 30A:
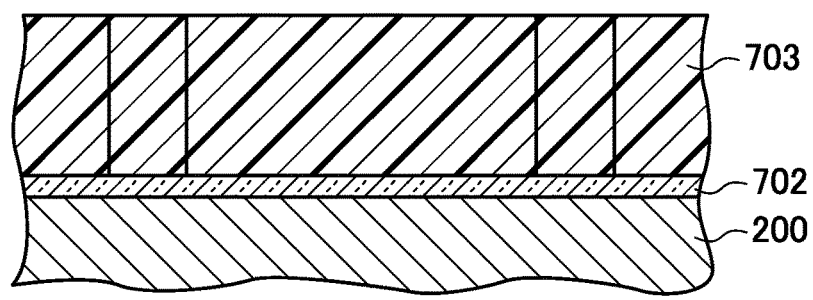
FIGS. 30A to 30F are longitudinal sectional views schematically illustrating a resist pattern forming method.
Figure 30B:
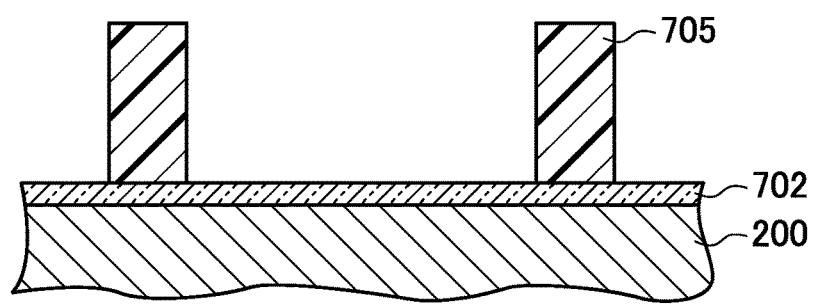

Then, by performing a baking process, a selective exposure process using a mask pattern based on a light source such as an ArF excimer laser source (193 nm) or a KrF excimer laser source (248 nm), a developing process, and the like, the first resist pattern 705 is formed (see FIG. 30B).

First Resist Protecting Film Forming Step

Figure 30C:
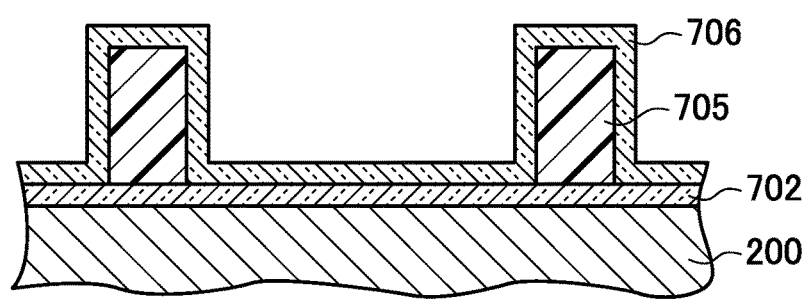

In the first resist protecting film forming step, a silicon oxide film 706 is formed as a protecting film of the first resist pattern 705 on the first resist pattern 705 formed in the first resist pattern forming step and on the hard mask 702 in which the first resist pattern 705 is not formed (see FIG. 30C). Accordingly, it is possible to prevent the variation in shape or variation in film quality of the first resist pattern 705 and to protect the first resist pattern from the solvent of a second resist 707. The formation of the silicon oxide film 706 is carried out using the substrate processing apparatus 101, details of which will be described later.

Second Resist Pattern Forming Step

In the second resist pattern forming step, the second resist pattern 709 is formed at a position other than the position at which the first resist pattern 705 is formed on the silicon oxide film 706 formed on the first resist pattern 705 in the first resist protecting film forming step. In this step, the same process as the first resist pattern forming step is performed.

Figure 30D:
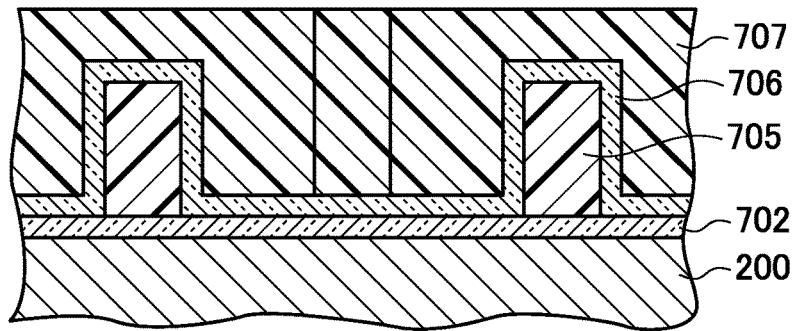

First, a second resist 707 is applied onto the silicon oxide film 706 which is the protecting film of the first resist pattern 705 (see FIG. 30D).

Figure 30E:
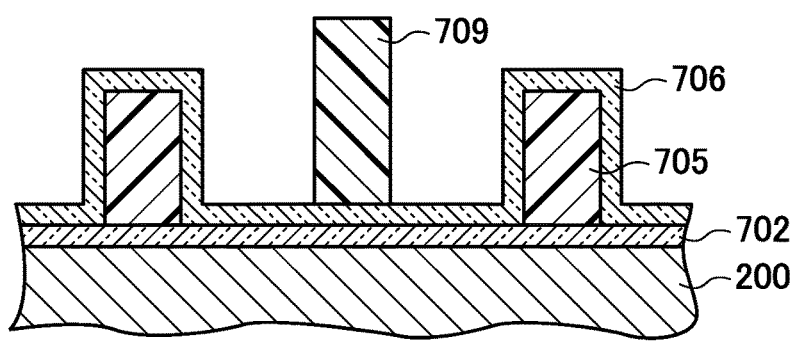

Then, by performing a baking process, a selective exposure process using a mask pattern based on a light source such as an ArF excimer laser source (193 nm) or a KrF excimer laser source (248 nm), a developing process, and the like, the second resist pattern 709 is formed (see FIG. 30E).

As described above, by performing the first resist pattern forming step, the first resist protecting film forming step, and the second resist pattern forming step, it is possible to form a fine resist pattern.

After forming the second resist pattern 709, a first resist protecting film removing step described below may be performed to remove the silicon oxide film 706 as needed after performing predetermined processes (such as size inspection, alignment inspection, and reworking)

First Resist Protecting Film Removing Step

Figure 30F:
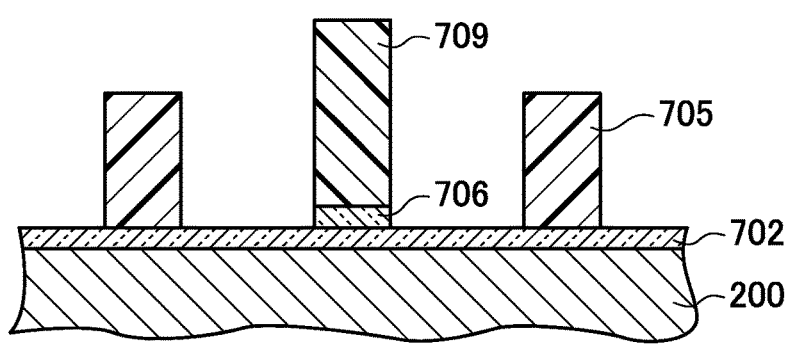

In the first resist protecting film removing step, the silicon oxide film 706 as the first resist protecting film formed in the first resist protecting film forming step is removed (see FIG. 30F).

The removing method is classified into two methods of a wet etching method and a dry etching method. In the case in which the silicon oxide film 706 is removed by the wet etching method, examples of the etchant include a diluted HF aqueous solution as a hydrofluoric acid (HF) liquid. In the case in which the silicon oxide film 604 is removed by the dry etching method, for example, oxygen plasma can be used.

The steps of forming a resist pattern two times has been stated above, but the resist pattern may be formed three times or more. In this case, the resist pattern forming step and the silicon oxide film forming step are repeatedly performed by a predetermined number of times. The formation of the silicon oxide film is also carried out using the substrate processing apparatus 101, details of which will be described later.

In the case in which the resist pattern is formed by three or more times, the silicon oxide film which is a protecting film may be removed every time, like the first resist pattern forming step→the first resist protecting film (first silicon oxide film) forming step→the second resist pattern forming step→the first resist protecting film (first silicon oxide film) removing step→the third resist pattern forming step→the second resist protecting film (second silicon oxide film) forming step→the fourth resist pattern forming step→the second resist protecting film (second silicon oxide film) removing step→the fifth resist pattern forming step→ . . . .

It has been described that the first resist pattern 705 is formed on the hard mask 702 formed on the wafer 200, but the hard mask 702 may not be formed. An ACL (Amorphous Carbon Layer) may be used instead of the resist. In the case in which the ACL is used, the processing temperature for forming a silicon oxide film protecting the ACL may be higher than that of the resist as long as it is equal to or lower than 200° C. When the processing temperature is equal to or lower than 200° C., it is possible to effectively prevent the reforming of the ACL due to the heating.

Another example of the processing sequence of forming a resist pattern on a wafer 200 will be described below with reference to FIGS. 31A to 31D.

In this example, a self-aligned double patterning technique (SASP) of forming a fine pattern using a sidewall is used.

Figure 31A:
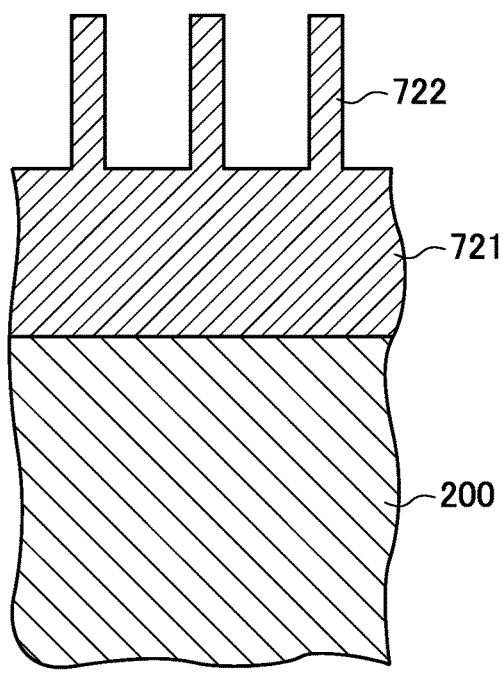
FIGS. 31A to 31D are longitudinal sectional views schematically illustrating another pattern forming method.

First, a resist 721 is formed on a wafer 200 and is patterned using a lithography process to form a first resist pattern 722 (see FIG. 31A).

Figure 31B:
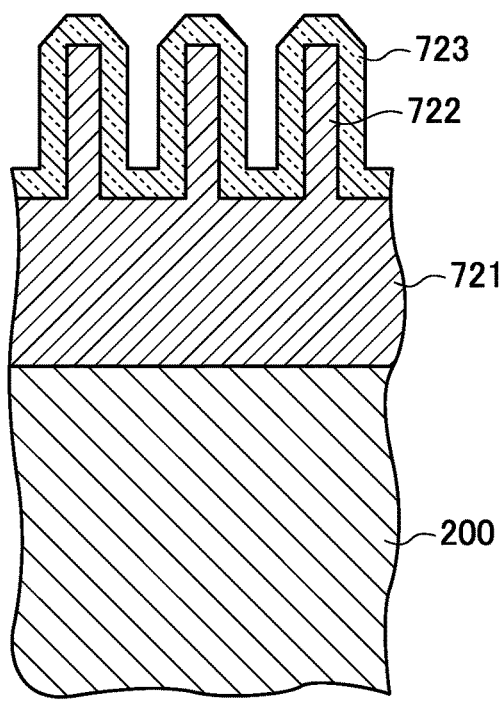

Then, a silicon oxide film 723 is formed on the first resist pattern 722 at a low temperature of 200° C. or lower (see FIG. 31B). The formation of the silicon oxide film 723 is carried out using the substrate processing apparatus 101, details of which will be described later.

Figure 31C:
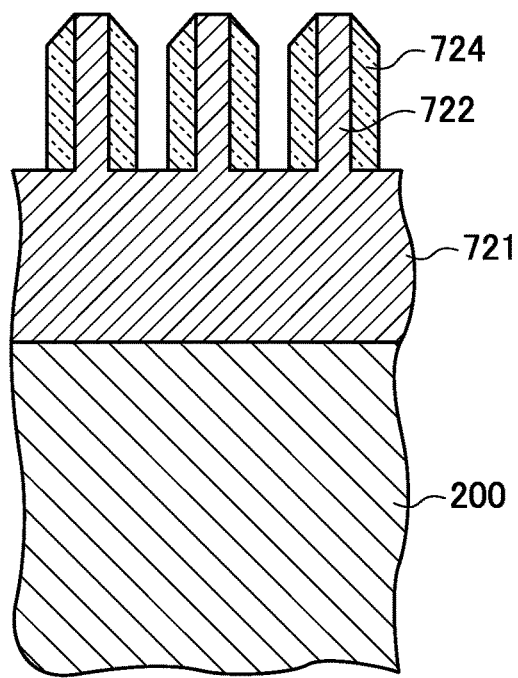

An anisotropic etching process is performed on the silicon oxide film 723 by a dry etching method to leave only the silicon oxide film 723 on the side wall of the resist pattern 722 as a sidewall 724 (see FIG. 31C).

Figure 31D:
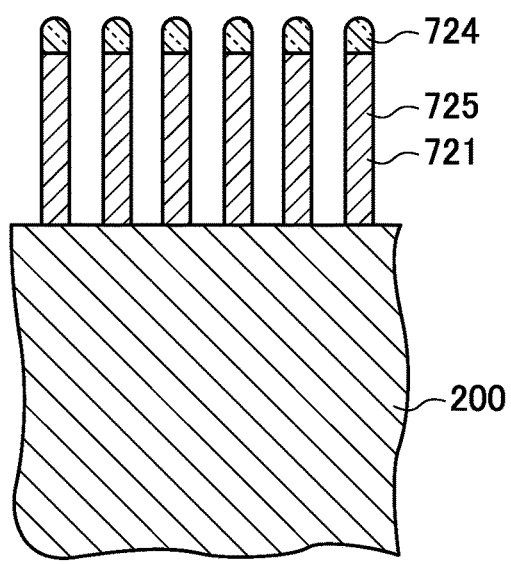

Then, the exposed resist 721 is anisotropically etched in the vertical direction by the use of a dry etching using the sidewall 724 of the silicon oxide film as a mask to form a fine pattern 725 formed of the resist 721 (see FIG. 31D).

An ACL (Amorphous Carbon Layer) may be used instead of the resist. In the case in which the ACL is used, the processing temperature for forming a silicon oxide film protecting the ACL may be higher than that of the resist as long as it is equal to or lower than 200° C. When the processing temperature is equal to or lower than 200° C., it is possible to effectively prevent the reforming of the ACL due to the heating.

An example in which the silicon oxide film 706 as the first resist protecting film or the silicon oxide film 723 as the etching mask is formed at a low temperature of 200° C. or lower by the use of the substrate processing apparatus 101 will be described.

In the CVD method of the CVD method and the ALD method, plural types of gas containing plural elements constituting a film to be formed are simultaneously supplied. In the ALD method, plural types of gas containing plural elements constituting a film to be formed are alternately supplied. By controlling the processing conditions such as a supply flow rate, a supply time, and plasma power at the time of supply, a silicon oxide film (SiO film) or a silicon nitride film (SiN film) is formed. In such a technique, the supply conditions are controlled so that the composition ratio of a film is a stoichiometric composition O/Si≈2, for example, when an SiO film is formed and the composition ratio of a film is a stoichiometric composition N/Si≈1.33.

On the other hand, unlike the ALD, the supply condition may be controlled so that the composition ratio of a film to be formed is a predetermined composition ratio different from the stoichiometric composition. That is, the supply condition is controlled so that at least one element among plural elements constituting the film to be formed is more excessive with respect to the stoichiometric composition than the other elements. In this way, the film may be formed while controlling the ratio of plural elements constituting the film to be formed, that is, controlling the composition ratio of the film. A sequence of forming a silicon oxide film having a stoichiometric composition by alternately supply plural types of gas containing different types of elements using the ALD method will be described below.

Figure 32:
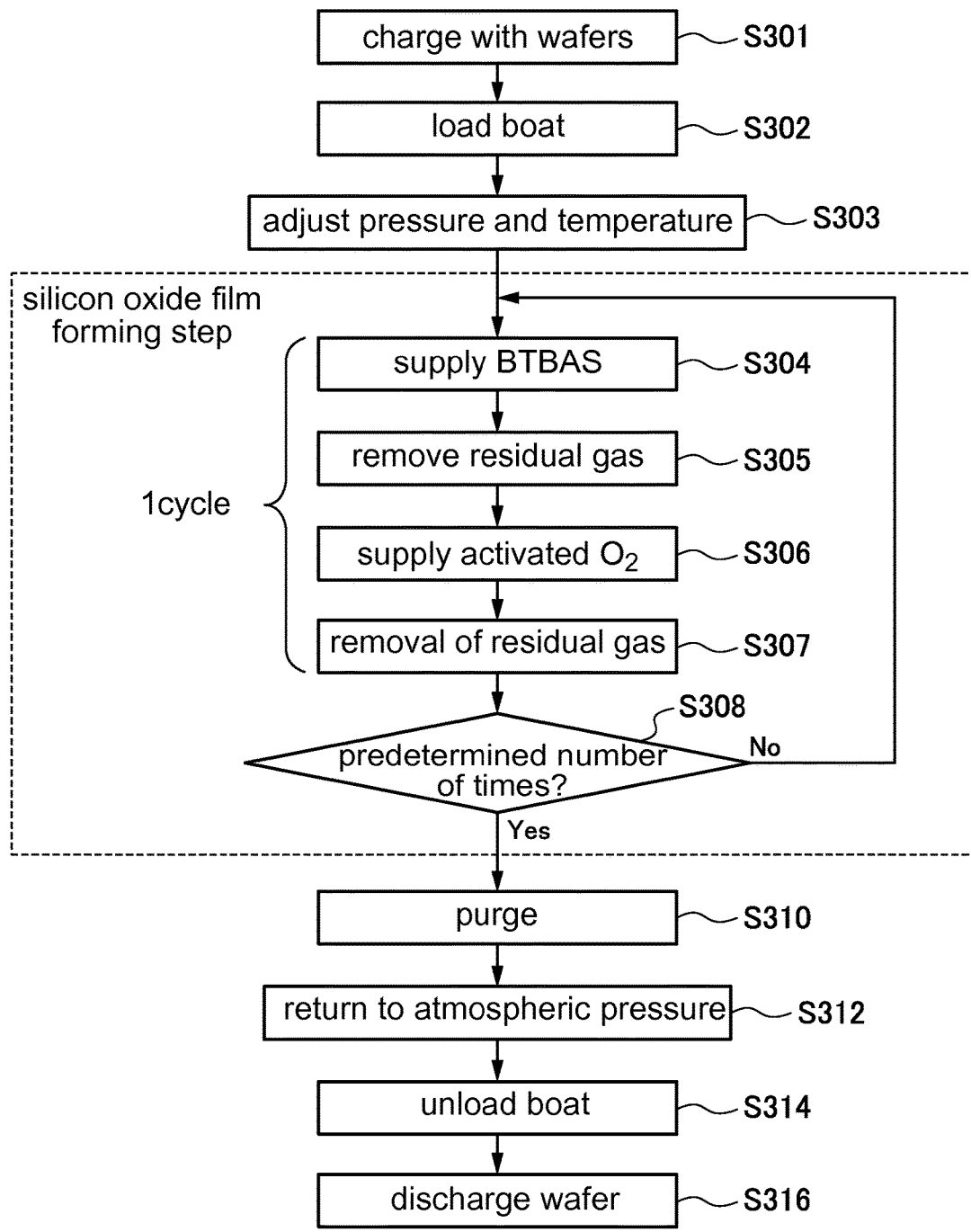
FIG. 32 is a flowchart illustrating a silicon oxide film forming process used to form a pattern.
Figure 33:
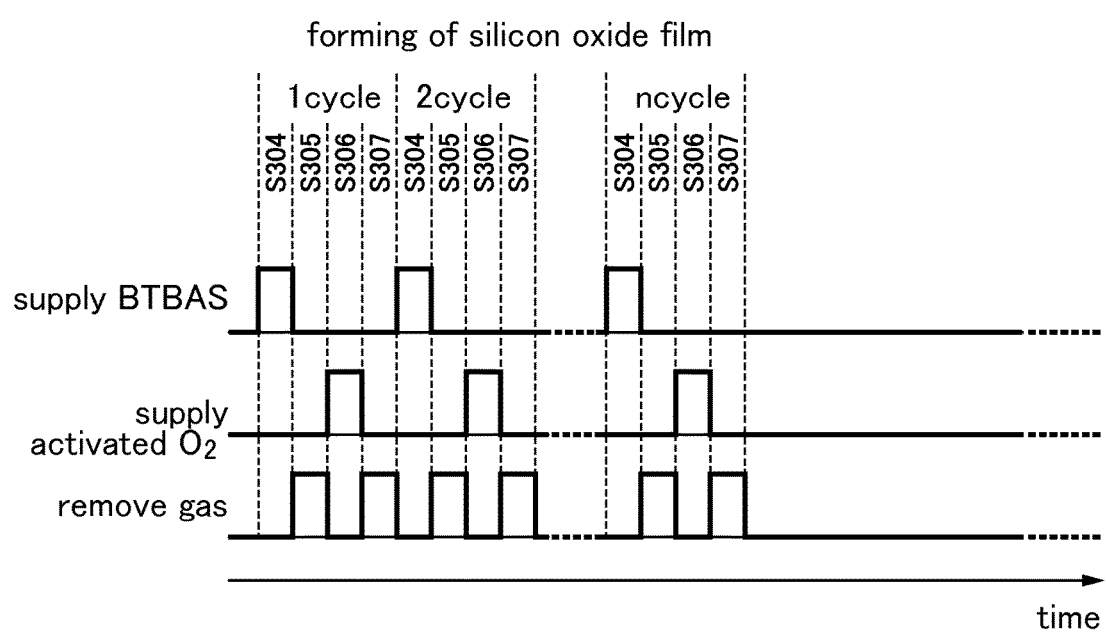
FIG. 33 is a timing diagram illustrating the silicon oxide film forming process used to form the pattern.

Here, an example in which a silicon oxide film as an insulating film is formed on a substrate using silicon (Si) as the first element, using oxygen (O) as the second element, using BTBAS gas, which is obtained by vaporizing a liquid material BTBAS ($SiH_2(NH(C_4H_9)_2$, bistertialbutylaminosilane), as a silicon-containing material containing the first element, and using $O_2$ gas which is an oxygen-containing gas as reaction gas containing the second element will be described with reference to FIGS. 32 to 33. FIG. 32 is a flowchart illustrating a silicon oxide film manufacturing process used to form a pattern. FIG. 33 is a timing diagram illustrating the silicon oxide film manufacturing process used to form a pattern.

First, the heating power source 250 supplying power to the heater 207 is controlled to maintain the temperature in the processing chamber 201 at a temperature of 200° C. or lower and more preferably at a temperature of 100° C. or lower, for example, at 100° C.

Thereafter, plural wafers 200 having first resist pattern 705 (see FIG. 30B) formed thereon or plural wafers 200 having first resist pattern 722 (see FIG. 31A) formed thereon are charged (wafer charging) in the boat 217 (step S301).

Thereafter, the vacuum pump 246 is started up. The furnace opening shutter 147 (see FIG. 1) is opened. The boat 217 supporting plural sheets of wafers 200 is elevated by the use of boat elevator 115 and is loaded (boat loading) into the processing chamber 201 (step S302). In this state, the sealing cap 219 seals the lower end of the reaction tube 203 through the use of the O ring 220. Thereafter, the boat 217 is made to rotate by the boat driving mechanism 267 to rotate the wafers 200.

Thereafter, the APC valve 243 is turned on to vacuum-suction the processing chamber 201 so as to reach a desired pressure (degree of vacuum) by the use of the vacuum pump 246. When the temperature of the wafer 200 reaches 100° C. and the temperature is stabilized (step S303), the subsequent steps are sequentially performed in the state in which the temperature in the processing chamber 201 is maintained at 100° C.

At this time, the pressure in the processing chamber 201 is measured by the use of the pressure sensor 245 and the aperture ratio of the APC valve 244 is controlled in a feedback manner on the basis of the measured pressure (pressure adjustment). The processing chamber 201 is heated by the heater 207 so as to reach a desired temperature. At this time, the power supply state from the heating power source 250 to the heater 207 is controlled in a feedback manner on the basis of the temperature information detected by the temperature sensor 263 so that the processing chamber 201 is at a desired temperature (temperature adjustment).

The silicon oxide film forming step of forming the silicon oxide films 706 (see FIG. 30C) and 723 (see FIG. 31B) is performed by supplying the BTBAS gas and the $O_2$ gas to the processing chamber 201. In the silicon oxide film forming step, the following four steps (S304 to S307) are sequentially and repeatedly performed. In this embodiment, the silicon oxide film is formed using the ALD method.

Supply of BTBAS: Step S304

In step S204, the BTBAS gas is supplied to the processing chamber 201 via the gas supply pipe 310 of the gas supply system 301 and the nozzle 410. The valve 313 is turned off and the valves 317 and 612 are turned on. The BTBAS is a liquid at the normal temperature, and the liquid BTBAS is adjusted in flow rate by the liquid mass flow controller 316, is supplied to the vaporizer 318, and is vaporized by the vaporizer 318. Before supplying the BTBAS to the processing chamber 201, the valve 313 is turned off and the valve 612, by which the BTBAS is made to flow in the vent line 610 via the valve 612.

When supplying the BTBAS to the processing chamber 201, the valve 612 is turned off and the valve 313 is turned on to supply the BTBAS to the gas supply line 310 downstream from the valve 313, and the valve 513 is turned on to supply carrier gas ($N_2$) from the carrier gas supply pipe 510. The flow rate of the carrier gas ($N_2$) is adjusted by the mass flow controller 512. The BTBAS is merged and mixed with the carrier gas ($N_2$) downstream from the valve 313, and the mixed gas is supplied to the processing chamber 201 via the gas supply holes 411 of the nozzle 410 and is discharged via the exhaust pipe 231. At this time, the APC valve 243 is appropriately adjusted to maintain the pressure in the processing chamber 201 in the range of 50 to 900 Pa, for example, at 300 Pa. The flow rate of BTBAS controlled by the liquid mass flow controller 312 is set to the range of 0.05 to 3.00 g/min, for example, 1.00 g/min. The time for which the water 200 is exposed to the BTBAS is set to the range of 2 to 6 seconds, for example, 3 seconds. The heating power source 250 supplying power to the heater 207 is controlled to maintain the temperature in the processing chamber 201 at a temperature of 200° C. or lower, preferably at a temperature of 100° C. or lower, and for example, at a temperature of 100° C.

At this time, the gas flowing in the processing chamber 201 is only BTBAS and $N_2$ which is inert gas and $O_2$ is not present. Accordingly, the BTBAS does not cause a gas-phase reaction and performs a surface reaction (chemical adsorption) with the surface of the wafer 200 of the underlying film to form a raw material (BTBAS) adsorbed layer (hereinafter, referred to as an Si-containing layer). The chemical adsorption layer of BTBAS includes a discontinuous chemical adsorption layer as well as a continuous adsorption layer of BTBAS molecules.

At the same time, when the valve 523 is turned off to cause $N_2$ (inert gas) to flow from the carrier gas supply pipe 520 connected to the middle of the gas supply tube 320, it is possible to prevent the BTBAS to flow around to the $O_2$-side nozzle 420, the buffer chamber 423, or the gas supply pipe 320. Similarly, at the same time, when the valve 533 is turned off to cause $N_2$ (inert gas) to flow from the carrier gas supply pipe 530 connected to the middle of the gas supply tube 330, it is possible to prevent the BTBAS to flow around to the $O_2$-side nozzle 430, the buffer chamber 433, or the gas supply pipe 330. Since it is intended to prevent the BTBAS from flowing around, the flow rate of $N_2$ (inert gas) controlled by the mass flow controllers 522 and 532 may be small.

Removal of Residual Gas: Step S305

In step S305, the residual gas such as residual BTBAS is removed from the processing chamber 201. The valve 313 of the gas supply pipe 310 is turned off to stop the supply of BTBAS to the processing chamber 201 and the valve 612 is turned on to cause BTBAS to flow in the vent line 610. At this time, the APC valve 243 of the exhaust pipe 231 is fully turned on and the processing chamber 201 is exhausted up to 20 Pa or lower by the use of the vacuum pump 246 to remove the residual gas such as residual BTBAS remaining in the processing chamber 201 from the processing chamber 201. At this time, when inert gas such as $N_2$ is supplied to the processing chamber 201 from the gas supply pipe 310 which is a BTBAS supply line and the gas supply pipes 320 and 330, the effect of removing the residual gas such as residual BTBAS is improved.

Supply of $O_2$ Activated by Plasma: Step S306

In step S306, the $O_2$ gas is supplied to the buffer chamber 423 from the gas supply pipe 320 of the gas supply system 302 via the gas supply holes 421 of the nozzle 420 and the $O_2$ gas is supplied to the buffer chamber 433 from the gas supply pipe 330 of the gas supply system 303 via the gas supply holes 431 of the nozzle 430. At this time, by applying RF power across the rod-like electrode 471 and the rod-like electrode 472 from the RF power source 270 via the matching unit 271, the $O_2$ gas supplied to the buffer chamber 423 is excited by plasma, is supplied as active species to the processing chamber 201 via the gas supply holes 425, and is exhausted via the gas exhaust pipe 231. By applying RF power across the rod-like electrode 481 and the rod-like electrode 482 from the RF power source 270 via the matching unit 271, the $O_2$ gas supplied to the buffer chamber 433 is excited by plasma, is supplied as active species to the processing chamber 201 via the gas supply holes 435, and is exhausted via the gas exhaust pipe 231.

$O_2$ is adjusted in flow rate by the mass flow controller 322 and is supplied to the buffer chamber 423 from the gas supply pipe 320. $O_2$ is adjusted in flow rate by the mass flow controller 332 and is supplied to the buffer chamber 433 from the gas supply pipe 330. Before $O_2$ is supplied to the buffer chamber 423, the valve 323 is turned off and the valve 622 is turned on, by which $O_2$ is made to flow to the vent line 620 via the valve 622. Before $O_2$ is supplied to the buffer chamber 433, the valve 333 is turned off and the valve 632 is turned on, by which $O_2$ is made to flow to the vent line 630 via the valve 632. When supplying $O_2$ to the buffer chamber 423, the valve 622 is turned off and the valve 323 is turned on, by which $O_2$ is supplied to the gas supply pipe 320 downstream from the valve 323. At the same time, the valve 523 is turned on, by which carrier gas ($N_2$) is supplied from the carrier gas supply pipe 520. The flow rate of the carrier gas ($N_2$) is adjusted by the mass flow controller 522. $O_2$ is merged and mixed with the carrier gas ($N_2$) downstream from the valve 323 and the mixed gas is supplied to the buffer chamber 423 via the nozzle 420. When supplying $O_2$ to the buffer chamber 433, the valve 632 is turned off and the valve 333 is turned on, by which $O_2$ is supplied to the gas supply pipe 330 downstream from the valve 333. At the same time, the valve 533 is turned on, by which carrier gas ($N_2$) is supplied from the carrier gas supply pipe 530. The flow rate of the carrier gas ($N_2$) is adjusted by the mass flow controller 532. $O_2$ is merged and mixed with the carrier gas ($N_2$) downstream from the valve 333 and the mixed gas is supplied to the buffer chamber 433 via the nozzle 430.

When the $O_2$ gas is excited by plasma and is made to flow as active species, the APC valve 243 is appropriately adjusted to set the pressure in the processing chamber 201 to a pressure in the range of 50 to 900 Pa, for example, 500 Pa. The supply flow rate of the $O_2$ gas controlled by the mass flow controller 322 is set to a flow rate in the range of 2000 to 9000 sccm, for example, 6000 sccm. The flow rate of the $O_2$ gas controlled by the mass flow controller 332 is set to a flow rate in the range of 2000 to 9000 sccm, for example, 6000 sccm. The time for exposing the wafers 200 to the active species obtained by exciting the $O_2$ gas by plasma, that is, the gas supply time, is set to a time in the range of 3 to 20 seconds, for example, 9 seconds. The RF power applied across the rod-like electrode 471 and the rod-like electrode 472 from the RF power source 270 is set to power in the range of 20 to 600 W, for example, 200 W. The RF power applied across the rod-like electrode 481 and the rod-like electrode 482 from the RF power source 270 is set to power in the range of 20 to 600 W, for example, 200 W. The heating power source 250 supplying power to the heater 207 is controlled to maintain the processing chamber 201 at a temperature of 200° C. or lower, preferably at a temperature of 100° C. or lower, and for example, at 100°. Since the reaction temperature of the $O_2$ gas itself is high and the $O_2$ gas does not react well at the above-mentioned wafer temperature and the pressure of the processing chamber, the $O_2$ gas is excited by plasma and is made to flow as active species. Accordingly, the temperature of the wafer 200 can be set to a low temperature range set as described above. However, since the change in temperature takes time, it is preferable that the temperature of the wafer is set to be equal to the temperature at the time of supplying the BTBAS gas.

At this time, the gas flowing in the processing chamber 201 is the active species ($O_2$ plasma) obtained by exciting the $O_2$ gas by plasma and the BTBAS gas is not made to flow in the processing chamber 201. Accordingly, the $O_2$ gas does not cause a gas-phase reaction and the $O_2$ gas changed to active species or activated reacts with a silicon-containing layer as the first layer formed on the wafer 200 in step S204. Accordingly, the silicon-containing layer is oxidized and is deformed into a second layer containing silicon (the first element) and nitrogen (the second element), that is, a silicon oxide layer (SiO layer).

When the valve 513 is turned on to cause $N_2$ (inert gas) to flow from the carrier gas supply pipe 510 connected to the middle of the gas supply pipe 310, it is possible to prevent $O_2$ from going around to the BTBAS-side nozzle 410 or the gas supply pipe 310. Since it is intended to prevent $O_2$ from going around, the flow rate of $N_2$ (inert gas) controlled by the mass flow controller 512 may be small.

Removal of Residual Gas: Step S307

In step S307, the residual gas such as residual $O_2$ not reacting or remaining after the oxidation is removed from the processing chamber 201. The valve 323 of the gas supply pipe 320 is turned off to stop the supply of $O_2$ to the processing chamber 201, the valve 622 is turned on to cause $O_2$ to flow to the vent line 620, the valve 333 of the gas supply pipe 330 is turned off to stop the supply of $O_2$ to the processing chamber 201, and the valve 632 is turned on to cause $O_2$ to flow to the vent line 630. At this time, the APC valve 243 of the exhaust pipe 231 is fully turned on and the processing chamber 201 is exhausted up to 20 Pa or lower by the use of the vacuum pump 246 to remove the residual gas such as residual $O_2$ remaining in the processing chamber 201 from the processing chamber 201. At this time, when inert gas such as $N_2$ is supplied to the processing chamber 201 from the gas supply pipes 320 and 330 which are $O_2$ supply lines and the gas supply line 310, the effect of removing the residual gas such as residual $O_2$ is improved.

By setting steps S304 to S307 as one cycle and performing at least one cycle (step S308), the silicon oxide film 706 (see FIG. 30C) or the silicon oxide film 723 (see FIG. 31B) with a predetermined thickness is formed on the wafer 200 by the use of the ALD method.

By setting steps S304 to S307 as one cycle and performing at least one cycle, the silicon oxide film 706 (see FIG.

30C) containing silicon (the first element) and oxygen (the second element) with a predetermined thickness is formed as the first resist protecting film on the first resist pattern 705 and the hard mask 702 and the silicon oxide film 723 (see FIG. 31B) is formed on the first resist pattern 722.

When the film forming process of forming the silicon oxide film 706 or the silicon oxide film 723 with the predetermined thickness is performed, the processing chamber 201 is purged with inert gas by exhausting the processing chamber 201 while supplying inert gas such as $N_2$ to the processing chamber 201 (gas purging step: step S310). The gas purging step is preferably carried out by repeatedly performing both the supply of inert gas such as $N_2$ to the processing chamber 201 which is performed by turning off the APC valve 243 and turning on the valves 513, 523, and 533 after removing the residual gas and the vacuum suction of the processing chamber 201 which is performed by turning off the valves 513, 523, and 533 to stop the supply of the inert gas such as $N_2$ to the processing chamber and turning on the APC valve 243.

Thereafter, the boat rotating mechanism 267 is stopped to stop the rotation of the boat 217. Thereafter, the valves 513, 523, and 533 are turned on to replace the atmosphere of the processing chamber 201 with the inert gas such as $N_2$ (replacement with inert gas) and to return the pressure in the processing chamber 201 to the normal pressure (return to atmospheric pressure: step S312). Thereafter, the sealing cap 219 is elevated down by the boat elevator 115 to open the lower end of the reaction tube 203 and the boat 217 is unloaded to the outside of the processing chamber 201 from the lower end of the reaction tube 203 in the state in which the processed wafers 200 are held in the boat 217 (unloading of boat: step S314). Thereafter, the lower end of the reaction tube 203 is closed with the furnace opening shutter 147. Thereafter, the vacuum pump 246 is stopped. Thereafter, the processed wafers 200 are taken out of the boat 217 (discharging of wafer: step S316). Accordingly, a film forming process (batch process) is ended.

Figure 34:
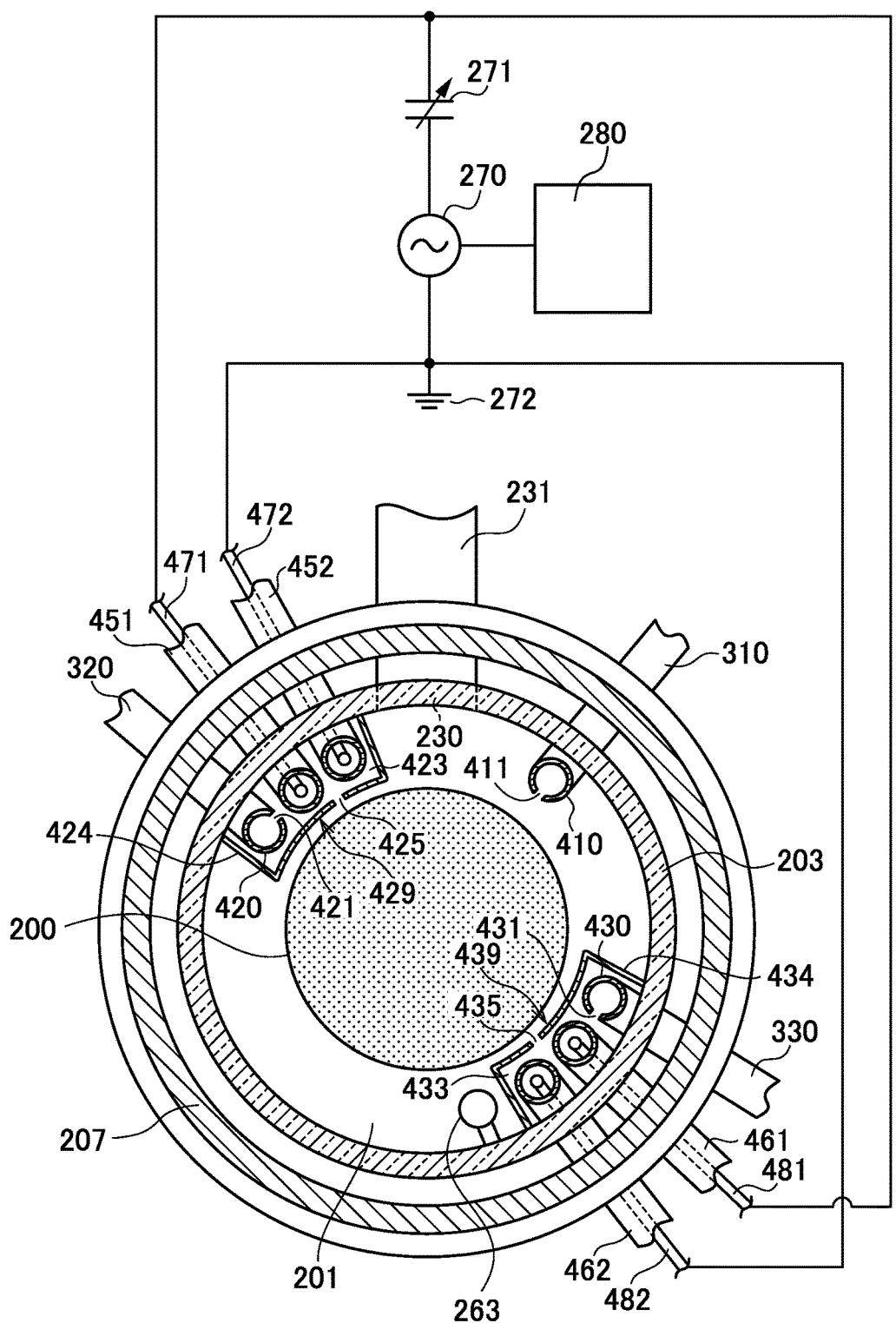
FIG. 34 is a schematic transverse sectional view illustrating a modification of the ninth exemplary embodiment of the invention.

A modification of the ninth embodiment will be described below with reference to FIG. 34.

In the ninth embodiment, the first plasma generating structure 429 constituted by the rod-like electrode 471, the rod-like electrode 472, the electrode protecting pipe 451, the electrode protecting pipe 452, the buffer chamber 423, and the gas supply holes 425 and the second plasma generating structure 439 constituted by the rod-like electrode 481, the rod-like electrode 482, the electrode protecting pipe 461, the electrode protecting pipe 462, the buffer chamber 433, and the gas supply holes 435 are symmetric with the line passing through the center of the wafers 200 (the center of the reaction tube 203), the exhaust hole 230 is disposed in the line passing through the centers of the wafers 200 (the center of the reaction tube 203), the gas supply holes 411 of the nozzle 410 are disposed in the line passing through the centers of the wafers 200 (the center of the reaction tube 203), and the first plasma generating structure 429 and the second plasma generating structure 439 are disposed in the vicinity of the exhaust hole 230. This modification is different from the ninth embodiment, in that the first plasma generating structure 429 and the second plasma generating structure 439 are disposed at the positions (different by 180°) opposed to each other with the wafers 200 interposed therebetween, are disposed symmetric about the center of the wafer 200 and the center of the reaction tube 203, and the nozzle 410 is disposed between the exhaust hole 230 and the second plasma generating structure 439, but is the same as the ninth embodiment in the other points.

In this modification, the first plasma source constituted by the rod-like electrode 471, the rod-like electrode 472, the electrode protecting pipe 451, the electrode protective pipe 452, the matching unit 271, and the RF power source 270 and the second plasma source constituted by the rod-like electrode 481, the rod-like electrode 482, the electrode protecting pipe 461, the electrode protective pipe 462, the matching unit 271, and the RF power source 270 are provided. Therefore, compared with the case in which only one plasma source is provided, it is possible to lower the input power density per unit volume of the RF power by distributing and supplying the RF power to plural plasma sources, and thus to reduce the number of particles generated, thereby improving the adhesion. Further, since the RF power supplied to the plasma sources can be reduced, the damage to the wafers 200 or the films formed on the wafers 200 can be reduced. Even when the RF power supplied to the plasma sources is reduced, a sufficient amount of plasma to process a substrate can be generated by the two plasma sources, thereby lowering the processing temperature of the wafers 200.

Since the first plasma generating structure 429 constituted by the rod-like electrode 471, the rod-like electrode 472, the electrode protecting pipe 451, the electrode protective pipe 452, the buffer chamber 423, and the gas supply holes 425 and the second plasma generating structure 439 constituted by the rod-like electrode 481, the rod-like electrode 482, the electrode protecting pipe 461, the electrode protective pipe 462, the buffer chamber 433, and the gas supply holes 435 are disposed at the positions (different by 180°) opposed to each other with the wafers 200 interposed therebetween and are disposed symmetric about the center of the wafer 200 and the center of the reaction tube 203, it is easy to supply plasma uniformly to the entire surfaces of the wafers 200 from both plasma generating structures and it is thus possible to form a uniform film on the wafers 200.

Another modification of the ninth embodiment will be described below with reference to FIG. 35.

In the ninth embodiment, the first plasma generating structure 429 constituted by the rod-like electrode 471, the rod-like electrode 472, the electrode protecting pipe 451, the electrode protecting pipe 452, the buffer chamber 423, and the gas supply holes 425 and the second plasma generating structure 439 constituted by the rod-like electrode 481, the rod-like electrode 482, the electrode protecting pipe 461, the electrode protecting pipe 462, the buffer chamber 433, and the gas supply holes 435 are symmetric with respect to the line passing through the center of the wafers 200 (the center of the reaction tube 203) and the gas supply holes 411 of the nozzle 410 are disposed in the line passing through the centers of the wafers 200 (the center of the reaction tube 203). This modification is different from the ninth embodiment, in that the first plasma generating structure 429 and the second plasma generating structure 439 are disposed symmetric with respect to the line passing through the centers of the wafers 200 (the center of the reaction tube 203) but the gas supply holes 411 of the nozzle 410 are not disposed in the line passing through the centers of the wafers 200 (the center of the reaction tube 203), but is the same as the ninth embodiment in the other points.

In this modification, the first plasma source constituted by the rod-like electrode 471, the rod-like electrode 472, the electrode protecting pipe 451, the electrode protective pipe 452, the matching unit 271, and the RF power source 270 and the second plasma source constituted by the rod-like electrode 481, the rod-like electrode 482, the electrode protecting pipe 461, the electrode protective pipe 462, the matching unit 271, and the RF power source 270 are provided. Therefore, compared with the case in which only one plasma source is provided, it is possible to lower the input power density per unit volume of the RF power by distributing and supplying the RF power to plural plasma sources, and thus to reduce the number of particles generated, thereby improving the adhesion. Further, since the RF power supplied to the plasma sources can be reduced, the damage to the wafers 200 or the films formed on the wafers 200 can be reduced. Even when the RF power supplied to the plasma sources is reduced, a sufficient amount of plasma to process a substrate can be generated by the two plasma sources, thereby lowering the processing temperature of the wafers 200.

Since the first plasma generating structure constituted by the rod-like electrode 471, the rod-like electrode 472, the electrode protecting pipe 451, the electrode protective pipe 452, the buffer chamber 423, and the gas supply holes 425 and the second plasma generating structure constituted by the rod-like electrode 481, the rod-like electrode 482, the electrode protecting pipe 461, the electrode protective pipe 462, the buffer chamber 433, and the gas supply holes 435 are disposed symmetric with respect to a line passing through the center of the wafers 200 (the center of the reaction tube 203), it is easy to supply plasma uniformly to the entire surfaces of the wafers 200 from both plasma generating structures and it is thus possible to form a uniform film on the wafers 200.

Figure 36:
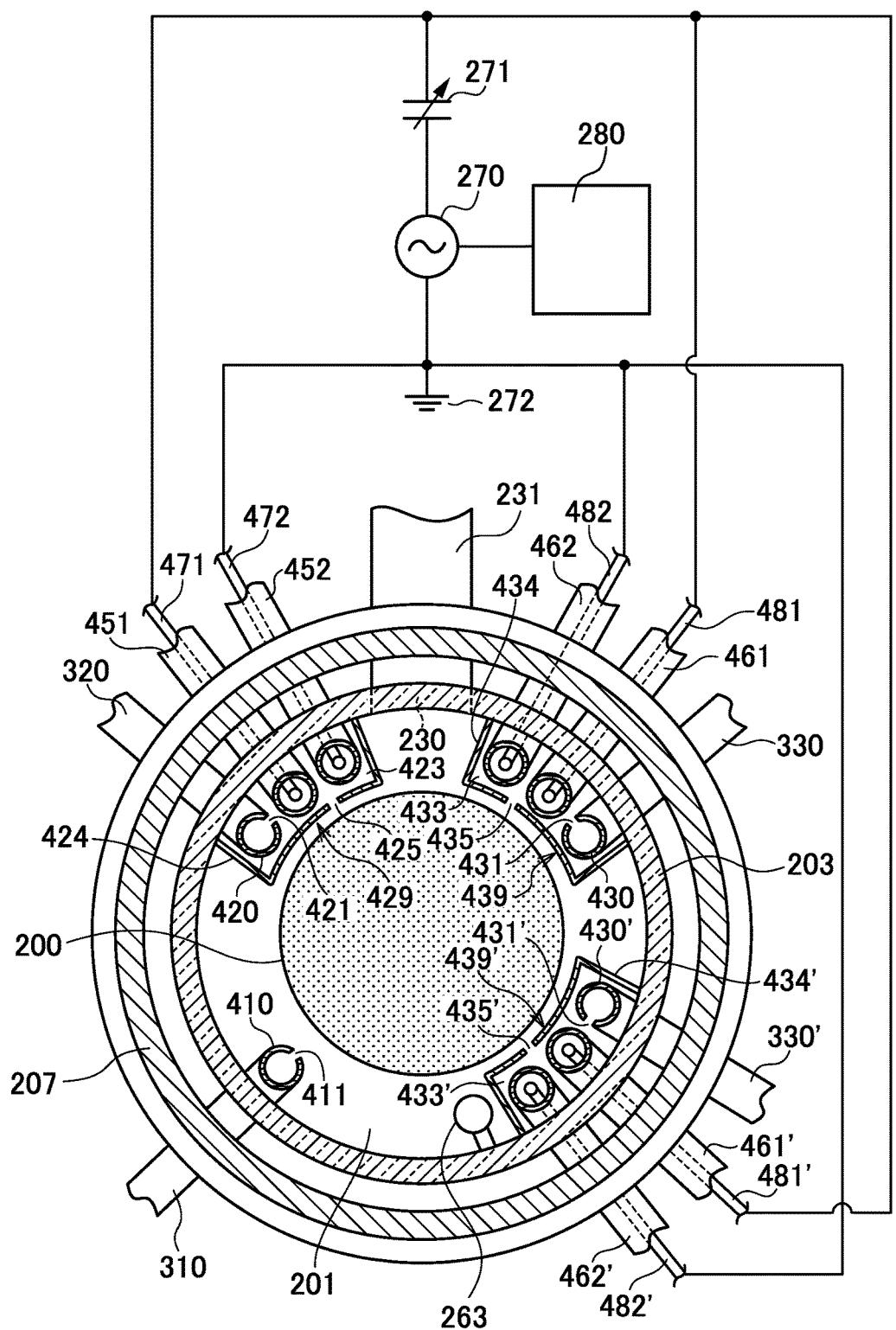
FIG. 36 is a schematic transverse sectional view illustrating still another modification of the ninth exemplary embodiments of the invention.

Still another modification of the embodiment will be described below with reference to FIG. 36.

Figure 35:
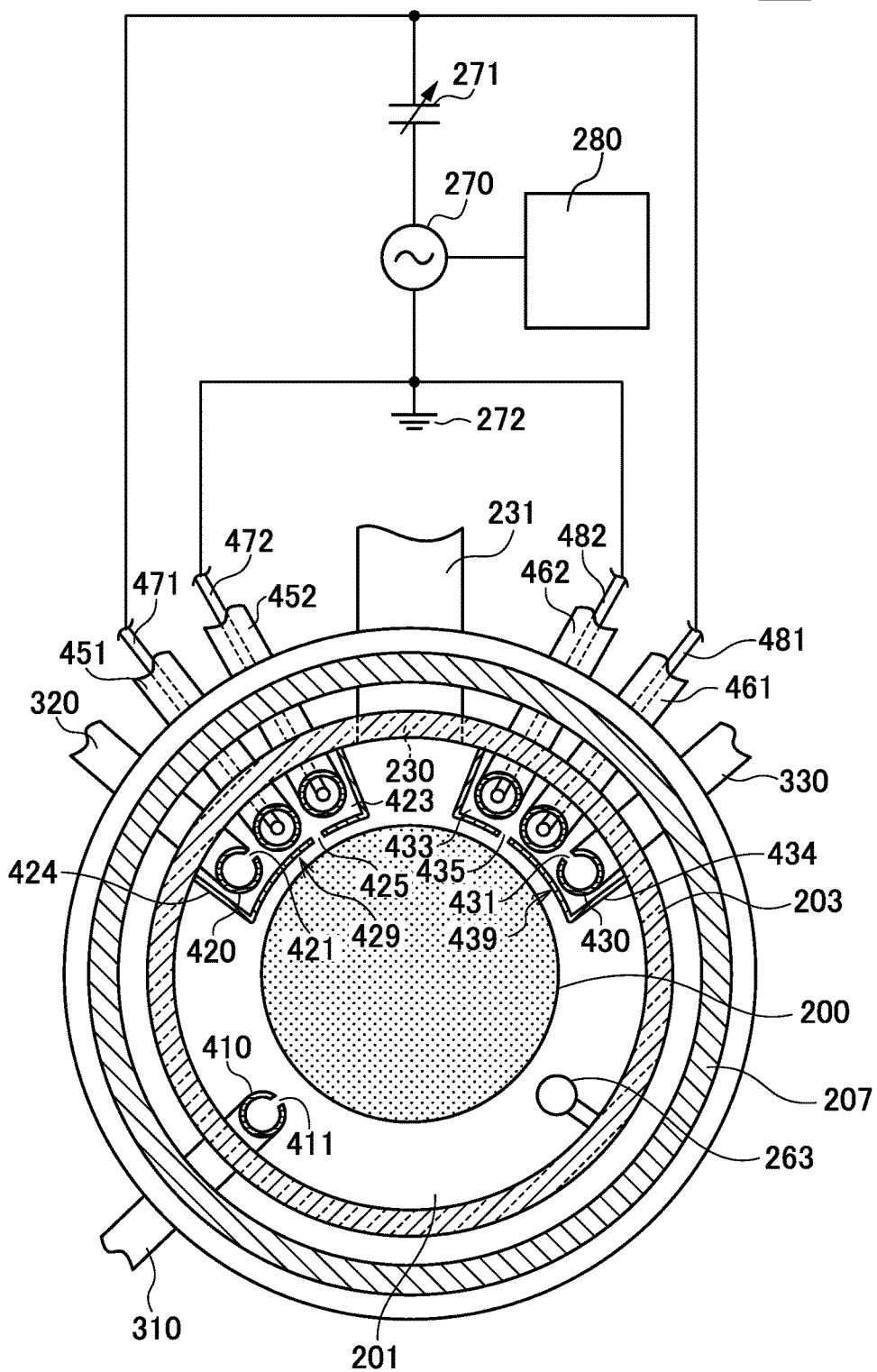
FIG. 35 is a schematic transverse sectional view illustrating another modification of the ninth exemplary embodiment of the invention.

In this modification, a third plasma generating structure 439' constituted by a rod-like electrode 481', a rod-like electrode 482', an electrode protecting pipe 461', an electrode protecting pipe 462', a buffer chamber 433', and a gas supply holes 435' and having the same structure as the second plasma generating structure 439 constituted by the rod-like electrode 481, the rod-like electrode 482, the electrode protecting pipe 461, the electrode protecting pipe 462, the buffer chamber 433, and the gas supply holes 435 is added to the modification shown in FIG. 35, and the third plasma generating structure 439' and the first plasma generating structure 429 constituted by the rod-like electrode 471, the rod-like electrode 472, the electrode protecting pipe 451, the electrode protecting pipe 452, the buffer chamber 423, and the gas supply holes 425 are disposed to be symmetric with respect to the line passing through the center of the wafers 200 and the center of the reaction tube 203.

In this modification, the third plasma source constituted by the rod-like electrode 481', the rod-like electrode 482', the electrode protecting pipe 461', the electrode protective pipe 462', the matching unit 271, and the RF power source 270 is added to the first plasma source constituted by the rod-like electrode 471, the rod-like electrode 472, the electrode protecting pipe 451, the electrode protective pipe 452, the matching unit 271, and the RF power source 270 and the second plasma source constituted by the rod-like electrode 481, the rod-like electrode 482, the electrode protecting pipe 461, the electrode protective pipe 462, the matching unit 271, and the RF power source 270. Therefore, compared with the case in which two plasma sources are provided, it is possible to still lower the input power density per unit volume of the RF power by distributing and supplying the RF power to the three plasma sources, and thus to further reduce the number of particles generated, thereby further improving the adhesion. Further, since the RF power supplied to the plasma sources can be further reduced, the damage to the wafers 200 or the films formed on the wafers 200 can be further reduced. Even when the RF power supplied to the plasma sources is reduced, a sufficient amount of plasma to process a substrate can be generated by the three plasma sources, thereby lowering the processing temperature of the wafers 200.

Tenth Embodiment

Figure 37:
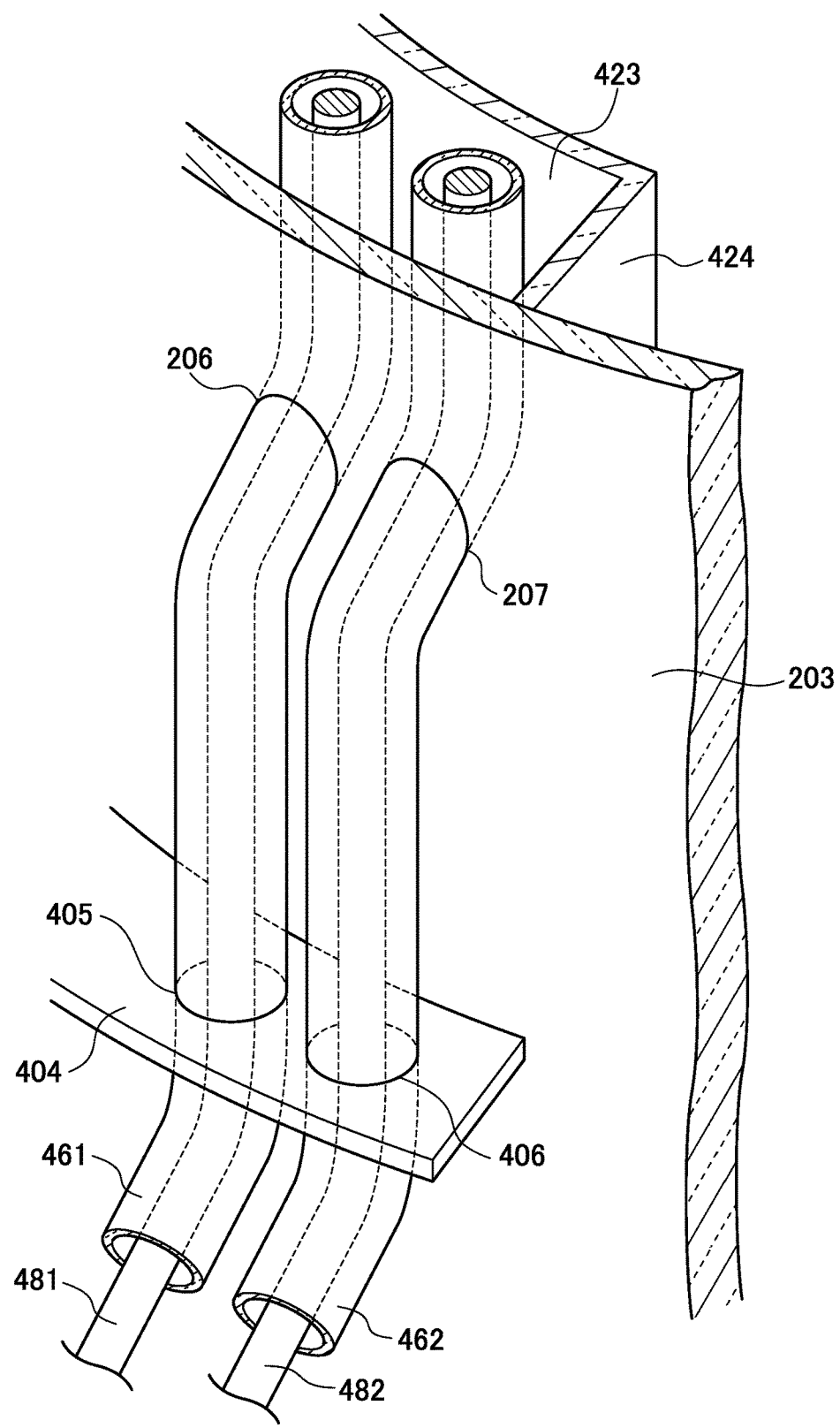
FIG. 37 is a partially-enlarged schematic perspective view for explaining a tenth embodiment of the invention.
Figure 38:
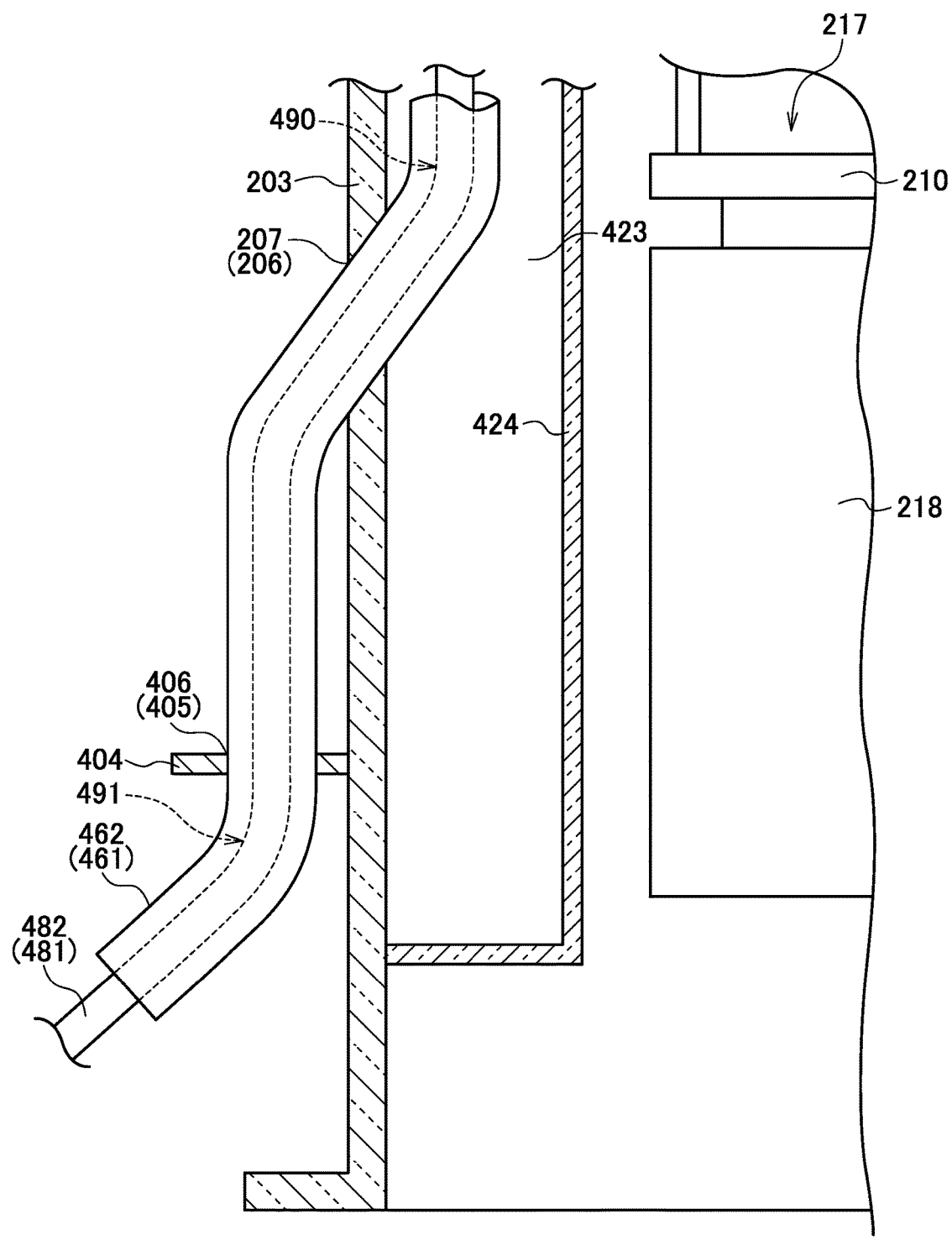
FIG. 38 is a partially-enlarged schematic longitudinal sectional view for explaining the tenth embodiment of the invention.

A tenth embodiment of the invention will be described below with reference to FIGS. 37 and 38.

In the ninth embodiment, the electrode protecting pipe 461 and the electrode protecting pipe 462 are inserted into the buffer chamber 423 via the through-holes 204 and 205 formed in the reaction tube 203 at a height position close to the lower part of the boat support 218, the rod-like electrodes 481 and 482 are inserted into the buffer chamber 423 at the height position close to the lower part of the boat support 218, the electrode protecting pipe 461 and the electrode protecting pipe 462 are fixed to the buffer chamber 423 by the use of the attachment plate 401, and the electrode protecting pipes 451 and 452 and the rod-like electrodes 471 and 472 are the same structures as the electrode protecting pipes 461 and 462 and the rod-like electrodes 481 and 482. This embodiment is different from the ninth embodiment, in that the electrode protecting pipe 461 and the electrode protecting pipe 462 are inserted into the buffer chamber 423 via the through-holes 206 and 207 formed in the reaction tube 203 at a position lower than the height of the upper part (a part slightly lower than the lowermost wafer of the stacked wafers) of the boat support 218 and are disposed outside the reaction tube 203 at a position lower than the height of the upper part (a part slightly lower than the lowermost wafer of the stacked wafers) of the boat support 218, the rod-like electrodes 481 and 482 are inserted into the buffer chamber 423 at the height position close to the upper part of the boat support 218 and are disposed outside the reaction tube 203 at a position lower than the height of the upper part (a part slightly lower than the lowermost wafer of the stacked wafers) of the boat support 218, the electrode protecting pipe 461 and the electrode protecting pipe 462 are disposed outside the reaction tube 203 to pass through holes 405 and 406 of the attachment plate 401 and are fixed by the attachment plate 401, the attachment plate 401 is fixed to the reaction tube 203, and the electrode protecting pipes 451 and 452 and the rod-like electrodes 471 and 472 have the same structure as the electrode protecting pipes 461 and 462 and the rod-like electrodes 481 and 482, but is the same in the other points. In this embodiment, since the rod-like electrodes 481 and 482 are inserted into the buffer chamber 423 at the height position close to the upper part of the boat support 218 and are disposed outside the reaction tube 203 at the position lower than the height position of the upper part (a part slightly lower than the lowermost wafer of the stacked wafers) of the boat support 218, it is possible to prevent the discharge at the position lower than the height position of the upper part (a part slightly lower than the lowermost wafer of the stacked wafers) of the boat support 218. The curvature of a curved portion 491 of the rod-like electrode 482 (481, 471, and 472) is greater than the curvature of a curved portion 490.

Eleventh Embodiment

Figure 39:
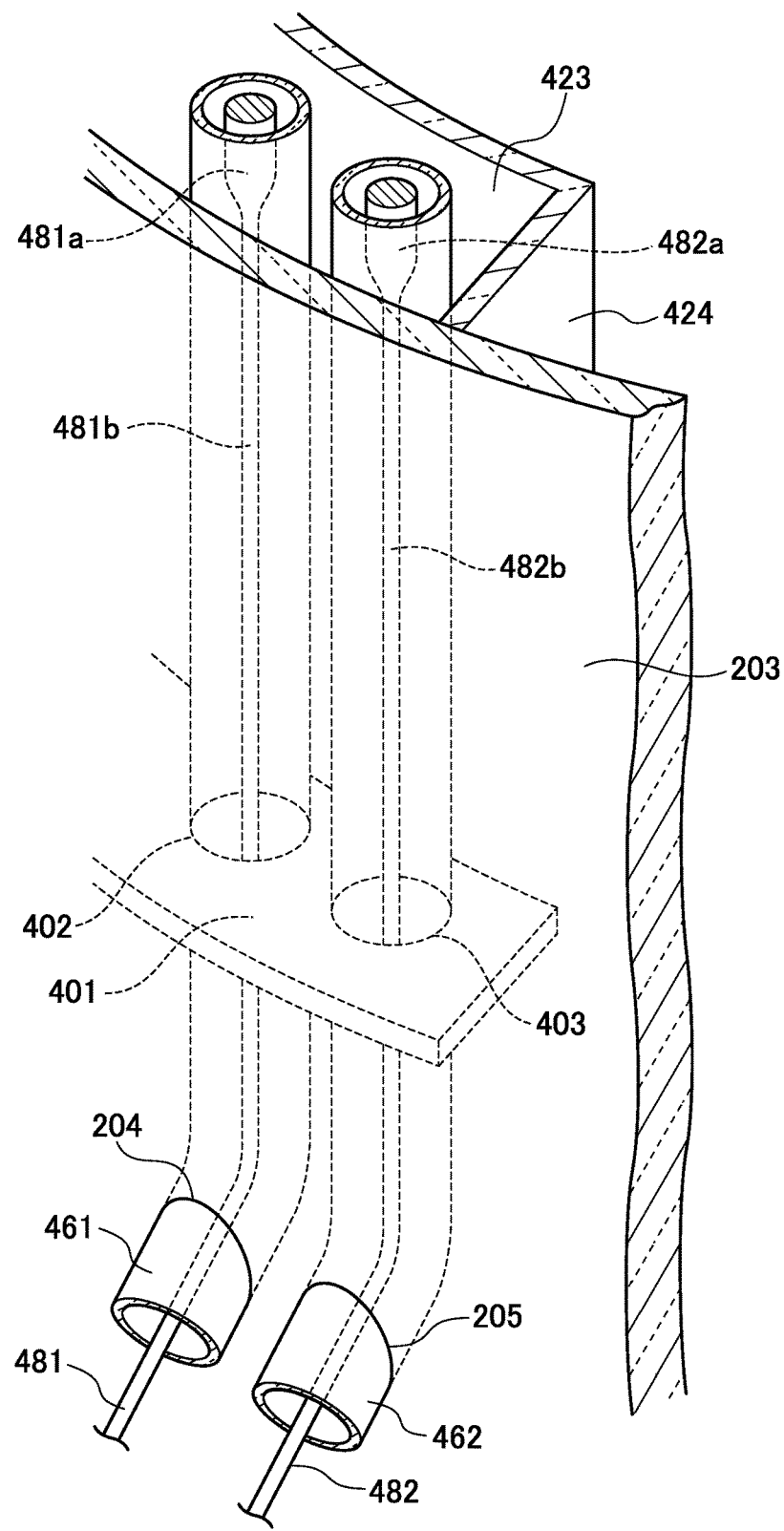
FIG. 39 is a partially-enlarged schematic perspective view for explaining an eleventh embodiment of the invention.
Figure 40:
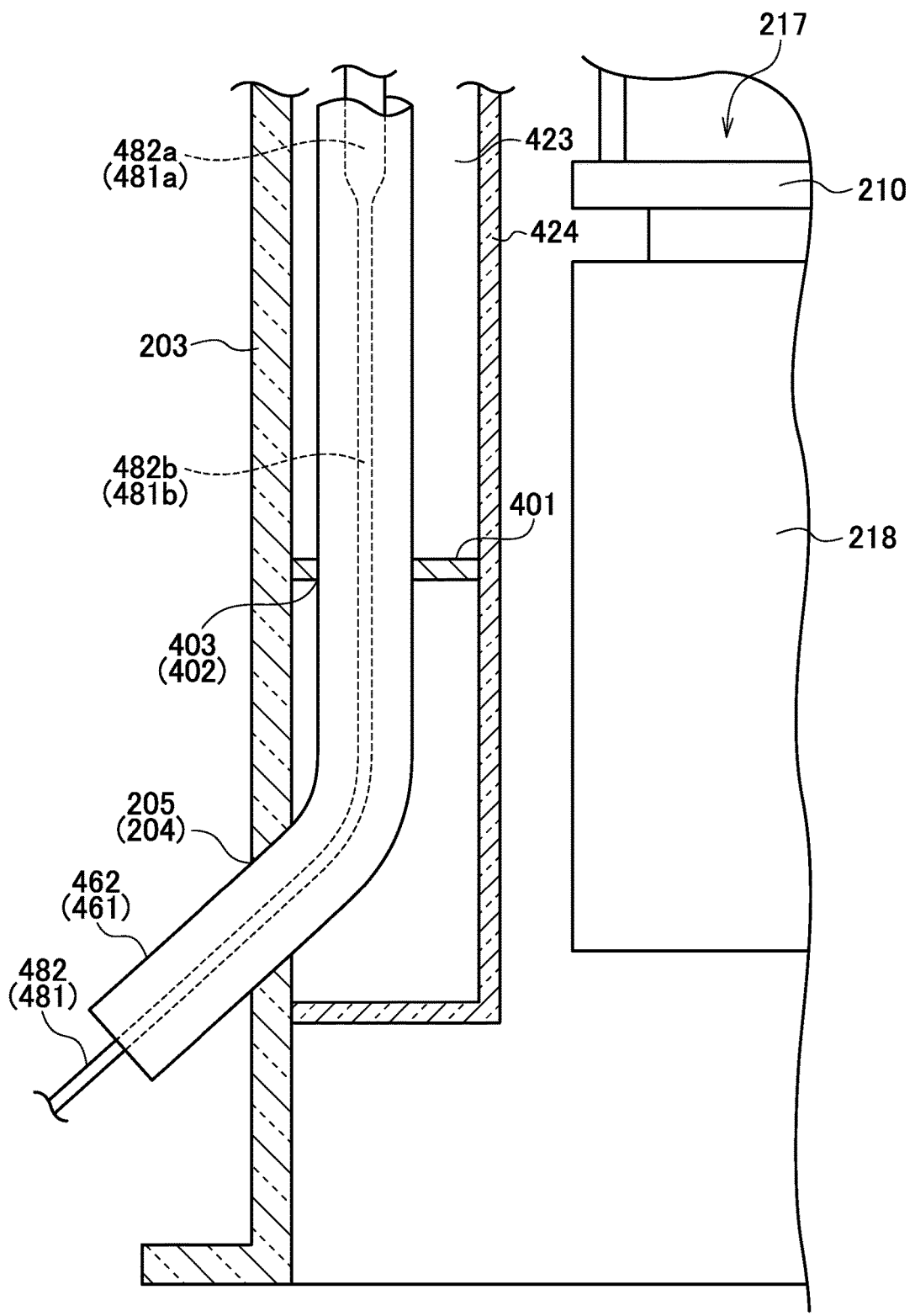
FIG. 40 is a partially-enlarged schematic longitudinal sectional view for explaining the eleventh embodiment of the invention.

An eleventh embodiment of the invention will be described with reference to FIGS. 39 and 40.

In the ninth embodiment, the thickness of the rod-like electrodes 471, 472, 481, and 482 is constant regardless of the height. This embodiment is different from the ninth embodiment, in that the rod-like electrodes 471, 472, 481, and 482 is thinner below the height position of the upper part (a part slightly lower than the lowermost wafer of the stacked wafers) of the boat support 218 than above the upper part of the boat support 218, but is the same in the other points. By reducing the thickness of the rod-like electrodes 471, 472, 481, and 482, the energy is lowered and the discharge below the height position of the upper part (a part slightly lower than the lowermost wafer of the stacked wafers) of the boat support 218 than above the upper part of the boat support 218 can be suppressed, thereby suppressing the energy consumption.

Twelfth Embodiment

Figure 41:
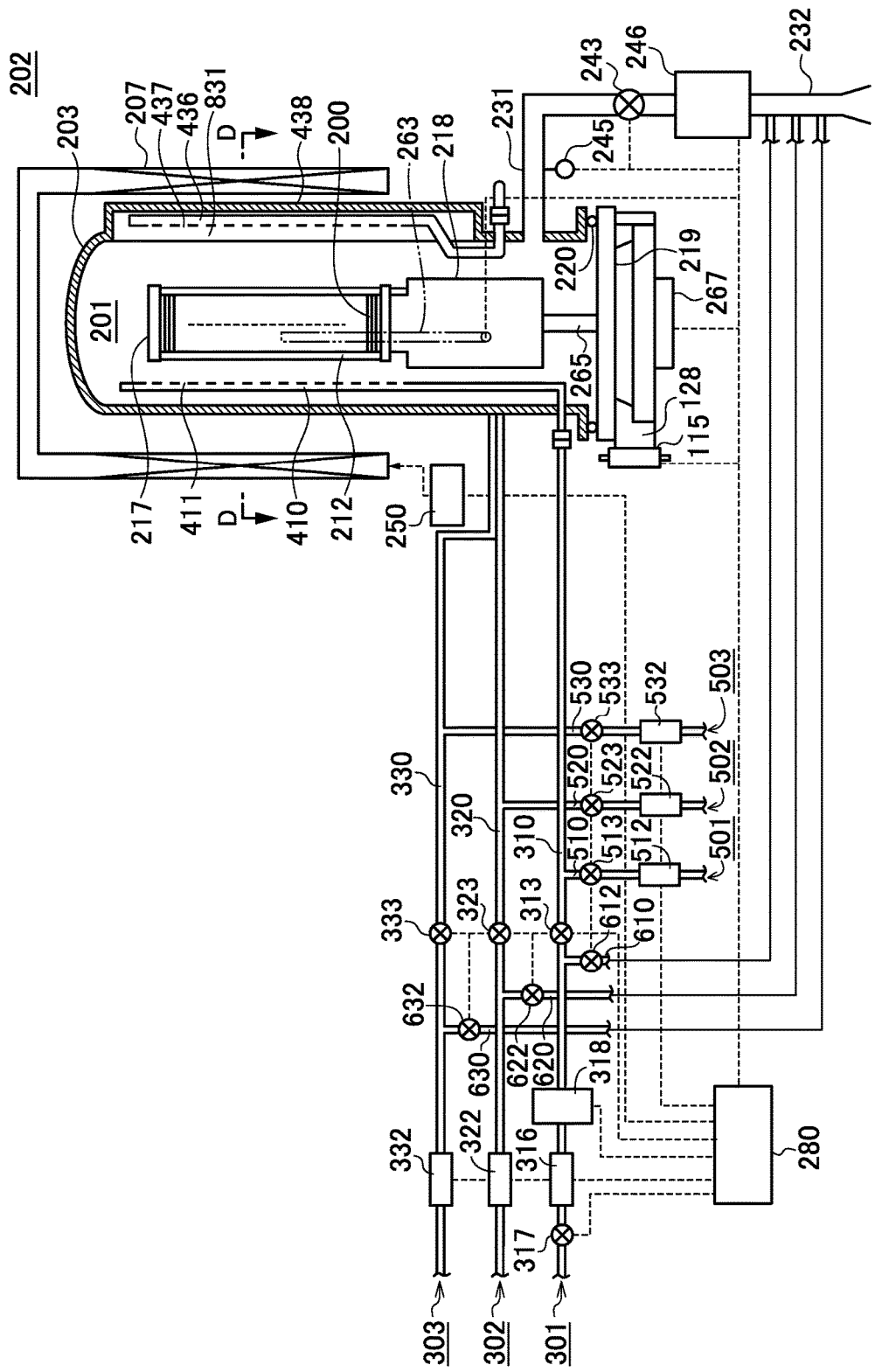
FIG. 41 is a diagram schematically illustrating an example of a processing furnace and members accompanied therewith, which are suitably used in an twelfth exemplary embodiment of the invention and is a schematic longitudinal sectional view taken along line E-E of FIG. 42, in which the schematic longitudinal section of the processing furnace is shown.
Figure 42:
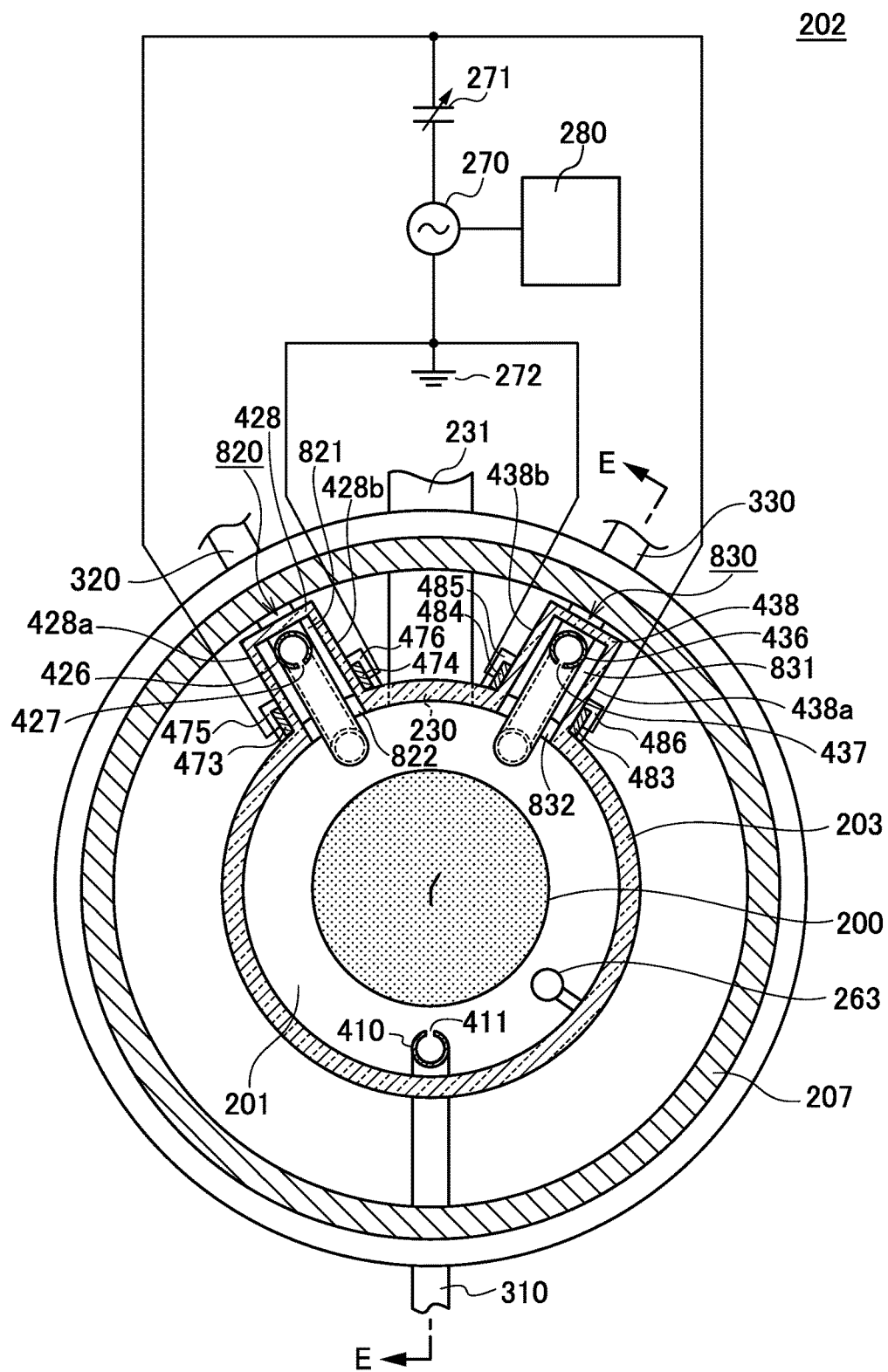
FIG. 42 is a schematic transverse sectional view taken along line D-D in the processing furnace shown in FIG. 41.

A twelfth embodiment of the invention will be described below with reference to FIGS. 41 and 42.

In the ninth embodiment, the first plasma generating structure 429 constituted by the rod-like electrode 471, the rod-like electrode 472, the electrode protecting pipe 451, the electrode protecting pipe 452, the buffer chamber 423, and the gas supply holes 425 and the second plasma generating structure 439 constituted by the rod-like electrode 481, the rod-like electrode 482, the electrode protecting pipe 461, the electrode protecting pipe 462, the buffer chamber 433, and the gas supply holes 435 are disposed inside the reaction tube 203. This embodiment is different from the ninth embodiment, in that the plasma generating structures 820 and 830 are disposed to protrude to the outside from the reaction tube 203, but is the same in the other points. Plasma-generating structures 820 and 830 have the same structure as the plasma-generating structures 820 and 830 of the sixth embodiment.

Remote plasma is generated by the plasma generating structures 820 and 830 having the above-mentioned configuration. That is, radicals generated in the plasma generating structures 820 and 830 are not deactivated until reaching the entire surfaces of the wafers 200 in the processing chamber 201 and ions generated by the plasma generating structures 820 and 830 do not reach the wafers to such an extent to damage the wafers 200 in the processing chamber.

As in this embodiment, when the plasma generating structures 820 and 830 are disposed to protrude to the outside of the reaction tube 203, the distance between the outer peripheries of the wafers 200 and the inner peripheral surface of the reaction tube 203 can be reduced, compared with the case in which the buffer chambers 423 and 433 are disposed inside the reaction tube 203 as in the first embodiment.

In this embodiment, the first plasma source constituted by plasma generating electrodes 473 and 474, the matching unit 271, and the RF power source 270 and the second plasma source constituted by the plasma generating electrodes 483 and 484, the matching unit 271, and the RF power source 270 are provided. Therefore, compared with the case in which only one plasma source is provided, even when the RF power supplied to the each plasma source is reduced, a sufficient amount of plasma to process a substrate can be generated by the two plasma sources, thereby the damage to the wafers 200 or the films formed on the wafers 200 can be reduced, and the processing temperature of the wafers 200 can be lowered.

Since the first plasma generating structure 820 constituted by the plasma generating electrodes 473 and 474, the plasma generating chamber wall 428, the plasma generating chamber 821, the opening 822, the nozzle 426, and the gas supply holes 427 and the second plasma generating structure 830 constituted by the plasma generating electrodes 483 and 484, the plasma generating chamber wall 438, the plasma generating chamber 831, the opening 832, the nozzle 436, and the gas supply holes 437 are disposed symmetric with respect to a line passing through the center of the wafers 200 (the center of the reaction tube 203), it is easy to supply plasma uniformly to the entire surfaces of the wafers 200 from both plasma generating structures and it is thus possible to form a uniform film on the wafers 200.

Since the exhaust hole 230 is disposed on the line passing through the center of the wafers 200 (the center of the reaction tube 203), it is easy to supply plasma uniformly to the entire surfaces of the wafers 200 and it is thus possible to form a uniform film on the wafers 200. Since the gas supply holes 411 of the nozzle 410 are also disposed on the line passing through the center of the wafers 200 (the center of the reaction tube 203), it is easy to supply plasma uniformly to the entire surfaces of the wafers 200 and it is thus possible to form a uniform film on the wafers 200.

In the ninth to twelfth embodiments, the vaporizer 315 is used to vaporize a liquid raw material, but a bubbler may be used instead of the vaporizer.

In the above-mentioned exemplary embodiments, an example using the ALD method has been described. However, in a case in which the CVD method is used, the RF power can be distributed by providing plural plasma sources and a sufficient amount of plasma can be generated even when the RF power supplied to the plasma sources is lower than that in the case of one plasma source. Accordingly, it is possible to reduce the damage to the wafers 200 or the film to be formed when processing the wafers 200 by plasma and to lower the processing temperature of the wafers 200. It is possible to suppress the generation of particles.

In the above-mentioned exemplary embodiments, a CCP (Capacitively Coupled Plasma) type RF power source is used. However, even when an ICP (Inductively Coupled Plasma) type RF power source is used, the same advantages can be achieved.

In the above-mentioned exemplary embodiments, $N_2$ (nitrogen) is used as the carrier gas, but He (helium), Ne (neon), Ar (argon), and the like may be used instead of nitrogen.

Preferred Aspects of the Embodiments

Hereinafter, preferred aspects of the embodiments will be additionally described.

APPENDIX 1

According to an aspect of the preferred embodiments, there is provided a substrate processing apparatus including:

a processing chamber in which a substrate is processed;

one or more buffer chambers that are partitioned from the processing chamber and that includes a gas supply hole opened to the processing chamber;

a first processing gas supply system that supplies a first processing gas to the processing chamber;

a second processing gas supply system that supplies a second processing gas to the one or more buffer chambers;

a power source that outputs RF power;

a plasma-generating electrode that activates the second processing gas in the one or more buffer chambers with an application of the RF power from the power source; and a controller that controls the first processing gas supply system, the power source, and the second processing gas supply system to expose the substrate having a metal film formed on a surface thereof to the first processing gas and the second processing gas to form a first film on the metal film in a state in which the RF power is not applied to the electrode and thereafter to expose the substrate having the first film formed thereon to the first processing gas, and the second processing gas that is activated with the application of the RF power to the electrode to form a second film on the metal film.

APPENDIX 2

According to another aspect of the preferred embodiments, there is provided a substrate processing apparatus including:

a processing chamber in which a substrate is processed;

one or more buffer chambers that are partitioned from the processing chamber and that includes a gas supply hole opened to the processing chamber;

a first processing gas supply system that supplies a first processing gas to the processing chamber;

a second processing gas supply system that supplies a second processing gas to the one or more buffer chambers;

a power source that outputs RF power;

a plasma-generating electrode that activates the second processing gas in the one or more buffer chambers with an application of the RF power from the power source; and a controller that controls the first processing gas supply system, the power source, and the second processing gas supply system to expose the substrate having a metal film formed on a surface thereof to the first processing gas and thereafter to expose the substrate to the first processing gas, and the second processing gas that is activated with the application of the RF power to the electrode to form a film on the metal film.

APPENDIX 3

In the substrate processing apparatus according to the appendix 1 or 2, preferably, the substrate processing apparatus further includes an exhaust system that exhausts the processing chamber, and the controller is the controller that controls the first processing gas supply system, the power source, and the second processing gas supply system to alternately supply the first processing gas and the activated second processing gas to the processing chamber so as not to be mixed with each other and to form the film on the metal film.

APPENDIX 4

In the substrate processing apparatus according to any one of the appendices 1 to 3, preferably, the metal film is a GST film.

APPENDIX 5

In the substrate processing apparatus according to the appendix 4, preferably, the first processing gas is DCS and the second processing gas is NH$_3$.

APPENDIX 6

In the substrate processing apparatus according to any one of the appendices 1 to 5, preferably, the substrate processing apparatus includes plural buffer chambers.

APPENDIX 7

In the substrate processing apparatus according to the appendix 5, preferably, the substrate processing apparatus further includes a heating system that heats the substrate, and the control means controls the first processing gas supply system, the power source, the second processing gas supply system, and the heating system to heat the substrate having the metal film formed on the surface thereof to a self-decomposition temperature of the DCS or lower and to expose the substrate to the first processing gas and then to heat the substrate to the self-decomposition temperature of the DCS or lower and to expose the substrate to the first processing gas, and the second processing gas that is activated with the application of the RF power to the electrode to form the film on the metal film.

APPENDIX 8

According to still another aspect of the preferred embodiments, there is provided a semiconductor device manufacturing method including:

loading a substrate having a metal film formed on a surface thereof into a processing chamber;

supplying a first processing gas, and a second processing gas that is not activated by plasma excitation to the processing chamber from plural processing gas supply systems independent of each other to pre-process the substrate;

supplying the first processing gas, and the second processing gas that is activated by the plasma excitation to the processing chamber from the plural processing gas supply systems to form a predetermined film on the pre-processed substrate; and unloading the substrate having the predetermined film formed thereon from the processing chamber.

APPENDIX 9

According to still another aspect of the preferred embodiments, there is provided a semiconductor device manufacturing method including:

loading a substrate having a metal film formed on a surface thereof into a processing chamber;

supplying a first processing to the processing chamber from plural processing gas supply systems independent of each other to pre-process the substrate;

supplying the first processing gas, and the second processing gas that is activated by plasma excitation to the processing chamber from the plural processing gas supply systems to form a predetermined film on the pre-processed substrate; and unloading the substrate having the predetermined film formed thereon from the processing chamber.

APPENDIX 10

In the semiconductor device manufacturing method according to the appendix 8 or 9, preferably, the predetermined film forming is performed by alternately supplying the first processing gas and the activated second processing gas to the processing chamber from the plural processing gas supply systems so as not to be mixed with each other to form the predetermined film on the pre-processed substrate.

APPENDIX 11

In the semiconductor device manufacturing method according to any one of the appendices 8 to 10, preferably, the metal film is a GST film.

APPENDIX 12

In the semiconductor device manufacturing method according to the appendix 11, preferably, the first processing gas is DCS and the second processing gas is $NH_3$.

APPENDIX 13

In the semiconductor device manufacturing method according to the appendix 12, preferably, the substrate is heated to a self-decomposition temperature of the first processing gas or lower to pre-process the substrate and to form the predetermined film on the pre-processed substrate.

APPENDIX 14

According to still another aspect of the preferred embodiments, there is provided a substrate processing apparatus including:
a processing chamber in which a substrate is processed;
plural buffer chambers that are partitioned from the processing chamber and that respectively include a gas supply hole opened to the processing chamber;
a first processing gas supply system that supplies a first processing gas to the processing chamber;
a second processing gas supply system that supplies a second processing gas to the plural buffer chambers;
a power source that outputs RF power;
plasma-generating electrodes that activate the second processing gas in each of the buffer chambers with an application of the RF power from the power source;
a heating system that heats the substrate; and
a controller that controls the first processing gas supply system, the power source, the second processing gas supply system, and the heating system to expose the substrate having a metal film formed on a surface thereof to the first processing gas, and the second processing gas that is activated in the plural buffer chambers with an application of RF power to the electrodes and that is supplied from the plural buffer chambers to the processing chamber to form a film on the metal film while heating the substrate to a self-decomposition temperature of the first processing gas or lower.

APPENDIX 15

In the substrate processing apparatus according to the appendix 14, preferably, the controller is the controller that controls the first processing gas supply system, the power source, the second processing gas supply system, and the heating system to alternately supply the first processing gas and the activated second processing gas to the processing chamber so as not to be mixed with each other and to form the film on the metal film.

APPENDIX 16

In the substrate processing apparatus according to the appendix 15, preferably, the substrate processing apparatus further includes an exhaust system that exhausts the processing chamber, and the controller is the controller that controls the first processing gas supply system, the power source, and the second processing gas supply system, the heating system, and the exhaust system to alternately supply the first processing gas and the activated second processing gas to the processing chamber so as not to be mixed with each other and to form the film on the metal film.

APPENDIX 17

In the substrate processing apparatus according to any one of the appendices 13 to 15, preferably, the metal film is a GST film.

APPENDIX 18

In the substrate processing apparatus according to the appendix 16, preferably, the first processing gas is DCS and the second processing gas is $NH_3$.

APPENDIX 19

According to still another aspect of the preferred embodiments, there is provided a semiconductor device manufacturing method including:
loading a substrate having a metal film formed on a surface thereof into a processing chamber;
exposing the substrate having the metal film formed on the surface thereof to a first processing gas, and a second processing gas which is activated by plural plasma generating structures and supplied to the processing chamber from the plural plasma generating structures and forming a film on the metal film while heating the substrate to a self-decomposition temperature of the first processing gas or lower; and
unloading the substrate having the film formed thereon form the processing chamber.

APPENDIX 20

In the substrate processing apparatus according to the appendix 19, preferably, the metal film is a GST film.

APPENDIX 21

In the substrate processing apparatus according to the appendix 20, preferably, the first processing gas is DCS and the second processing gas is $NH_3$.

APPENDIX 22

According to still another aspect of the preferred embodiments, there is provided a semiconductor device manufactured using the semiconductor device manufacturing method according to any one of the appendices 8 to 13 and 19 to 21.

APPENDIX 23

According to a still another aspect of the preferred embodiments, there is provided a program that causes computer to perform a process including:
controlling plural processing gas supply systems independent of each other and plasma activation unit to supply a first processing gas, and a second processing gas that is not activated by plasma excitation to a processing chamber from the plural processing gas supply systems to pre-process a substrate, and thereafter to supply the first processing gas, and the second processing gas that is activated by the plasma excitation to the processing chamber from the plural processing gas supply systems to form a predetermined film on the pre-processed substrate.

APPENDIX 24

According to a still another aspect of the preferred embodiments, there is provided a program that causes computer to perform a process including:

controlling plural processing gas supply systems independent of each other and plasma activation unit to supply a first processing to the processing chamber to pre-process a substrate, and thereafter to supply the first processing gas, and the second processing gas that is activated by plasma excitation to the processing chamber from the plural processing gas supply systems to form a predetermined film on the pre-processed substrate.

APPENDIX 25

According to a still another aspect of the preferred embodiments, there is provided a program that causes computer to perform a process including:

controlling plural processing gas supply systems independent of each other, heating system to heat a substrate, and plural plasma generating structures to expose the substrate having a metal film formed on a surface thereof to a first processing gas, and a second processing gas that is activated by the plural plasma generating structures and supplied to the processing chamber from the plural plasma generating structures and to form a film on the metal film while heating the substrate to a self-decomposition temperature of the first processing gas or lower.

APPENDIX 26

According to a still another aspect of the preferred embodiments, there is provided a non-transitory computer-readable medium storing the program according to any one of the appendices 23 to 25,

APPENDIX 27

According to a still another aspect of the preferred embodiments, there is provided a substrate processing apparatus including the non-transitory computer-readable medium according to the appendix 26.

APPENDIX 28

According to a still another aspect of the preferred embodiments, there is provided a substrate processing apparatus that forms an amorphous silicon nitride film on a metal film with a high adhesion at a temperature of 350° C. or lower by reducing a supply power density per unit area of RF power to be supplied.

APPENDIX 29

According to a still another aspect of the preferred embodiments, there is provided a substrate processing apparatus that forms an amorphous silicon nitride film on a metal film with a high adhesion at a temperature of 350° C. or lower in a processing chamber including two or more buffer chambers to be supplied with RF power by distributing and supplying the RF power to be supplied to the two or more buffer chambers.

APPENDIX 30

According to a still another aspect of the preferred embodiments, there is provided a substrate processing apparatus that forms an amorphous silicon nitride film on a metal film with a high adhesion by repeatedly performing a DCS application and an $NH_3$ application without a supply of RF power one or more times and then repeatedly performing the DCS application and the $NH_3$ application with the supply of RF power one or more times.

APPENDIX 31

According to a still another aspect of the preferred embodiments, there is provided a substrate processing apparatus that forms an amorphous silicon nitride film on a metal film with a high adhesion by performing a DCS application and then repeatedly performing the DCS application and the $NH_3$ application with the supply of RF power one or more times.

APPENDIX 32

According to still another aspect of the preferred embodiments, there is provided a substrate processing apparatus including:

a processing chamber in which a substrate is processed;

plural buffer chambers that are partitioned from the processing chamber and that respectively include a gas supply hole opened to the processing chamber;

a first processing gas supply system that supplies a first processing gas to the plural buffer chambers;

a power source that outputs RF power;

plasma-generating electrodes that activate the first processing gas in each of the buffer chambers with an application of the RF power from the power source;

a second processing gas supply system that supplies a second processing gas to the processing chamber;

an exhaust system that exhausts the processing chamber;

a heating system that heats the substrate; and a controller that controls the first processing gas supply system, the power source, the second processing gas supply system, the exhaust system and the heating system to expose the substrate to the activated first processing gas and the second processing gas to form a film on the substrate while heating the substrate to 200° C. or lower.

APPENDIX 33

In the substrate processing apparatus according to the appendix 32, preferably, the processing chamber and the buffer chambers are disposed in a reaction tube.

APPENDIX 34

In the substrate processing apparatus according to the appendix 32 or 33, preferably, the electrodes are disposed inside the buffer chambers.

APPENDIX 35

In the substrate processing apparatus according to the appendix 32 or 33, preferably, the electrodes are disposed outside the buffer chambers.

APPENDIX 36

In the substrate processing apparatus according to any one of the appendices 32 to 35, preferably, the second processing gas is used without being activated.

APPENDIX 37

In the substrate processing apparatus according to the appendix 32, preferably, the first processing gas is an oxygen-containing gas, the second processing gas is a silicon-containing gas, and the film formed on the substrate is a silicon oxide film.

APPENDIX 38

In the substrate processing apparatus according to the appendix 37, preferably, the first processing gas is oxygen and the second processing gas is BTBAS.

APPENDIX 39

In the substrate processing apparatus according to the appendix 32, preferably, the film is formed while heating the substrate to 100° C. or lower.

APPENDIX 40

In the substrate processing apparatus according to the appendix 32, preferably, the second processing gas supply system is connected to a nozzle with a gas supply hole disposed upright in the processing chamber and supplies the second processing gas to the processing chamber from the gas supply hole via the nozzle, the exhaust system may be connected to an exhaust hole opened to the processing chamber, and the gas supply hole of the nozzle and the exhaust hole may be disposed at positions opposed to each other with the substrate interposed therebetween.

APPENDIX 41

In the substrate processing apparatus according to the appendix 40, preferably, the plural buffer chambers are disposed so that distances between gas supply holes of the plural buffer chambers and the gas supply hole of the nozzles are substantially the same.

APPENDIX 42

According to still another aspect of the preferred embodiments, there is provided a semiconductor device manufacturing method of forming a silicon oxide film on a substrate having a pattern of resist or amorphous carbon formed thereon by performing, while heating the substrate to 200° C. or lower, exposing the substrate to a first processing gas which is activated by plasma generated in plural buffer chambers with an application of RF power to an electrode; and exposing the substrate to a second processing gas which is not activated by plasma.

APPENDIX 43

According to still another aspect of the preferred embodiments, there is provided a semiconductor device manufactured by the semiconductor device manufacturing method according to the appendix 42.

APPENDIX 44

According to still another aspect of the preferred embodiments, there is provided a substrate processing apparatus including:

two or more plasma-generating buffer chambers that are disposed in a processing chamber;

RF power supply means that distributes and supplies RF power to the two or more plasma-generating buffer chambers.

APPENDIX 45

In the substrate processing apparatus according to the appendix 44, preferably, the substrate processing apparatus is provided with a high-frequency electrode having a structure in which the thickness at the lower end of the processing chamber decreases.

APPENDIX 46

According to still another aspect of the preferred embodiments, there is provided a semiconductor device manufacturing method including:

supplying a first raw material containing silicon to plural substrates;

exhausting the first raw material and a byproduct gas thereof for a predetermined time;

generating plasma while supplying ammonia to a plasma-generating buffer chamber and supplying ammonia radical to the plural substrates; and exhausting the residual gas for a predetermined time.

APPENDIX 47

According to still another aspect of the preferred embodiments, there is provided a semiconductor device manufacturing method including:

supplying a first raw material containing silicon to plural substrates;

exhausting the first raw material and a byproduct gas thereof for a predetermined time;

generating plasma while supplying oxygen to a plasma-generating buffer chamber and supplying oxygen radical to the plural substrates; and exhausting the residual gas for a predetermined time.

APPENDIX 48

According to still another aspect of the preferred embodiments, there is provided a substrate processing apparatus including:

a processing chamber in which a substrate is processed;

a heating unit that heats the processing chamber;

plural plasma generating chambers that are partitioned from the processing chamber and that each have a gas supply hole opened to the processing chamber;

a first source gas supply system that supplies a first source gas to the plural plasma-generating chambers;

a RF power source that outputs RF power;

plural plasma-generating electrodes that excite the first source gas in the plural plasma-generating chambers by applying the RF power from the RF power source;

a second source gas supply system that supplies a second source gas to the processing chamber;

an exhaust system that exhausts the processing chamber; and a controller that controls the heating unit, the first source gas supply system, the RF power source, the second source gas supply system and the exhaust system to expose the substrate to the activated first processing gas and the second processing gas to form a film on the substrate while heating the substrate to 200° C. or lower.

APPENDIX 49

According to still another aspect of the preferred embodiments, there is provided a substrate processing apparatus including:

a processing chamber in which a substrate is processed;

a heating unit that heats the processing chamber;

a temperature detecting unit that detects the temperature of the processing chamber;

plural plasma generating chambers that are partitioned from the processing chamber and that each have a gas supply hole opened to the processing chamber;

a first source gas supply system that supplies a first source gas to the plural plasma-generating chambers and that includes first flow rate control means controlling the flow rate of the first source gas and a first valve controlling the supply of the first source gas to the plural plasma-generating chambers;

a RF power source that outputs RF power;

plural plasma-generating electrodes that excite the first source gas in the plural plasma-generating chambers by applying the RF power from the RF power source;

a second source gas supply system that supplies a second source gas to the processing chamber and that includes second flow rate control means controlling the flow rate of the second source gas and a second valve controlling the supply of the second source gas to the processing chamber;

an exhaust system that exhausts the processing chamber; and a controller that controls the heating unit to heat the processing chamber to 200° C. or lower on the basis of temperature information detected by the temperature detecting unit, controls the RF power source to apply predetermined RF power to the plural electrodes, controls the first flow rate control unit and the first valve to supply the first source gas to the plural plasma-generating chambers by predetermined amounts, respectively, controls the second flow rate control unit and the second valve to supply the second source gas to the processing chamber by a predetermined amount, and controls the exhaust system to exhaust the processing chamber with a predetermined displacement.

APPENDIX 50

According to another exemplary aspect of the invention, there is provided a semiconductor device manufacturing method including:

controlling heating means for heating a processing chamber, in which a substrate is processed, to heat the processing chamber to a temperature of 200° C. or lower on the basis of temperature information detected by temperature detecting means for detecting the temperature of the processing chamber;

controlling a first source gas supply system, which supplies a first source gas to plural plasma-generating chambers being partitioned from the processing chamber and each having a gas supply hole opened to the processing chamber, to supply the first source gas to the plural plasma-generating chambers by predetermined amounts, respectively;

controlling a RF power source, which outputs RF power, to apply a predetermined amount of RF power to plural plasma-generating electrodes exciting the first source gas in the plural plasma-generating chambers, respectively, by applying the RF power from the RF power source;

controlling a second source gas supply system, which supplies a second source gas to the processing chamber, to supply the second source gas to the processing chamber by a predetermined amount;

controlling an exhaust system, which exhausts the processing chamber, to exhaust the processing chamber with a predetermined displacement; and exposing the substrate to the activated first source gas and the second source gas while heating the substrate to a temperature of 200° C. or lower to form a film on the substrate.

APPENDIX 51

According to a still another aspect of the preferred embodiments, there is provided a program that causes computer to perform a process including:

controlling heating means for heating a processing chamber, in which a substrate is processed, to heat the processing chamber to a temperature of 200° C. or lower on the basis of temperature information detected by temperature detecting means for detecting the temperature of the processing chamber;

controlling a first source gas supply system, which supplies a first source gas to plural plasma-generating chambers being partitioned from the processing chamber and each having a gas supply hole opened to the processing chamber, to supply the first source gas to the plural plasma-generating chambers by predetermined amounts, respectively;

controlling a RF power source, which outputs RF power, to apply a predetermined amount of RF power to plural plasma-generating electrodes exciting the first source gas in the plural plasma-generating chambers, respectively, by applying the RF power from the RF power source;

controlling a second source gas supply system, which supplies a second source gas to the processing chamber, to supply the second source gas to the processing chamber by a predetermined amount; and controlling an exhaust system, which exhausts the processing chamber, to exhaust the processing chamber with a predetermined displacement.

APPENDIX 52

According to a still another aspect of the preferred embodiments, there is provided a non-transitory computer-readable medium storing the program according to the appendix 51.

APPENDIX 53

According to a still another aspect of the preferred embodiments, there is provided a substrate processing apparatus including the non-transitory computer-readable medium according to the appendix 52.

Various exemplary embodiments of the invention have hitherto been described, however, the invention is not limited to the exemplary embodiments. Therefore, the scope of the invention is limited only by the appended claims.

What is claimed is:

1. A method of manufacturing a semiconductor device comprising:
prior to beginning a process of forming a silicon nitride film on a substrate in a processing chamber, performing a pre-process with respect to a metal film or a GST film that is formed on a surface of the substrate, by supplying only a first processing gas to the substrate, and then removing residual first processing gas from the processing chamber, wherein no second processing gas is supplied to the substrate during the pre-process and wherein the first processing gas is not activated by plasma excitation and is configured to increase adhesion of the silicon nitride film to the metal film or GST film on the substrate; and
performing the process of forming the silicon nitride film on the substrate after the pre-process has been completed, such that the silicon nitride film is formed on the metal film or the GST film by executing at least one cycle of alternately (i) supplying the first processing gas, and (ii) supplying the second processing gas, which is activated by plasma excitation.

2. The method according to claim 1, wherein, in the pre-process and the process of forming the silicon nitride film on the substrate, the substrate is heated to a temperature that is equal to or less than a self-decomposition temperature of the first processing gas.

3. The method according to claim 1, wherein the metal film is formed on the surface of the substrate and the metal film comprises at least one selected from the group consisting of Ti, TiN, TiSi, W, WN, WSi, Co, CoSi, Al, AlSi, Cu, and alloys thereof.

4. The method according to claim 1, wherein the metal film is formed on the surface of the substrate and the metal film comprises at least one selected from the group consisting of Ti, TiN, TiSi, W, WN, WSi, Co, CoSi, Al, AlSi, and alloys thereof.

5. The method according to claim 1, wherein
supplying the second processing gas, which is activated by plasma excitation, includes activating the second processing gas by plasma excitation by a first plasma generator in a first buffer chamber, and simultaneously activating the second processing gas by plasma excitation by a second plasma generator in a second buffer chamber.

6. The method according to claim 5, wherein
supplying the second processing gas, which is activated by plasma excitation, includes respectively applying one-half of a RF power to the first plasma generator and to the second plasma generator, the RF power being required in a case in which the second processing gas is activated by plasma excitation using a single plasma generator.

7. The method according to claim 5, wherein the first buffer chamber and the second buffer chamber are disposed symmetrically with respect to a line passing through the center of the substrate.

8. The method according to claim 5, wherein the first buffer chamber and the second buffer chamber are disposed at the positions different by 180° to each other with the center of the substrate interposed therebetween.

* * * * *